United States Patent
Jee et al.

(10) Patent No.: US 9,543,276 B2
(45) Date of Patent: Jan. 10, 2017

(54) CHIP-STACKED SEMICONDUCTOR PACKAGE

(71) Applicants: Young-kun Jee, Cheonan-si (KR);
Tae-hong Min, Hwaseong-si (KR);
Sun-kyoung Seo, Suwon-si (KR)

(72) Inventors: Young-kun Jee, Cheonan-si (KR);
Tae-hong Min, Hwaseong-si (KR);
Sun-kyoung Seo, Suwon-si (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 0 days.

(21) Appl. No.: 14/818,682

(22) Filed: Aug. 5, 2015

(65) Prior Publication Data

US 2016/0056101 A1 Feb. 25, 2016

(30) Foreign Application Priority Data

Aug. 22, 2014 (KR) .................. 10-2014-0109958

(51) Int. Cl.
| | | |
|---|---|---|
| *H01L 23/52* | (2006.01) | |
| *H01L 23/48* | (2006.01) | |
| *H01L 29/40* | (2006.01) | |
| *H01L 25/065* | (2006.01) | |
| *H01L 23/31* | (2006.01) | |
| *H01L 21/56* | (2006.01) | |

(52) U.S. Cl.
CPC ......... *H01L 25/0657* (2013.01); *H01L 21/563* (2013.01); *H01L 23/3128* (2013.01); *H01L 23/3142* (2013.01); *H01L 23/3178* (2013.01); *H01L 23/481* (2013.01); *H01L 2224/16145* (2013.01); *H01L 2225/06513* (2013.01)

(58) Field of Classification Search
CPC ............. H01L 23/49816; H01L 23/481; H01L 23/49827; H01L 25/0657; H01L 23/3142; H01L 23/3178; H01L 2224/16145; H01L 2225/06513
See application file for complete search history.

(56) References Cited

U.S. PATENT DOCUMENTS

| | | |
|---|---|---|
| 6,175,157 B1 | 1/2001 | Morifuji |
| 7,521,289 B2 | 4/2009 | Lee et al. |
| 7,550,835 B2 | 6/2009 | Kang |
| 7,619,305 B2 | 11/2009 | Fan et al. |
| 7,741,707 B2 | 6/2010 | Chow et al. |
| 7,755,176 B1 | 7/2010 | St. Amand et al. |
| 7,855,443 B2 | 12/2010 | Tsai et al. |
| 8,241,964 B2 | 8/2012 | Pagaila et al. |
| 8,581,419 B2 | 11/2013 | Su et al. |
| 8,604,614 B2 | 12/2013 | Kwon et al. |
| 8,664,540 B2 | 3/2014 | Lu et al. |

(Continued)

*Primary Examiner* — Victor A Mandala
(74) *Attorney, Agent, or Firm* — Harness, Dickey & Pierce, P.L.C.

(57) ABSTRACT

A chip-stacked semiconductor package including a first chip having a plurality of first real bump pads and a plurality of first dummy bump pads, a second chip on the first chip, the second chip including a plurality of real bumps and a plurality of bridge dummy bumps, the plurality of real bumps electrically connected to the plurality of first real bump pads, the plurality of bridge dummy bumps connected to the plurality of first dummy bump pads, and a sealing member sealing the first chip and the second chip may be provided.

13 Claims, 45 Drawing Sheets

(56) References Cited

U.S. PATENT DOCUMENTS

| | | |
|---|---|---|
| 8,664,768 B2 | 3/2014 | Liang et al. |
| 8,816,407 B2 * | 8/2014 | Kim ...................... H01L 23/481 |
| | | 257/260 |
| 2011/0215354 A1 * | 9/2011 | Wang ...................... H01L 33/58 |
| | | 257/98 |
| 2012/0280860 A1 | 11/2012 | Kamgaing et al. |
| 2012/0286418 A1 | 11/2012 | Lee et al. |
| 2012/0305916 A1 * | 12/2012 | Liu ........................ H01L 22/34 |
| | | 257/48 |
| 2013/0011968 A1 | 1/2013 | Bartley et al. |
| 2013/0076387 A1 | 3/2013 | Ishikawa et al. |
| 2013/0119537 A1 | 5/2013 | Takeda |
| 2013/0168871 A1 | 7/2013 | Kim et al. |
| 2013/0271907 A1 | 10/2013 | Mortensen et al. |
| 2015/0279792 A1 * | 10/2015 | Matsui ................ G02F 1/13452 |
| | | 257/737 |
| 2016/0027754 A1 * | 1/2016 | Katagiri ............ H01L 23/49816 |
| | | 257/737 |

* cited by examiner

CHIP-STACKED SEMICONDUCTOR PACKAGE

CROSS-REFERENCE TO RELATED APPLICATION

This application claims priority under 35 U.S.C. §119 to Korean Patent Application No. 10-2014-0109958, filed on Aug. 22, 2014, in the Korean Intellectual Property Office, the disclosure of which is incorporated herein in its entirety by reference.

BACKGROUND

The inventive concepts relate to semiconductor packages, and more particularly, to chip-stacked semiconductor packages in which multiple chips are stacked.

Semiconductor manufacturers aim to inexpensively manufacture miniaturized, multifunctional, and high-capacity semiconductor devices. A semiconductor package technology is one of the technologies that help achieving these various aims. In particular, a chip-stacked semiconductor package in which multiple chips are stacked is suggested to achieve the above-described aims.

SUMMARY

Some of the inventive concepts provide miniaturized, multifunctional, and high-capacity chip-stacked semiconductor packages in which multiple chips are stacked.

According to an example embodiment, a chip-stacked semiconductor package includes a first chip including a plurality of first real bump pads and a plurality of first dummy bump pads, a second chip on the first chip, the second chip including a plurality of real bumps and a plurality of bridge dummy bumps, the plurality of real bumps electrically connected to the plurality of first real bump pads, the plurality of bridge dummy bumps connected to the plurality of first dummy bump pads, and a sealing member sealing the first chip and the second chip.

In some example embodiments, the first chip may further include a first chip body, the plurality of first real bump pads may be on an upper surface of the first chip body, and a plurality of first real through silicon vias may be in the first chip body and be electrically connected to the plurality of first real bump pads.

In some example embodiments, the plurality of first dummy bump pads may be on the upper surface of the first chip body, and a plurality of dummy through silicon vias may be in the first chip body and may be electrically connected to the plurality of first dummy bump pads.

In some example embodiments, a plurality of connection members may be on a lower surface of the first chip body, and the plurality of connection members may be electrically connected to the plurality of first real bump pads and the plurality of first real through silicon vias.

In some example embodiments, the second chip may further include a second chip body and a plurality of second real bump pads on a lower surface of the second chip body, and the plurality of second real bump pads may be electrically connected to the plurality of real bumps.

In some example embodiments, the second chip may further include a plurality of second dummy bump pads on the lower surface of the second chip body, and the plurality of second dummy bump pads may be connected to a plurality of bridge dummy bumps.

In some example embodiments, the second chip body may further include a plurality of second real through silicon vias, and the plurality of second real through silicon vias are electrically connected to the plurality of second real bump pads.

In some example embodiments, the second chip body may further include a plurality of dummy through silicon vias, and the plurality of dummy through silicon vias may be connected to the plurality of second dummy bump pads.

In some example embodiments, a pitch between the plurality of first dummy bump pads and a pitch between a plurality of second dummy bump pads may be smaller than a pitch between the plurality of first real bump pads and a pitch between the plurality of second real bump pads, respectively.

In some example embodiments, the plurality of bridge dummy bumps may be separate from each other and the plurality of bridge dummy bumps may be connected to the plurality of first dummy bump pads.

In some example embodiments, the sealing member may include an underfill, and the underfill may be at least one of between the first chip and the second chip and on sides of the second chip.

In some example embodiments, the sealing member may include a molding member, and the molding member may be one of (1) between the first chip and the second chip and on sides of the first and second chips and (2) on the sides of the first and second chips and an upper surface of the second chip.

In some example embodiments, the sealing member may include an underfill between the first chip and the second chip and on sides of the first chip, and a molding member covering one of (1) the underfill and sides of the first and second chips and (2) sides of the first and second chips and an upper surface of the second chip.

According to an example embodiment, a chip-stacked semiconductor package include a first chip including a first real connection portion and a first dummy connection portion, the first real connection portion including a plurality of first real bump pads, the first dummy connection portion including a plurality of first dummy bump pads and separate from the first real connection portion, a second chip on an upper surface of the first chip, the second chip including a second real connection portion and a second dummy connection portion, the second real connection portion including a plurality of first real bumps electrically connected to the plurality of first real bump pads, the second dummy connection portion separate from the second real connection portion and including a plurality of first bridge dummy bumps, the plurality of first bridge dummy bumps connected to the plurality of first dummy bump pads, and a sealing member sealing the first chip and the second chip.

In some example embodiments, the first chip may further include a third real connection portion, the third real connection portion may be separate from the first real connection portion and include a plurality of third real bump pads, the second chip further may include a fourth real connection portion, the fourth real connection portion may be separate from the second real connection portion and include a plurality of second real bumps, and the plurality of second real bumps may be electrically connected to the plurality of third real bump pads.

In some example embodiments, the first chip may further include a third dummy connection portion, the third dummy connection portion may be separate from the first dummy connection portion and include a plurality of third dummy bump pads, and the second chip may further include a fourth dummy connection portion, the fourth dummy connection portion may be separate from the second dummy connection portion and include a plurality of second bridge dummy bumps, and the plurality of second bridge dummy bumps may be connected to the third dummy bump pads.

In some example embodiments, the first chip may further include a first chip body and the second chip may further include a second chip body, the first real connection portion and the third real connection portion may be at a center of the first chip body, and the second real connection portion and the fourth real connection portion may be at a center of the second chip body.

In some example embodiments, the first dummy connection portion and the third dummy connection portion may be at an edge of the first chip body, and the second dummy connection portion and the fourth dummy connection portion may be at an edge of the second chip body.

In some example embodiments, the first chip may further include a first chip body and the second chip may further include a second chip body, the first real connection portion and the third real connection portion may be at an edge of the first chip body, and the second real connection portion and the fourth real connection portion may be at an edge of the second chip body.

In some example embodiments, the first dummy connection portion and the third dummy connection portion may be at a center of the first chip body, and the second dummy connection portion and the fourth dummy connection portion may be at a center of the second chip body.

In some example embodiments, the first chip may further include a first chip body, a plurality of through silicon vias in the first chip body, and a plurality of connection members may be on a lower surface of the first chip body, the plurality of through silicon vias may be connected to the plurality of first real bump pads, and the plurality of connection members may be electrically connected to the plurality of first real bump pads and the plurality of real through silicon vias.

In some example embodiments, the sealing member may include an underfill and a molding member, and the underfill may be between the first chip and the second chip.

According to an example embodiment, a chip-stacked semiconductor package may include a main chip, a first chip on the main chip, the first chip including a plurality of first real bump pads, a plurality of first dummy bump pads, a plurality of first through silicon vias, and a plurality of first connection members, the plurality of first through silicon vias configured to electrically connect the plurality of first real bump pads to the plurality of first connection members, the plurality of first connection members configured to electrically connect the first chip to the main chip, a second chip on an upper surface of the first chip, the second chip including a plurality of second connection members, the plurality of second connection members including a plurality of real bumps and a plurality of second, and a plurality of bridge dummy bumps, the plurality of real bumps electrically connected to the plurality of first real bump pads, and a plurality of bridge dummy bumps connected to the plurality of first dummy bump pads, and a first sealing member sealing the first chip and the second chip.

In some example embodiments, the first chip and the second chip may have a same size, and the main chip may have a size larger than the first and second chips.

In some example embodiments, the first chip and the second chip may be memory chips, and the main chip may be a logic chip.

In some example embodiments, the first sealing member may include an underfill at least one of between the first chip and the second chip and on sides of the first chip, and a molding member covering the underfill.

In some example embodiments, the chip-stacked semiconductor package may further include an underfill between the main chip and the first chip.

In some example embodiments, a lower surface of the first sealing member may be attached to an outer region of the main chip.

In some example embodiments, a plurality of third connection members may be on a lower surface of the main chip, the chip-stacked semiconductor package may further include a board substrate, and the first chip, the second chip, and the main chip may be on the board substrate and be electrically connected to the board substrate via the plurality of third connection members.

In some example embodiments, the main chip may include a plurality of second through silicon vias, and the plurality of first connection members may be electrically connected to the plurality of second through silicon vias.

In some example embodiments, the chip-stacked semiconductor package may further include a second sealing member on the main chip and covering the first sealing member.

In some example embodiments, the chip-stacked semiconductor package may further include an underfill between the board substrate and the main chip.

According to an example embodiment, a chip-stacked semiconductor package includes a first chip including a plurality of first real connection pads and a plurality of first dummy connection pads, the plurality of first real connection pads at a center of the first chip, the plurality of first dummy connection pads at an edge of the first chip, a second chip on the first chip, the second chip including a plurality of second real connection pads and a plurality of second dummy connection pads, the plurality of second real connection pads at a center of the second chip, the plurality of second dummy connection pads at an edge of the second chip, a plurality of real connection members connecting the plurality of first real connection pads and the plurality of second real connection pads, a plurality of dummy connection members connecting the plurality of first dummy connection pads and the plurality of second dummy connection pads, and a sealing member covering sides of the first chip and the second chip.

In some example embodiments, the plurality of dummy connection members may be wider than the plurality of real connection members such that each of the dummy connection members provides a physical connection between two or more of the plurality of first dummy connection pads and corresponding two or more of the plurality of second dummy connection pads.

In some example embodiments, the first chip may further include a plurality of real through silicon vias connected to the first real connection pads.

In some example embodiments, a pitch between the plurality of first dummy connection pads and a pitch between the plurality of second dummy connection pads may be smaller than a pitch between the plurality of first real connection pads and a pitch between the plurality of second real connection pads, respectively.

In some example embodiments, the sealing member may be between the first chip and the second chip.

In some example embodiments, the sealing member may include an underfill and a molding member, the underfill may be between the first chip and the second chip, and the molding member may cover the underfill.

In some example embodiments, the sealing member may include an underfill and a molding member, the underfill may be partially on at least one of sides of the first chip and sides of the second chip, and the molding member may cover the underfill.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
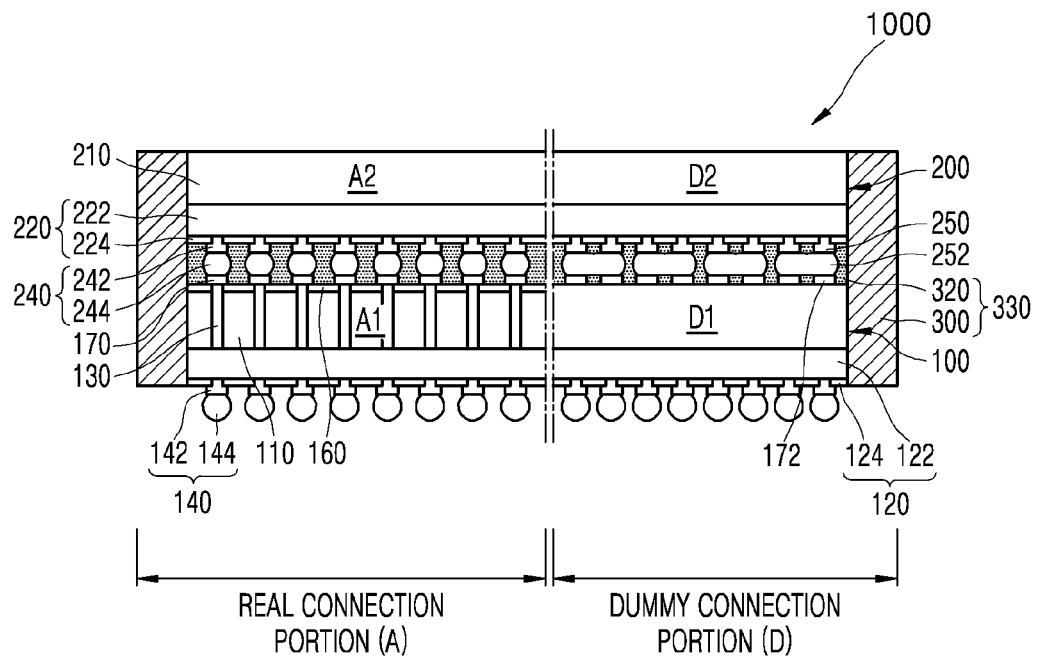
FIGS. 1 to 13 are cross-sectional views of chip-stacked semiconductor packages according to various example embodiments.

Hereinafter, the present inventive concepts will be described in detail by explaining some example embodiments of the invention with reference to the attached drawings. The example embodiment may, however, be embodied in many different forms and should not be construed as being limited to the example embodiments set forth herein; rather, these example embodiments are provided so that this disclosure will be thorough and complete, and will fully convey the concept and scope of example embodiments to those skilled in the art. In the drawings, the thicknesses of layers and regions are exaggerated for clarity.

It will be understood that when a component, such as a layer, a film, a region, or a plate, is referred to as being "on" or "connected to" another component, the component can be directly on or connected to the other component or intervening components may be present thereon. When a component is referred to as being "directly on" or "directly connected to" another component, intervening components may not be present thereon. Like reference numerals in the drawings denote like elements. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

It will be understood that although the terms may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Some example embodiments of the inventive concepts are described herein with reference to cross-section illustrations that are schematic illustrations of idealized example embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments will be explained in further detail with reference to the accompanying drawings.

FIG. 1 is a cross-sectional view of a chip-stacked semiconductor package 1000 according to an example embodiment.

In particular, the chip-stacked semiconductor package 1000 may include a first chip 100, a second chip 200 stacked on the first chip 100, and a sealing member 330 sealing the first chip 100 and the second chip 200. The chip-stacked semiconductor package 1000 may have a structure in which both end portions of the second chip 200 and edges of the first chip 100 may be formed to be flush with each other.

The first chip 100 and the second chip 200 may include a real connection portion A and a dummy connection portion D. The real connection portion A may be a portion in which the first chip 100 and the second chip 200 are electrically connected to an external device (not shown) through real through silicon vias 130 and first and second connection members 140 and 240. Hereinafter, the real connection portion may collectively refer to a portion which is electrically connected to the external device.

The dummy connection portion D may be a portion in which the first chip 100 and the second chip 200 are physically connected to first bridge dummy bumps 252, but may not be electrically connected to the external device. Hereinafter, the dummy connection portion D may collectively refer to a portion which is not electrically connected to the external device. The real connection portion A and the dummy connection portion D of the first chip 100 may be respectively indicated as A1 and D1, and the real connection portion A and the dummy connection portion D of the second chip 200 may be respectively indicated as A2 and D2.

The first chip 100 may include a first chip body 110, a first lower insulating layer 120, first real through silicon vias 130, the first connection members 140, a protective layer 160, first real bump pads 170, and first dummy bump pads 172. There may be a plurality of first real bump pads 170. There may be a plurality of first dummy bump pads 172.

The first chip body 110 may include an integrated circuit layer formed on a silicon substrate (not shown) and an interlayer insulating layer (not shown) covering the integrated circuit layer. The first lower insulating layer 120 may include an inter-metallic insulating layer 122 and a passivation layer 124. A multilayer wire pattern (not shown) may be formed inside the inter-metallic insulating layer 122.

The first real bump pads 170 may be formed on an upper surface of the first chip body 110. The first real through silicon vias 130 penetrate the first chip body 110 of the real connection portion A1 and may be connected to the multilayer wire pattern in the first lower insulating layer 120. The first connection members 140 may include external bump pads 142 and external bumps 144, which are formed on a lower surface of the first chip body 110 and are electrically and/or physically connected to the external device. The external bump pads 142 and the external bumps 144 may be referred to as bump pads and bumps.

The external bump pads 142 may be formed of conductive materials on an upper surface of the passivation layer 124 and may be electrically connected to the multilayer wire pattern in the first lower insulating layer 120. Accordingly, the external bump pads 142 may be electrically connected to the first real through silicon vias 130 via the multilayer wire pattern. In other words, the first real through silicon vias 130 may be electrically connected to the first connection members 140.

A under bump metal (UBM) (not shown) may be formed on upper surfaces of the external bump pads 142. The external bump pads 142 may be formed of, for example, aluminum (Al) or copper (Cu), and may be formed through, for example, a pulse plating or direct current (DC) electroplating method. However, materials or methods of forming the external bump pads 142 are not limited thereto.

The external bumps 144 may be formed on upper surfaces of the external bump pads 142. The external bumps 144 may be formed of conductive materials, for example, Al, Cu, gold (Au), solder, etc., but materials thereof are not limited thereto. The external bumps 144 formed of solder may be referred to as solder bumps.

The protective layer 160 may be formed of an insulating material and be provided on a portion of the upper surface of the first chip body 110 at the real connection portion A1, and may protect the first chip body 110 from the outside. The protective layer 160 may be, for example, an oxide layer or a nitride layer, or may be a bilayer including, for example, an oxide layer and a nitride. Further, the protective layer 160 may be an oxide layer, for example, a silicon oxide layer ($SiO_2$) formed by high-density plasma chemical vapor deposition (HDP-CVD). Further, the protective layer 160 may be formed on a portion of the upper surface of the first chip body 110 at the dummy connection portion D1 of the second chip 200.

The first real bump pads 170 may be electrically connected to the first real through silicon vias 130. Like the external bump pads 142, the first real bump pads 170 may be formed of, for example, Al, Cu, etc. The first dummy bump pads 172 may be formed on the upper surface of the first chip body 110. The first dummy bump pads 172 may not be electrically connected to the external bump pads 142 configuring the first connection members 140. Like the external bump pads 142, the first dummy bump pads 172 may be formed of, for example, Al, Cu, etc.

The second chip 200 may include a second chip body 210, a second lower insulating layer 220, the second connection members 240, second dummy bump pads 250, and the first bridge dummy bumps 252. Like the first chip body 110, the second chip body 210 may include an integrated circuit layer formed on a silicon substrate and an interlayer insulating layer (not shown) covering the integrated circuit layer. An upper surface of the second chip body 210 may be exposed to the outside. The upper surface of the second chip body 210 may be a rear surface of the silicon substrate on which the integrated circuit layer is formed.

The second lower insulating layer 220 may be formed on a lower surface of the second chip body 210 and may include an inter-metallic insulating layer 222 and a passivation layer 224. A multilayer wire pattern (not shown) may be formed inside the inter-metallic insulating layer 222. The second connection members 240 may include second real bump pads 242 formed on the lower surface of the second chip body 210 and first real bumps 244. There may be a plurality of second real bump pads 242 and a plurality of first real bumps 244.

The second real bump pads 242 may be formed of conductive materials on an upper surface of the passivation layer 224 and may be electrically connected to the multilayer wire pattern in the second lower insulating layer 220.

The second dummy bump pads 250 may be formed of conductive materials and be provided on the upper surface of the passivation layer 224 and may be or may not be electrically connected to the multilayer wire pattern in the second lower insulating layer 220.

A UBM (not shown) may be formed on upper surfaces of second real bump pads 242 and/or second dummy bump pads 250. The second real bump pads 242 and the second dummy bump pads 250 may be formed of the same material as or different materials from the external bump pads 142 of the first connection members 140, and a method of forming the second real bump pads 242 and the second dummy bump pads 250 may be the same as or different from the method of forming the external bump pads 142.

The first real bumps 244 may be formed on the upper surfaces of the second real bump pads 242. The first real bumps 244 may be formed of conductive materials, for example, Cu, Al, Au, solder, etc., like the external bumps 144 of the first connection members 140. However, materials of the first real bumps 244 are not limited thereto. Differently from the first chip 100, the second chip 200 may not have through silicon vias which penetrate the second chip body 210. First bridge dummy bumps 252 may be formed on a lower surface of the second chip body 210. The first bridge dummy bumps 252 may be formed on the upper surfaces of the second dummy bump pads 250.

The second chip 200 may be stacked on the upper surface of the first chip 100. The second chip 200 may be stacked on the upper surface of the first chip 100 in a flip-chip manner. In a stack structure in which the first chip 100 and the second chip 200 are stacked, the second connection members 240 of the second chip 200, for example, the first real bumps 244, may be electrically connected to the first real bump pads 170 of the first chip 100. Accordingly, the multilayer wire pattern of the second chip 200 may be electrically connected to the first real through silicon vias 130 through the second connection members 240 and the first real bump pads 170.

In the stack structure in which the first chip 100 and the second chip 200 are stacked, the first bridge dummy bumps 252 may be physically connected to the first dummy bump pads 172. In FIG. 1, the first bridge dummy bumps 252 may be physically connected to two first dummy bump pads 172. Accordingly, during a thermo-compression bonding process and a reflow process performed to electrically connect the first real bump pads 170 of the first chip 100 to the first real bumps 244 of the second chip 200, bending of the first chip 100 and the second chip 200 may be controlled by using the first bridge dummy bumps 252. Accordingly, the first chip and the second chip 200 may be easily stacked.

When the second connection members 240 of the second chip 200 are arranged to correspond to an arrangement of the first real bump pads 170 of the first chip 100, the second chip 200 may be stacked on the upper surface of the first chip 100. Types of the first and second chips 100 and 200 may be the same or different from each other.

The sealing member 330 may include an underfill 320 and a molding member 300. The underfill 320 may fill a gap between the first chip 100 and the second chip 200. The gap refers to an area or space between the first chip 100 and the second chip 200, at which the first chip 100 and the second chip 200 are connected. For example, the gap may be provided in an area or space at which the first real bump pads 170 and the first dummy bump pads 172 of the first chip 100 are connected to the second connection members 240 and the first bridge dummy bumps 252, respectively. The underfill 320 may be formed of underfill resin, for example, epoxy resin, and may include, for example, a silica filler or flux.

The molding member 300 may be formed on an outer area of the underfill 320. The underfill 320 may be formed of the same material as or different materials from the molding member 300. The molding member 300 may be formed of a polymer, for example, resin. For example, the molding member 300 may be formed of an epoxy molding compound (EMC). Thus, the molding member 300 may seal the first chip 100, the second chip 200, and sides of the underfill 320.

An upper surface of the molding member 300 may be on a same level as the upper surface of the second chip 200. Accordingly, the upper surface of the second chip 200 may be exposed to the outside. When an integrated circuit layer included in the second chip body 210 is formed on a first surface of a silicon substrate and the second chip 200 is stacked on the first chip 100 in a flip-chip manner, the upper surface of the second chip 200 may be a second surface of the silicon substrate that is opposite to the first surface thereof.

In the present example embodiment, because the first connection members 140 of the first chip 100 protrude from the intermediate insulating layer 122 and through a lower surface of the passivation layer 124, the first connection members 140 may be connected to the multilayer wire pattern (not shown) in the first lower insulating layer 120 (for example, in the inter-metal insulating layer 122) and protrude from a plane which is in the same level as the passivation layer 124. For example, the protective layer 160 may be formed only on the upper surface of the first chip 100, and be sealed by the underfill 320 and the molding member 300. According to this configuration, the protective layer 160 may not be exposed to the outside.

Sides of each of the first and second chips 100 and 200 may be sealed by the sealing member 300, thereby not being exposed to the outside. For example, silicon in the sides of each of the first and second chips 100 and 200 may not be exposed to the outside. When the silicon in the sides of each of the first and second chips 100 and 200 is not exposed to the outside, physical impact applied to the first and second chips 100 and 200 may be prevented or mitigated.

Figure 2:
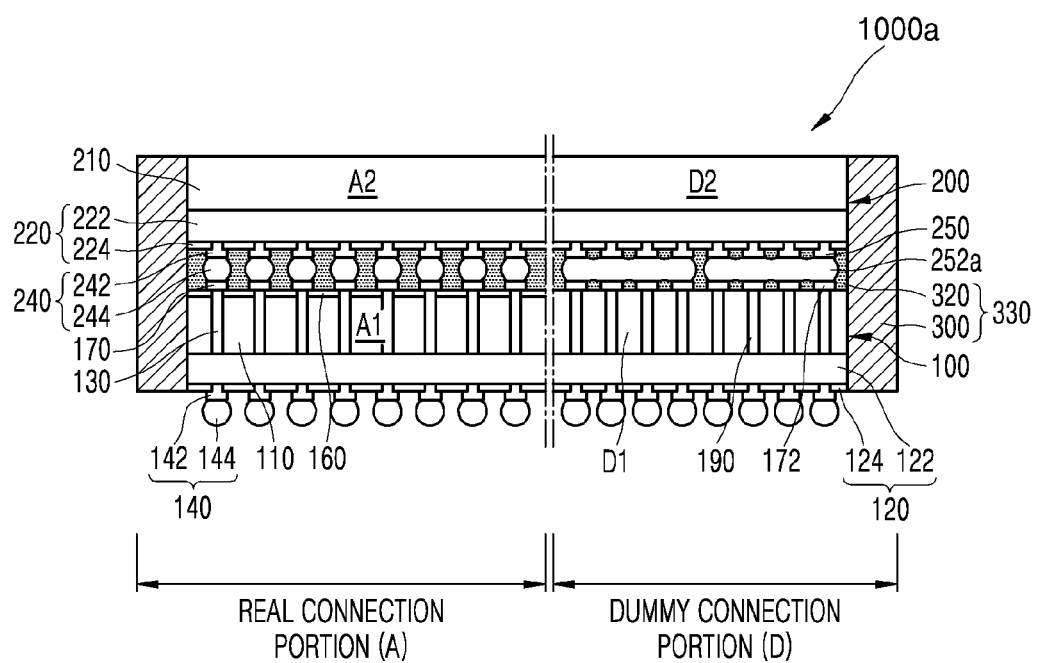

FIG. 2 is a cross-sectional view of a chip-stacked semiconductor package 1000a according to an example embodiment.

For example, the chip-stacked semiconductor package 1000a of FIG. 2 may have a similar structure to the chip-stacked semiconductor package 1000 of FIG. 1 except for first bridge dummy bumps 252a and first dummy through silicon vias 190. Accordingly, the descriptions which have been already provided with reference to FIG. 1 will be omitted or briefly provided for convenience.

In the chip-stacked semiconductor package 1000a, the first dummy through silicon vias 190 may be formed in the dummy connection portion D1 of the first chip 100. The first dummy through silicon vias 190 may be connected to lower surfaces of the first dummy bump pads 172. The first dummy through silicon vias 190 may help mitigating or preventing warpage of the first chip 100.

The first dummy through silicon vias 190 may penetrate the first chip body 110 of the dummy connection portion D1, while not being connected to the multilayer wire pattern (not shown) in the first lower insulating surface 120. Accordingly, the first dummy through silicon vias 190 may not be electrically connected to the first connection members 140.

The first bridge dummy bumps 252a may be physically connected to four first dummy bump pads 172. Accordingly, during a reflow process performed to electrically connect the first real bump pads 170 of the first chip 100 to the first real bumps 244 of the second chip 200, warpage of the first chip 100 and the second chip 200 may be controlled, prevented or mitigated by the first bridge dummy bumps 252a. Thus, the first chip 100 and the second chip 200 may be easily stacked.

Figure 3:
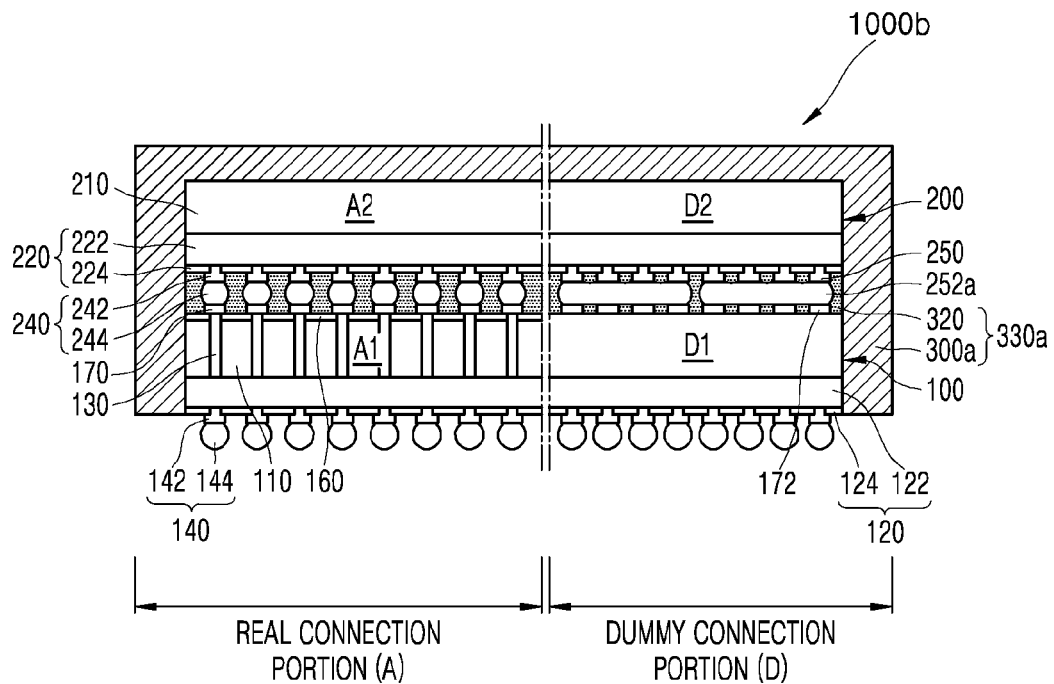

FIG. 3 is a cross-sectional view of a chip-stacked semiconductor package 1000b according to an example embodiment.

For example, the chip-stacked semiconductor package 1000b may have a similar structure to the chip-stacked semiconductor packages 1000 and 1000a of FIGS. 1 and 2 except for a sealing member 330a. Accordingly, the descriptions which have been already provided with reference to FIGS. 1 and 2 will be omitted or briefly provided for convenience.

In the chip-stacked semiconductor package 1000b of the present example embodiment, a molding member 300a forming the sealing member 330a may cover not only sides of the second chip 200 but also an upper surface of the second chip 200. That is, the sealing member 330a may cover sides of the first chip 100 and sides and an upper surface of the second chip 200, while not covering a lower surface of the first chip 100 and the second chip 200. When the sealing member 330a covers the sides of the first chip 100 and the sides and the upper surface of the second chip 200, the first chip 100 and the second chip 200 may be more protected than cases at which the sealing member 330a covers only the sides of the first chip 100 and the second chip 200.

The above-described structure may be achieved by skipping a grinding process with respect to the sealing member 330a or partially performing the grinding process with respect to the sealing member 330a to leave the sealing member 330a on the upper surface of the second chip 200.

Figure 4:
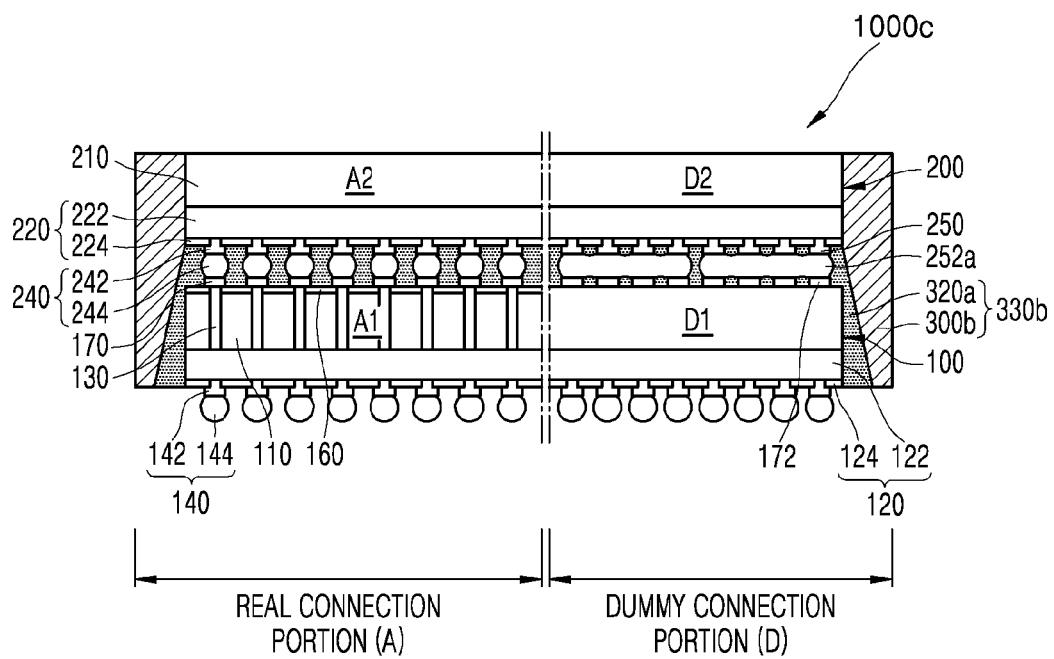

FIG. 4 is a cross-sectional view of a chip-stacked semiconductor package 1000c according to an example embodiment.

For example, the chip-stacked semiconductor package 1000c may have a similar structure to the chip-stacked semiconductor packages 1000 and 1000a of FIGS. 1 and 2 except for a sealing member 330b. Accordingly, the descriptions which have been already provided with reference to FIGS. 1 and 2 will be omitted or briefly provided for convenience.

In the chip-stacked semiconductor package 1000c, an underfill 320a constituting the sealing member 330b may cover a gap between the first chip 100 and the second chip 200. The gap refers to an area or space between the first chip 100 and the second chip 200, at which the first chip 100 and the second chip 200 are connected to each other. Further, the underfill 320a may cover the sides of the first chip 100. For example, a lower surface of the underfill 320a may be at a same level as a lower surface of a molding member 300b formed outside the first chip 100.

The underfill 320a may have a shape in which a lower portion thereof is wider than an upper portion thereof, but the shape of the underfill 320a may vary. For example, the underfill 320a has a shape in which size of the upper and lower portions are the same.

Due to the underfill 320a, the molding member 300b may seal sides of the second chip 200 and sides of the underfill 320a. The lower surface of the underfill 320a may be in a same level as the lower surface of the molding member 300b. Also, the lower surfaces of the underfill 320a and the molding member 300b may be in a same level as a lower surface of a passivation layer 124 of the first chip 100.

Figure 5:
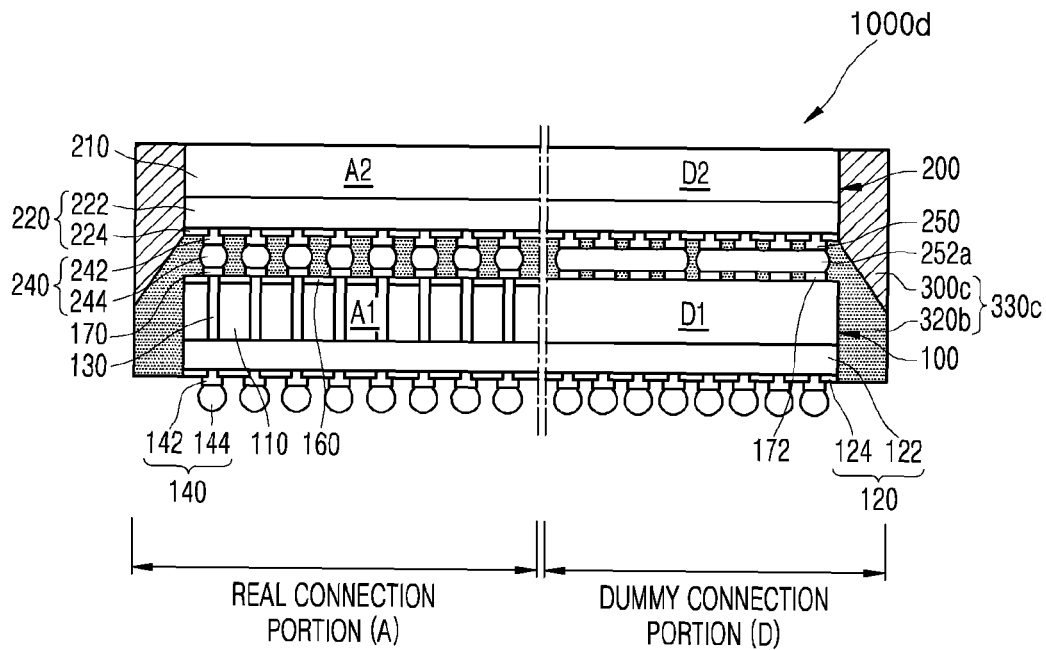

FIG. 5 is a cross-sectional view of a chip-stacked semiconductor package 1000d according to an example embodiment.

For example, the chip-stacked semiconductor package 1000d may have a similar structure to the chip-stacked semiconductor packages 1000 and 1000a of FIGS. 1 and 2 except for a sealing member 330c. Accordingly, the descriptions which have been already provided with reference to FIGS. 1 and 2 will be omitted or briefly provided for convenience.

In the chip-stacked semiconductor package 1000d, an underfill 320b constituting a sealing member 330c may cover a gap between the first chip 100 and the second chip 200, and may cover sides of the first chip 100. The gap refers to an area or space between the first chip 100 and the second chip 200, at which the first chip 100 and the second chip 200 are connected. Accordingly, the underfill 320b may easily seal the sides of the first chip 100.

Furthermore, sides of the underfill 320b may be exposed to the outside, and exposed sides of the underfill 320b may be at a same level as exposed sides of the molding member 300c. A lower surface of the underfill 320b may be exposed to the outside of the chip-stacked semiconductor package 1000d. A lower surface of the underfill 320b may be at a same level as the lower surface of the passivation layer 124 of the first chip 100.

A width of the lower surface of the underfill 320b of FIG. 5 may be greater than a width of the lower surface of the underfill 320a of FIG. 4. Because the underfill 320b is formed to be exposed to the outside, the molding member 300c may cover the sides of the second chip 200, while not entirely covering the sides of the first chip 100.

Figure 6:
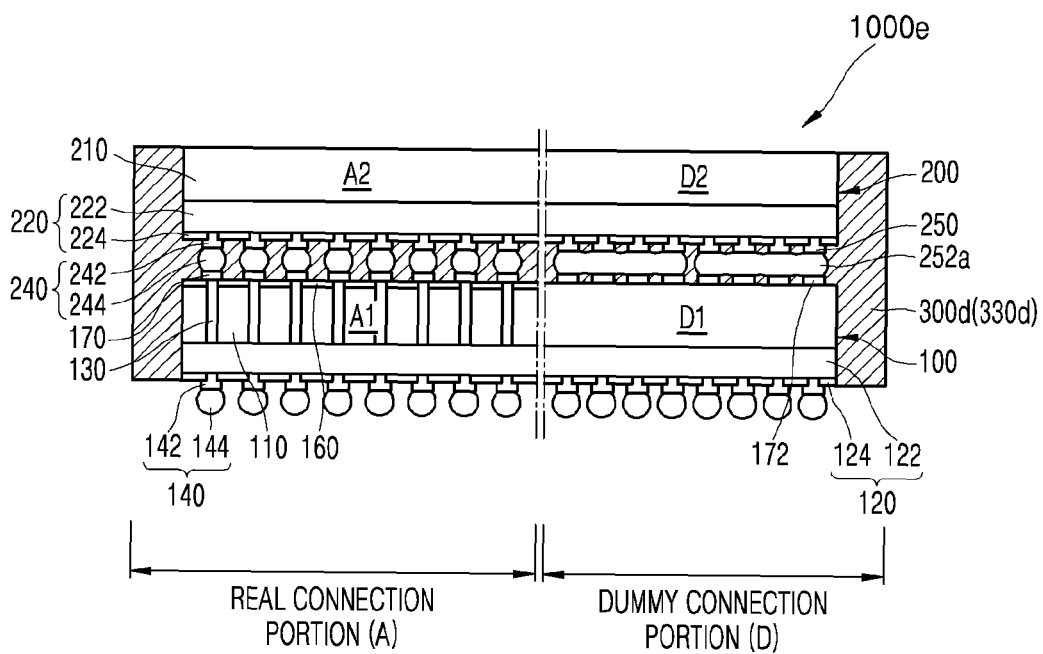

FIG. 6 is a cross-sectional view of a chip-stacked semiconductor package 1000e according to an example embodiment.

For example, the chip-stacked semiconductor package 1000e may have a similar structure to the chip-stacked semiconductor packages 1000 and 1000a of FIGS. 1 and 2 except for a sealing member 330d. Accordingly, the descriptions which have been already provided with reference to FIGS. 1 and 2 will be omitted or briefly provided for convenience.

In the chip-stacked semiconductor package 1000e, a molding member 300d constituting the sealing member 330d may cover a gap between the first chip 100 and the second chip 200 and sides of each of the first chip 100 and the second chip 200. The gap refers to an area or space between the first chip 100 and the second chip 200, at which the first chip 100 and the second chip 200 are connected to each other. Accordingly, the molding member 300d may easily seal the sides of the first chip 100 and the second chip 200.

According to this example embodiment, the chip-stacked semiconductor package 1000e may not have an underfill. Thus, the first chip 100 and the second chip 200 may be sealed using only the sealing member 330d. Accordingly, the gap (e.g., an area or space between the first chip 100 and the second chip 200, at which the first chip 100 and the second chip 200 are connected) may be filled with the molding member 300d. A chip-stacked semiconductor package in which the first chip 100 and the second chip 200 are sealed by the molding member 300d without using an underfill may be formed through a molded underfill (MUF) process.

Figure 7:
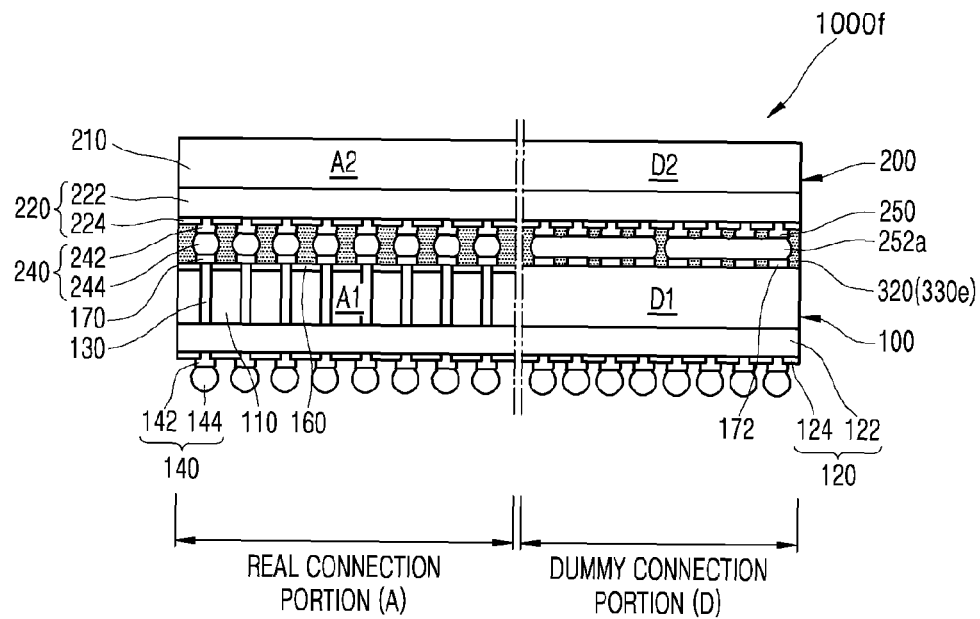

FIG. 7 is a cross-sectional view of a chip-stacked semiconductor package 1000f according to an example embodiment.

For example, the chip-stacked semiconductor package 1000*f* may have a similar structure to the chip-stacked semiconductor packages 1000 and 1000*a* of FIGS. 1 and 2 except for a sealing member 330*e*. Accordingly, the descriptions which have been already provided with reference to FIGS. 1 and 2 will be omitted or briefly provided for convenience.

In the chip-stacked semiconductor package 1000*f*, an underfill 320 constituting the sealing member 330*e* may be formed only at a gap between the first chip 100 and the second chip 200. The gap refers to an area or space between the first chip 100 and the second chip 200, at which the first chip 100 and the second chip 200 are connected. According to this example embodiment, the sealing member 330*e* of the chip-stacked semiconductor package 1000*f* may not include a molding member.

The sealing member 330*e* may fill the gap between the first chip 100 and the second chip 200, while not covering sides of the first chip 100 and the second chip 200. The gap refers to an area or space between the first chip 100 and the second chip 200, at which the first chip 100 and the second chip 200 are connected. For example, the gap between the first chip 100 and the second chip 200 may correspond to to an area or space at which the first real bump pads 170 and the first dummy bump pads 172 of the first chip 100 may be connected to second connection members 240 and first bridge dummy bumps 252*a*, respectively. Because the sealing member 330*e* is not formed on the sides of the first chip 100 and the second chip 200, the sides of the first chip 100 and the second chip 200 may be exposed to the outside. Accordingly, when the chip-stacked semiconductor package 1000*f* is subsequently mounted on a board substrate and is further molded, a molding member may be well bonded and coupled to an upper surface of the second chip 200 and/or the sides of the first chip 100 and the second chip 200.

Figure 8:
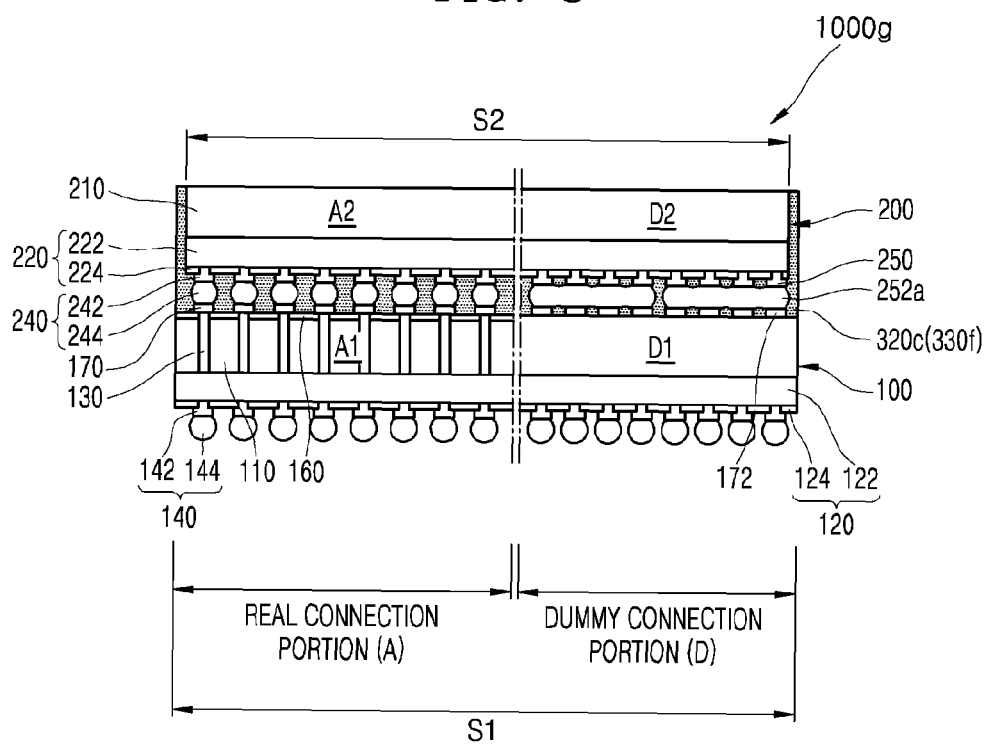

FIG. 8 is a cross-sectional view of a chip-stacked semiconductor package 1000*a* according to an example embodiment.

For example, the chip-stacked semiconductor package 1000*g* may have a similar structure to the chip-stacked semiconductor packages 1000 and 1000*a* of FIGS. 1 and 2 except for a sealing member 330*f*. Accordingly, the descriptions which have been already provided with reference to FIGS. 1 and 2 will be omitted or briefly provided for convenience.

In the chip-stacked semiconductor package 1000*g*, an underfill 320*c* forming the sealing member 330*f* may fill a gap between the first chip 100 and the second chip 200 (e.g., the gap may refer to an area or space, at which the first chip 100 and the second chip 200 are connected), and extend to cover sides of the second chip 200.

The sealing member 330*f* may fill the gap between the first chip 100 and the second chip 200. For example, in the gap between the first chip 100 and the second chip 200, the first real bump pads 170 and the first dummy bump pads 172 of the first chip 100 may be connected to the second connection members 240 and first bridge dummy bumps 252*a*, respectively. The sealing member 330*f* may fill the gap while covering the sides of the second chip 200.

Sides of the sealing member 330*f*, which cover the sides of the second chip 200, and sides of the first chip 100 may be formed to be flush with each other. Accordingly, a size (e.g., a horizontal width) of the second chip 200 including the sealing member 330*f* may be substantially the same as a size (e.g., a horizontal width) of the first chip 100.

Further, because the sealing member 300*f* is not formed on the sides of the first chip 200, the sides of the second chip 200 may be exposed to the outside. Accordingly, when the chip-stacked semiconductor package 1000*g* is subsequently mounted on a board substrate and is further molded, a molding member may be well bonded and coupled to the sides of the first chip 100

Figure 9:
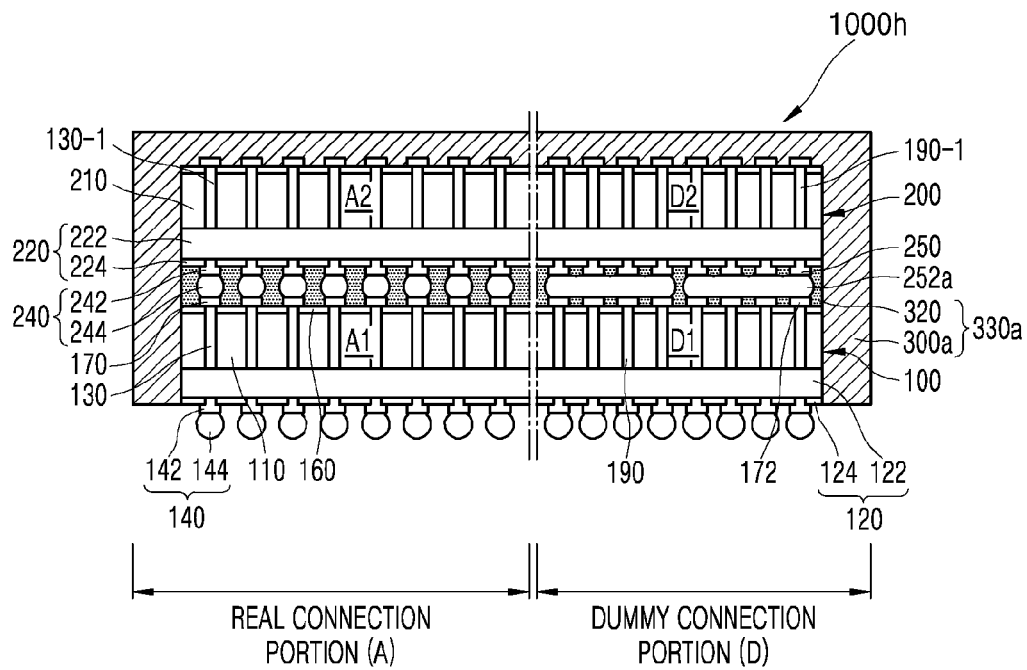

FIG. 9 is a cross-sectional view of a chip-stacked semiconductor package 1000*h* according to an example embodiment.

For example, the chip-stacked semiconductor package 1000*h* may have a similar structure to the chip-stacked semiconductor packages 1000, 1000*a* and 1000*b* of FIGS. 1 to 3 except for second real through silicon vias 130-1 and second dummy through silicon vias 190-1. Accordingly, the descriptions which have been already provided with reference to FIGS. 1 to 3 will be omitted or briefly provided for convenience.

In the chip-stacked semiconductor package 1000*h*, the second real through silicon vias 130-1 may be formed in a real connection portion A2 of the second chip 200. The second real through silicon vias 130-1 may prevent or mitigate warpage of the second chip 200.

The second real through silicon vias 130-1 may be formed through the second chip body 210 of the real connection portion A2. The second real through silicon vias 130-1 may be electrically connected to the first connection members 140 and the second connection members 240.

In the chip-stacked semiconductor package 1000*h*, the second dummy through silicon vias 190-1 may be formed in a dummy connection portion D2 of the second chip 200. The second dummy through silicon vias 190-1 may prevent or mitigate warpage of the second chip 200. The second dummy through silicon vias 190-1 may be formed in the second chip body 210. The second dummy through silicon vias 190-1 may penetrate the second chip body 210 of the dummy connection portion D2. The second dummy through silicon vias 190-1 may be electrically connected to the first connection members 140.

Figure 10:
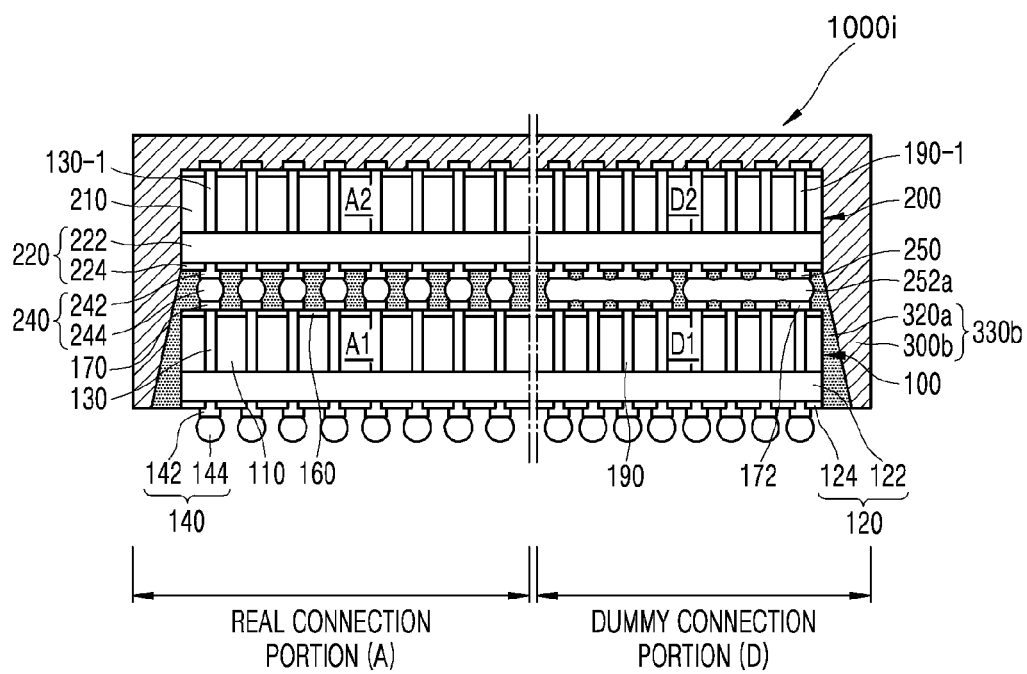

FIG. 10 is a cross-sectional view of a chip-stacked semiconductor package 1000*i* according to an example embodiment.

For example, the chip-stacked semiconductor package 1000*i* may be formed by combining features of the chip-stacked semiconductor packages 1000, 1000*a*, 1000*c* and 1000*h* of FIGS. 1, 2, 4 and 9. Accordingly, the descriptions which have been provided with reference to FIGS. 1, 2, 4 and 9 may be omitted or briefly provided for convenience.

As shown in FIG. 9, in the chip-stacked semiconductor package 1000*i*, the second real through silicon vias 130-1 may be formed in the real connection portion A2 of the second chip 200. The second real through silicon vias 130-1 may penetrate the second chip body 210 of the real connection portion A2. The second real through silicon vias 130-1 may be electrically connected to the first connection members 140 and the second connection members 240.

As shown in FIG. 9, in the chip-stacked semiconductor package 1000*i*, the second dummy through silicon vias 190-1 may be formed in the dummy connection portion D2 of the second chip 200. The second dummy through silicon vias 190-1 may be installed to prevent or mitigate warpage of the second chip 200. The second dummy through silicon vias 190-1 may penetrate the second chip body 210 of the dummy connection portion D2. The second dummy through silicon vias 190-1 may not be electrically connected to the first connection members 140.

As shown in FIG. 4, in the chip-stacked semiconductor package 1000*i*, an underfill 320*a* forming a sealing member 330*b* may cover the portion in which the first chip 100 and the second chip 200 are connected and the first chip 100. Further, the underfill 320a may cover sides of the first chip 100. For example, a lower surface of the underfill 320a may be at a same level as a lower surface of a molding member 300b formed outside the first chip 100.

Figure 11:
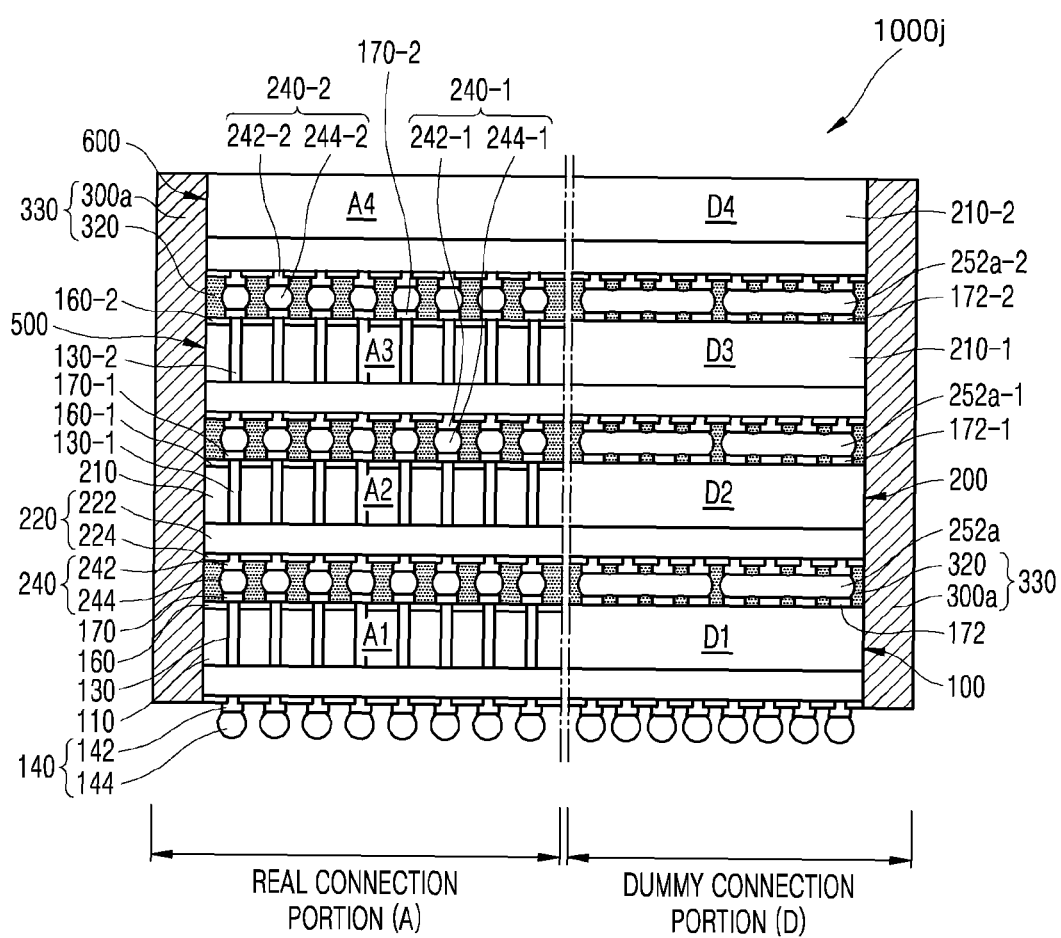

FIG. 11 is a cross-sectional view of a chip-stacked semiconductor package 1000j according to an example embodiment.

For example, the chip-stacked semiconductor package 1000j may have a structure in which four chips are stacked, while the chip-stacked semiconductor packages 1000 through 1000i illustrate structures in each of which two chips are stacked. Accordingly, the descriptions which have been provided will be omitted or briefly provided.

The chip-stacked semiconductor package 1000j may include a first chip 100, a second chip 200, a third chip 500, a fourth chip 600, and a sealing member 330. A real connection portion A and a dummy connection portion D of the third chip 500 may be referred to as A3 and D3, respectively, and a connection portion A and a dummy connection portion D of the fourth chip 600 may be referred to as A4 and D4, respectively.

The second chip 200, the third chip 500, and the fourth chip 600 may have a similar structure to the second chip 200 described with reference to FIGS. 1 and 2 except for a chip connection structure. The second chip 200 and the third chip 500 may have real through silicon vias 130-1 and 130-2, real bump pads 170-1 and 170-2, and protective layers 160-1 and 160-2 in the real connection portion A. Connection members 240, 240-1 and 240-2 may exist between chips 100, 200, 500 and 600. The real through silicon vias 130-1 and 130-2 may be formed in chip bodies 210 and 210-1 of the second chip 200 and the third chip 500. Real through silicon vias may not be formed in a chip body 210-2 of the fourth chip 600, which is disposed on an uppermost surface of the chip-stacked semiconductor package 1000j. The third and fourth chips 500 and 600 may include dummy bump pads 172-1 and 172-2 and dummy bridge bumps 252a-1 and 252a-2 in the dummy connection portion D.

The first, second, third and fourth chips 100, 200, 500 and 600 may be sealed by the sealing members 330. The sealing member may include an underfill 320 and a molding member 300a. The underfill 320 may fill gaps between the first, second, third and fourth chips 100, 200, 500 and 600. The molding members 300 may be formed on sides of each of the first, second, third and fourth chips 100, 200, 500 and 600 and be disposed outside the underfill 320.

Figure 12:
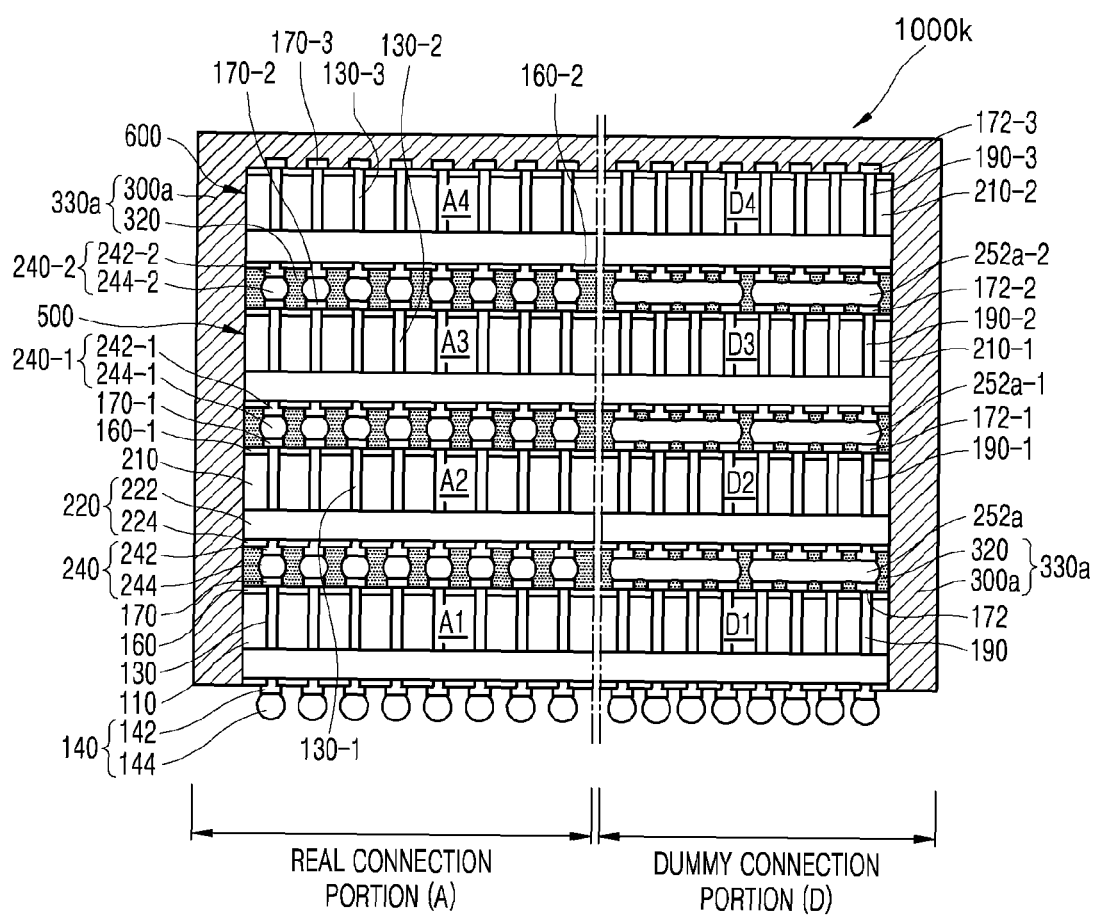

FIG. 12 is a cross-sectional view of a chip-stacked semiconductor package 1000k according to an example embodiment.

For example, the chip-stacked semiconductor package 1000k may have a similar structure to the chip-stacked semiconductor package 1000j except for real through silicon vias 130-3 and dummy through silicon vias 190, 190-1, 190-2 and 190-3. Accordingly, the descriptions which have been provided with reference to FIG. 11 will be omitted or briefly provided for convenience.

In the chip-stacked semiconductor package 1000k, the real through silicon vias 130-3 may be formed in the chip body 210-2 in a real connection portion A4 of the fourth chip 600. Further, the dummy through silicon vias 190, 190-1, 190-2 and 190-3 may be formed on the first, second, third and fourth chips 100, 200, 500 and 600, respectively, in a dummy connection portion D.

Figure 13:
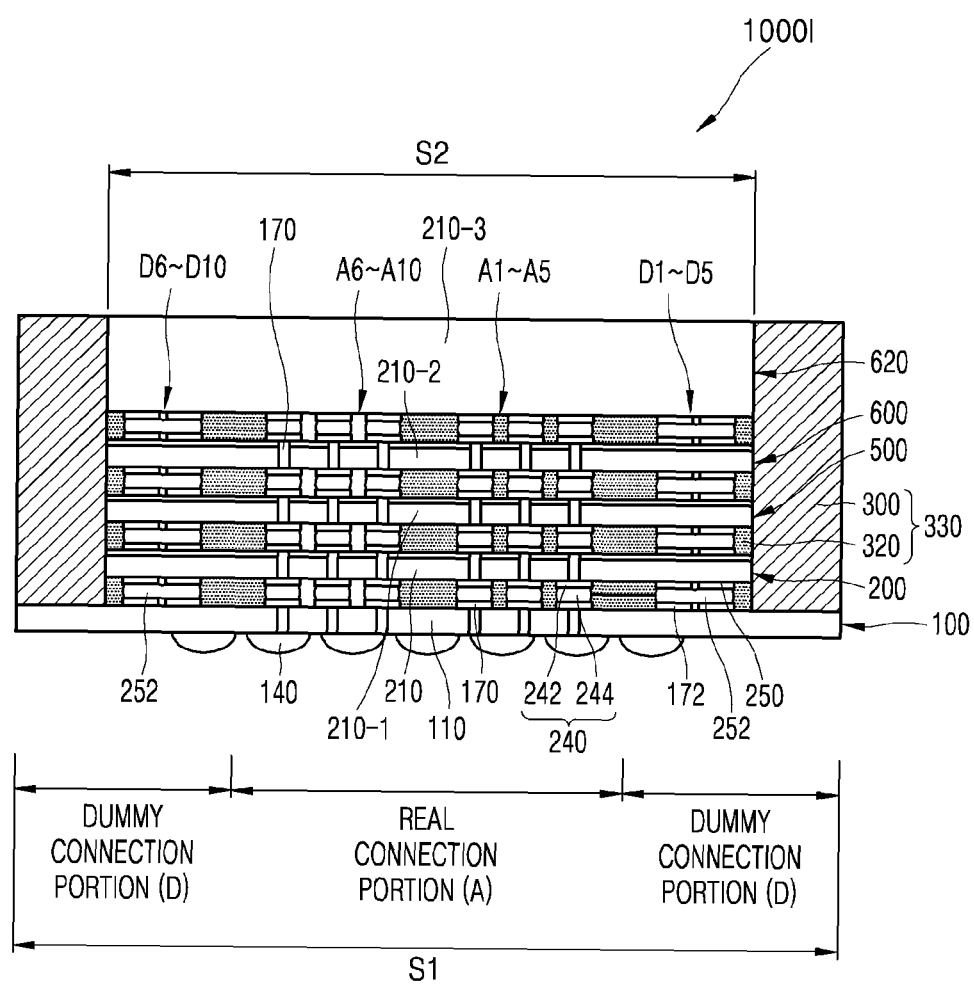

FIG. 13 is a cross-sectional view of a chip-stacked semiconductor package 10001 according to an example embodiment.

For example, the chip-stacked semiconductor package 10001 may have a similar structure to the chip-stacked semiconductor package 1000k of FIG. 11 except for a plurality of real connection portions A, which are separate from each other, and a plurality of dummy connection portions D which are separate from each other. Accordingly, the descriptions which have been provided with reference to FIG. 11 will be omitted or briefly provided.

In the chip-stacked semiconductor package 10001, the second chip 200, the third chip 500, the fourth chip 600, and a fifth chip 620 may be stacked on the first chip 100. The first, second, third, fourth and fifth chips 100, 200, 500, 600 and 620 each may be separated into the plurality of real connection portions A and the plurality of dummy connection portions D. A size (e.g. a horizontal width or length) S1 of the first chip 100 may be larger than a size (e.g. a horizontal width or length) S2 of the second chip 200.

The plurality of real connection portions A may be formed on central portions of chip bodies 110, 210, 210-1, 210-2 and 210-3. The plurality of real connection portions A of the first, second, third, fourth and fifth chips 100, 200, 500, 600 and 620 may be classified into a first real connection group A1 to A5 and a second real connection group A6 to A10, which is separate from the first real connection group A1 to A5.

For example, when the first and second chips 100 and 200 are stacked and the plurality of real connection portions A are classified into two groups, a first real connection portion of the first chip 100 may be A1, and a second real connection portion of the second chip 200 may be A2. A third real connection portion of the first chip 100 may be A6 and a fourth real connection portion of the second chip 200 may be A7. The third real connection portion A6 and the fourth real connection portion A7 may be separate from the first real connection portion A1 and the second real connection portion A2, respectively.

The plurality of dummy connection portions D may be separate from the real connection portions A and may be formed on edges of the chip bodies 110, 210, 210-1, 210-2 and 210-3. The plurality of dummy connection portions D of the first, second, third, fourth and fifth chips 100, 200, 500, 600 and 620 may be classified into a first dummy connection group D1 to D5, and a second dummy connection group D6 to D10, which is separate from the first dummy connection group D1.

For example, when the first and second chips 100 and 200 are stacked and the dummy connection portions D are classified into two groups, a first dummy connection portion of the first chip 100 may be D1, and a second dummy connection portion of the second chip 200 may be D2. A third dummy connection portion of the first chip 100 may be D6 and a fourth dummy connection portion of the second chip 200 may be D7. The third dummy connection portion D6 and the fourth dummy connection portion D7 may be separate from the first dummy connection portion D1 and the second dummy connection portion D2, respectively.

Figure 14:
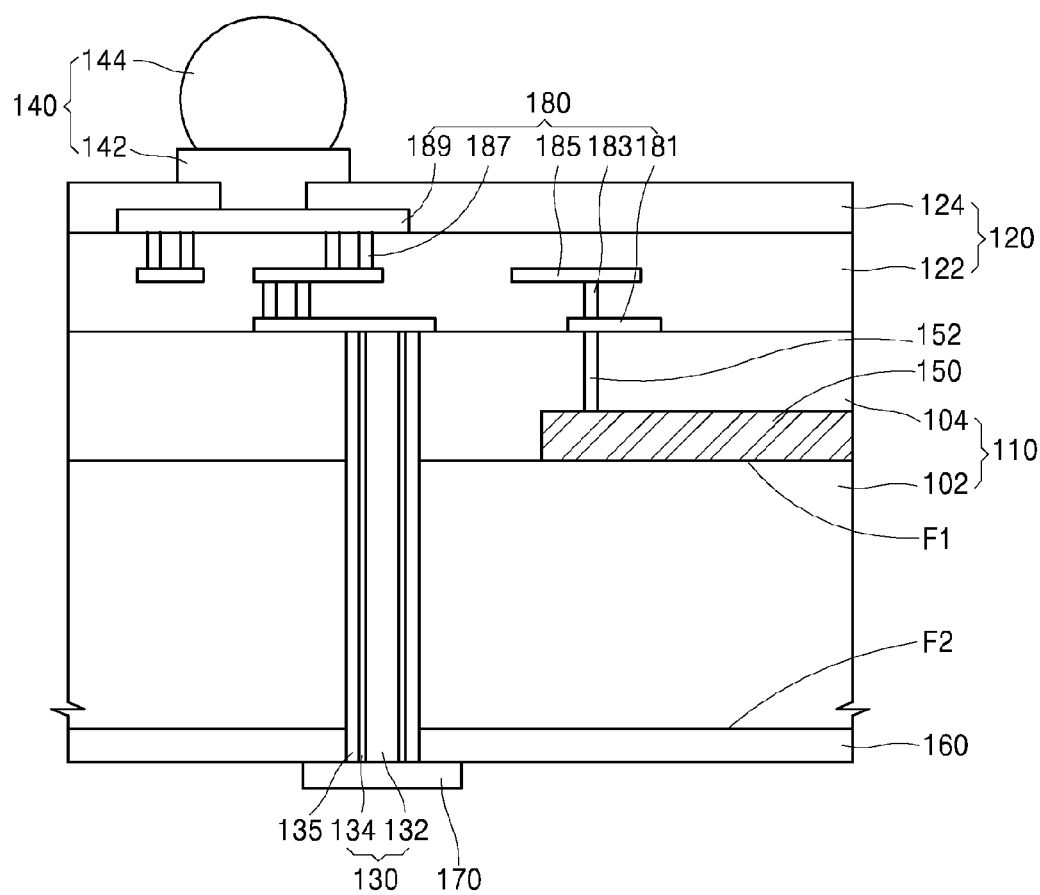
FIGS. 14 and 15 are cross-sectional views of real connection portions of chip-stacked semiconductor packages, according to some example embodiments.
Figure 15:
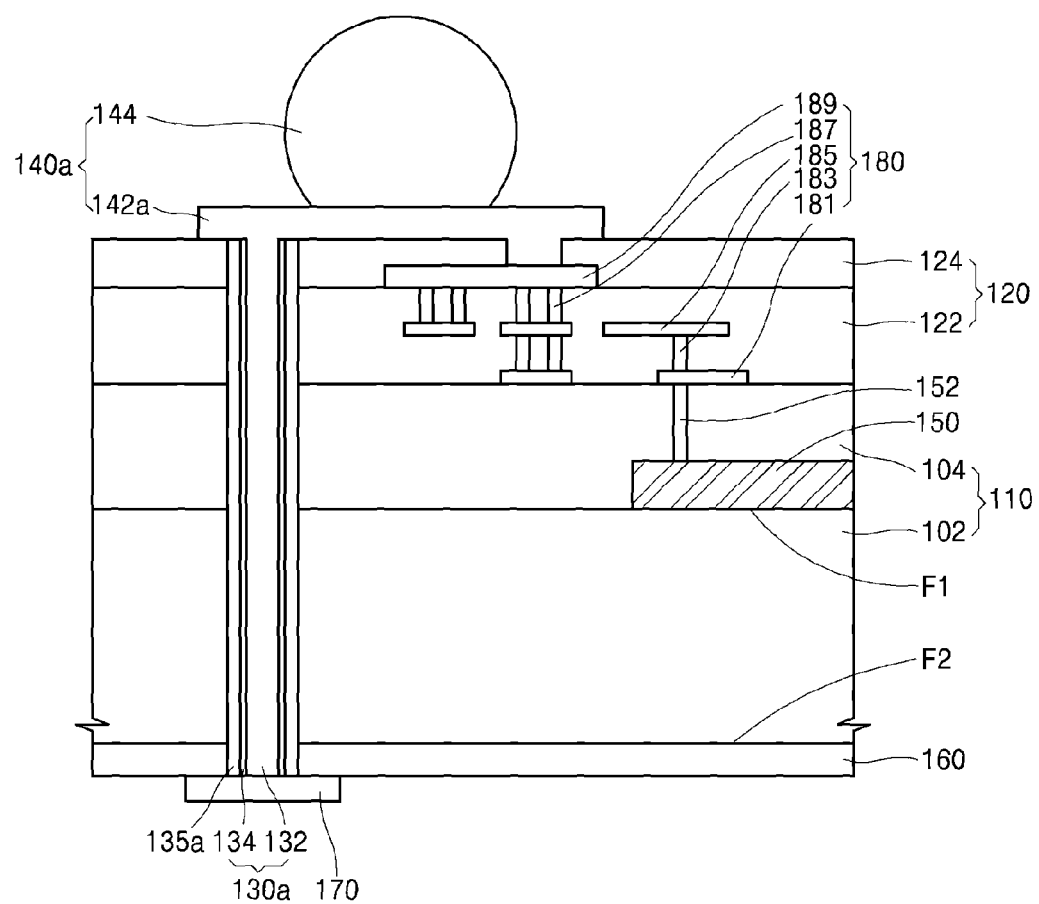

FIGS. 14 and 15 are cross-sectional views of real connection portions A of chip-stacked semiconductor packages, according to some example embodiments.

For example, structures of the real connection portions A of the first chip 100 of the above-described chip-stacked semiconductor packages will be described. The structures of the real connection portions A of the first chip 100 may be applied to the real connection portions of the second, third, fourth and fifth chips 200, 500, 600 and 620 in the same or similar manner. The real connection portion A of the first chip 100 will be described for convenience.

The real through silicon vias 130 of FIG. 14 may have a via-middle structure. Accordingly, the real through silicon vias 130 of FIG. 14 may penetrate a semiconductor substrate 102 and an interlayer insulating layer 104, and may be connected to a multilayer wire pattern 180.

Real through silicon vias 130a of FIG. 15 may have a via-last structure. Accordingly, the real through silicon vias 130a penetrate the semiconductor substrate 102, the interlayer insulating layer 104, an intermetallic insulating layer 122, and a passivation layer 124, and may be directly connected to bump pads 142a and bumps 144 of a first connection members 140a. In FIG. 15, reference numeral 135a may be a spacer insulating layer formed in a trench.

The real through silicon vias 130 will be described in detail with reference to FIG. 14. In the real connection portion A, an integrated circuit layer 150 may be formed on the semiconductor substrate 102 (e.g., on a first surface F1 of a silicon substrate), and the interlayer insulating layer 104 may be formed on the first surface F1 of the semiconductor substrate 102 to cover the integrated circuit layer 150. The semiconductor substrate 102 and the interlayer insulating layer 104 may form the chip body 110 of the first chip 100. The integrated circuit layer 150 may include various circuit devices, for example, transistors and/or capacitors.

A trench is formed on the interlayer insulating layer 104 and the semiconductor substrate 102, and a spacer insulating layer 135 and the real through silicon vias 130 are formed in the trench. The trench may be formed by an etching process or a laser drilling process. In consideration of subsequent polishing of a second surface F2 of the semiconductor substrate 102, the trench may be formed to not completely penetrate the semiconductor substrate 102. The spacer insulating layer 135 may be formed in the trench. The spacer insulating layer 135 may include a proper insulating layer, for example, an oxide layer, and a nitride layer, or may include polymer, or parylene. The spacer insulating layer 135 may be formed by, for example, low temperature deposition, low temperature chemical vapor deposition (LTCVD), polymer spraying, or physical vapor deposition (PVD).

The real through silicon vias 130 may be formed in the spacer insulating layer 135. The real through silicon vias 130 may be formed by forming a barrier metal layer 134 on the spacer insulating layer 135, which is disposed in the trench, and forming a wire metal layer 132 on the barrier metal layer 134. The barrier metal layer 134 may include at least one selected from the group consisting of titanium (Ti), tantalum (Ta), titanium nitride (TiN), and tantalum nitride (TaN), or may have a structure in which two or more of the Ti, Ta, TiN, and TaN are stacked. Before or after forming the real through silicon vias 130, a metal contact 152 may be formed.

On the interlayer insulating layer 104, the multilayer wire pattern 180 connected to the real through silicon vias 130 and the metal contact 152, the intermetallic insulating layer 122, and the passivation layer 124 may be formed. For example, the multilayer wire pattern 180 may have a structure in which wires 181, 185 and 189 and vertical plugs 183 and 187 are stacked. The intermetallic insulating layer 122 may have a multilayer structure according to structure of the multilayer wire pattern 180.

The multilayer wire pattern 180 may be formed by depositing or patterning material layers or by a damascene process. For example, when the multilayer wire pattern 180 includes aluminum (Al) and/or tungsten (W), the multilayer wire pattern 180 may be formed by depositing or patterning material layers. When the multilayer wire pattern 180 includes copper (Cu), the multilayer wire pattern 180 may be formed by a damascene process.

Referring to FIG. 15, the multilayer wire pattern 180, for example, the first connection members 140a connected to the third wire 189 may be formed in the passivation layer 124. Further, the first connection members 140a may be formed after the trench is formed on the passivation layer 124, bump pads 142 (external bump pads) may be formed to fill the trench, and bumps 144 (external bumps) may be formed on the bump pads 142.

The spacer insulating layer 135 and the real through silicon vias 130 (or 130a) may be exposed by removing a desired thickness of the semiconductor substrate 102 from the second surface F2 of the semiconductor substrate 102. Accordingly, the spacer insulating layer 135 (or 135a) and the real through silicon vias 130 may protrude from the second surface F2 and may be exposed to the outside. The semiconductor substrate 102 may be etched using isotropic etching or wet etching such that the second surface F2 of the semiconductor substrate 102 is recessed with respect to a bottom surface of the spacer insulating layer 135 and the real through silicon vias 130. The protective layer 160 may be formed on the second surface F2 of the semiconductor substrate 102, and real bump pads 170 connected to the real through silicon vias 130 may be formed on the protective layer 160.

Figure 16:
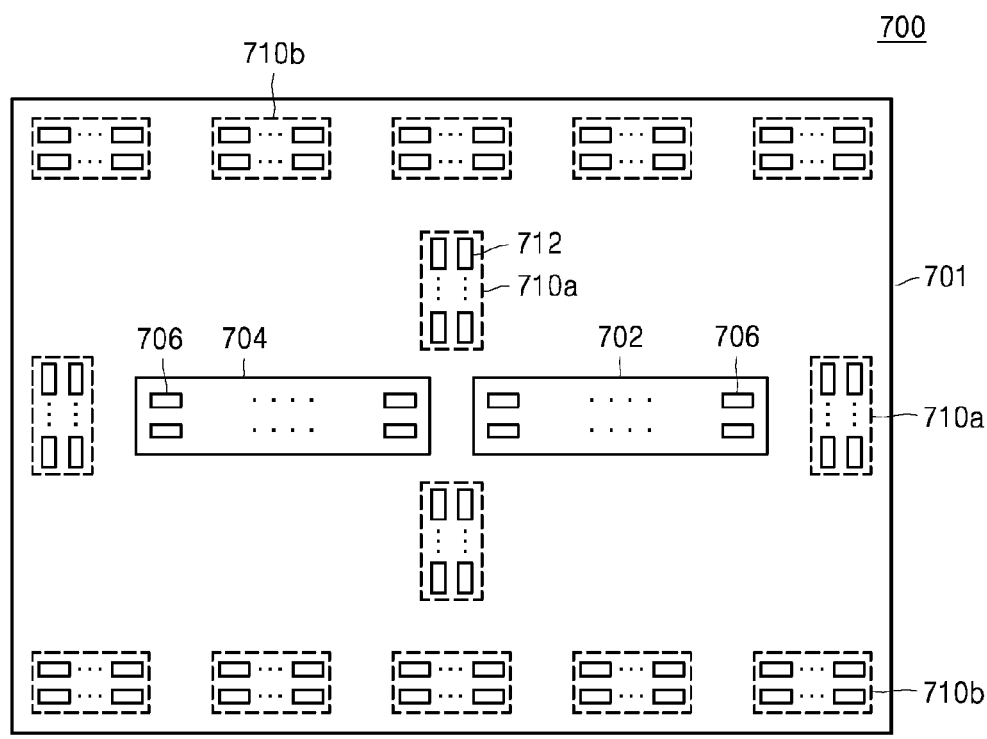
FIGS. 16 to 19 are plan views of unit chips used in chip-stacked semiconductor packages, according to some example embodiments.
Figure 17:
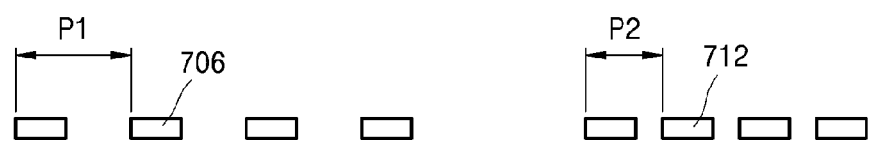

FIGS. 16 to 17 are plan views of a unit chip 700 used in chip-stacked semiconductor packages, according to some example embodiments.

For example, the unit chip 700 of FIG. 16 may be applied to the above-described semiconductor packages 1000 through 10001. Real connection portions 702 and 704 may be arranged on a center of a chip body 701 of the unit chip 700. There may be a plurality of real connection portions, which includes a first real connection portion 702 and a second real connection portion 704 separate from the first real connection portion 702t. Real bump pads 706 (or real bumps) may be arranged in the first and second real connection portions 702 and 704. For example, a plurality of real bump pads 706 may be provided in any of the real connection portions 702 and 704.

Dummy connection portions 710a and 710b may be arranged around the real connection portions 702 and 704. There may be a plurality of dummy connection portions, and the dummy connection portions may be separate from each other. The dummy connection portions may include a plurality of first dummy connection portions 710a, and a plurality of second dummy connection portions 710b. The first and second dummy connection portions 710a and 710b may be variously arranged. Some of the first dummy connection portions 710a and/or some of the second dummy connection portions 710b may be arranged on an edge or edges of the chip body 701. Dummy bump pads 712 (or dummy bumps) may be arranged in the first and second dummy connection portions 710a and 710b. For example, a plurality of dummy bump pads 712 may be provided in any of the dummy connection portions 710a and 710b.

The number of the real bump pads 706 (or real bumps) in the first and second real connection portions 702 and 704 may be greater than the number of the dummy bump pads 706 (or dummy bumps) in the dummy connection portions 710a and 710b. For example, thousands of real bump pads 706 (or real bumps) may exist in the real connection portions 702 and 704, and tens or hundreds of dummy bump pads 712 (or dummy bumps) may exist in the dummy connection portions 710a, 710b, 710c and 710d.

As shown in FIG. 17, a pitch between the dummy bump pads 712 may be smaller than a pitch P1 between the real bump pads 706. For example, the pitch P2 of dummy bump pads 712 may be smaller than half of the pitch P1 of the real bump pads 706 so that the dummy bumps formed on the dummy bump pads 712 can be naturally bridged to each other.

Figure 18:
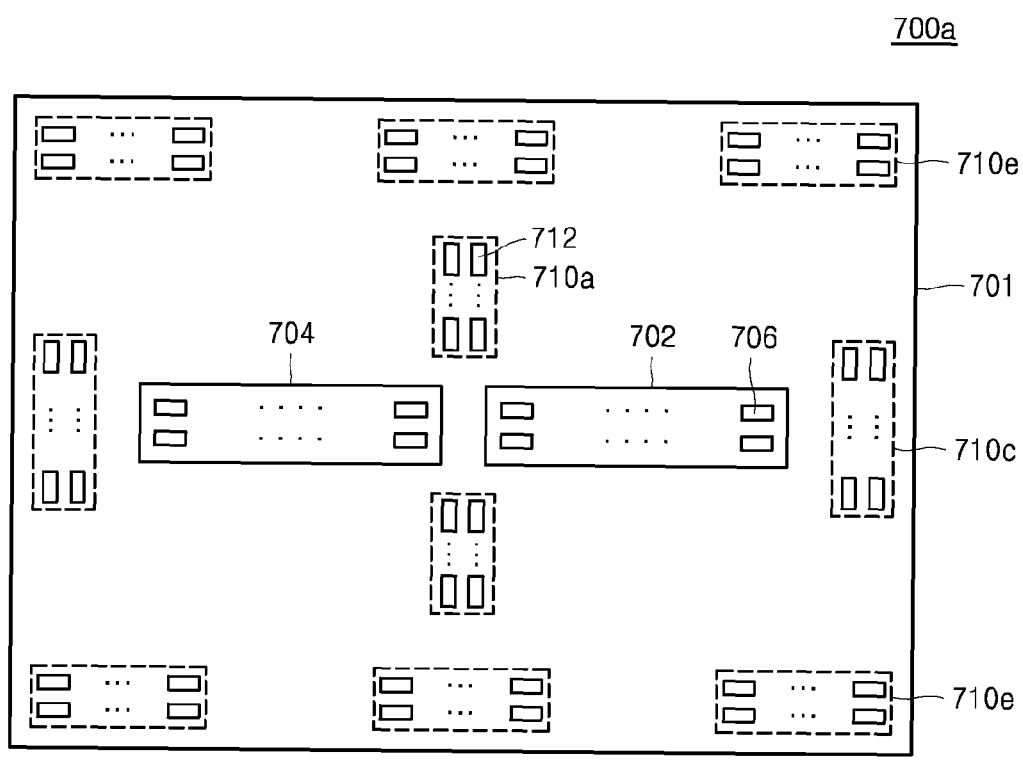
Figure 19:
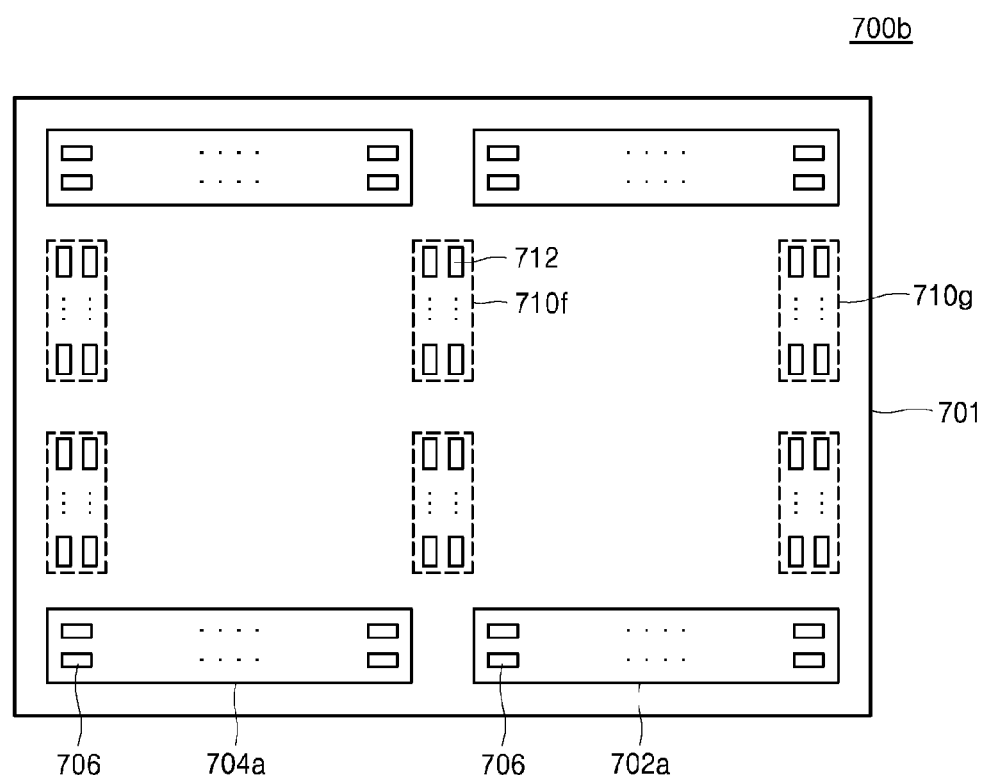

FIGS. 18 to 19 are plan views of unit chips 700a and 700b used in chip-stacked semiconductor packages, according to some example embodiments.

When the unit chip 700a of FIG. 18 is compared to the unit chip 700 of FIG. 16, the unit chip 700a of FIG. 18 and the unit chip 700 of FIG. 16 may be the same except for an arrangement of dummy connection portions 710a, 710c and 710e. When the unit chip 700b of FIG. 19 is compared to the unit chip 700 of FIG. 16, the unit chip 700b of FIG. 19 and the unit chip 700 of FIG. 16 may be the same except for arrangements of real connection portions 702a and 704a and dummy connection portions 710f and 710g. Accordingly, the descriptions which have been provided with reference to FIGS. 16 and 17 will be omitted or briefly provided for convenience.

In the unit chip 700a of FIG. 18, the dummy connection portions 710c and 710e of the chip body 701 may be larger than the dummy connection portion 710a. When the unit chip 700a of FIG. 18 is compared to the unit chip 700 of FIG. 16, the number of dummy connection portions 710e of FIG. 18 that are formed on an edge of the chip body 701 may be smaller than the number of dummy connection portions 710b of FIG. 16.

When the unit chip 700b of FIG. 19 is compared to the unit chip 700 of FIG. 16, the real connection portions 702a and 704a of FIG. 19 may be arranged on edges of the chip body 701. In the unit chip 700b, some of the dummy connection portions (e.g., dummy connection portion 710f) may be arranged on a center of the chip body 701. The dummy connection portions 710f and 710g of the chip body 701 may have a greater size than the dummy connection portion 710a of the unit chip 700 of FIG. 16. As described above, real connection portions and dummy connection portions on unit chips in chip-stacked semiconductor packages may have various arrangements.

Figure 20:
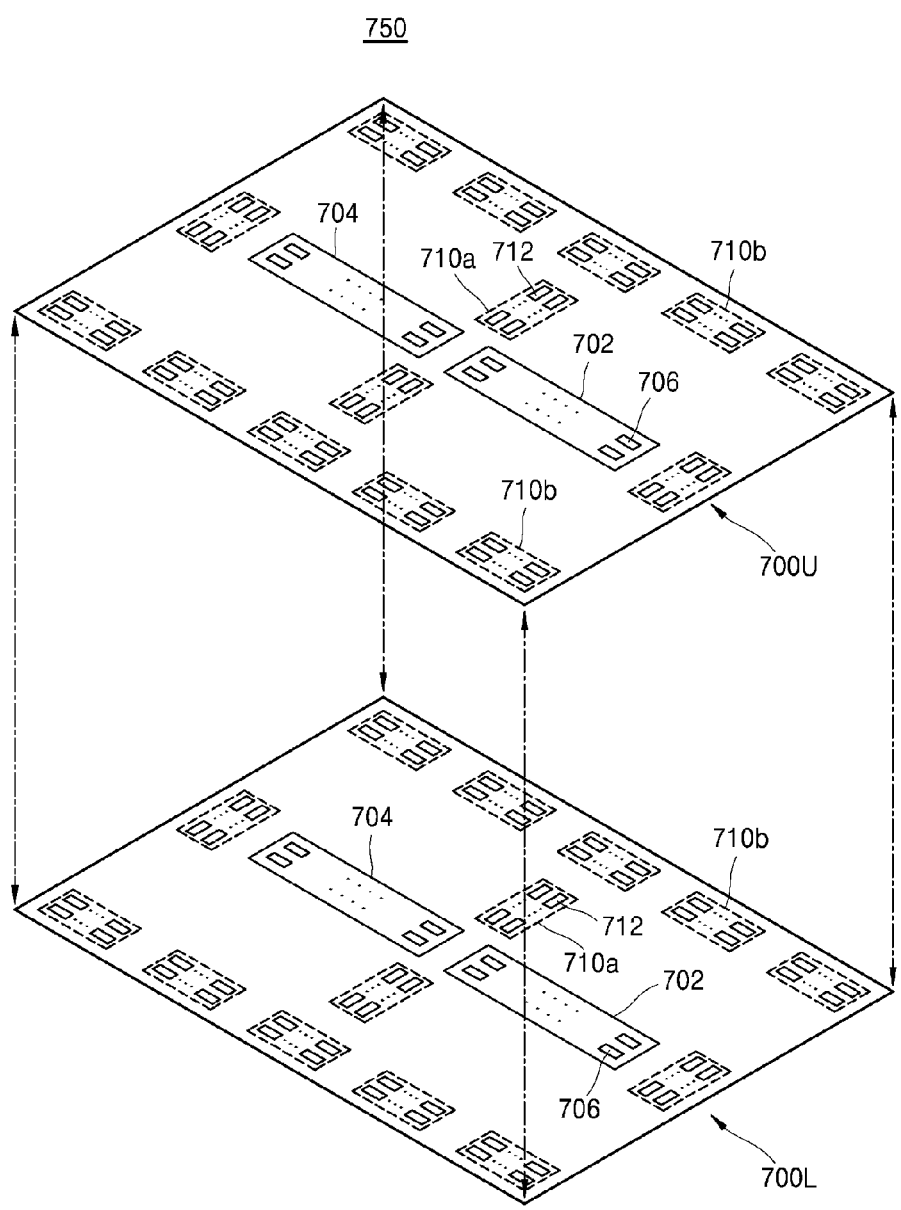
FIG. 20 is a perspective view of a chip stack structure of a chip-stacked semiconductor package according to an example embodiment.

FIG. 20 is a perspective view of a stack chip 750 of a chip stack structure according to an example embodiment, and FIGS. 21A to 22B are cross-sectional views showing stack and connection relationships between bump pads and bumps of FIG. 20.

For example, as shown in FIG. 20, the stack chip 750 may include an upper chip 700U stacked on a lower chip 700L. The unit chip 700 of FIG. 16 may be used as the lower chip 700L and the upper chip 700U for example. In the lower chip 700L and the upper chip 700U of FIG. 20, real bumps and dummy bumps are not shown for convenience. The descriptions which have been provided with reference to FIGS. 16 and 17 will be omitted or briefly provided for convenience of explanation of the lower chip 700L and the upper chip 700U. The lower chip 700L and the upper chip 700U may be stacked such that real connection portions 702 and 704 of the lower chip 700L and real connection portions 702 and 704 of the upper chip 700U may correspond to each other.

Figure 21A:
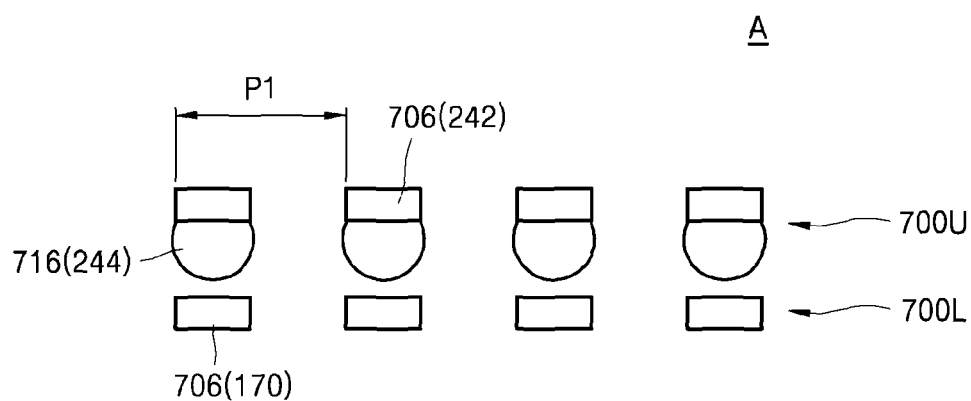
FIGS. 21A to 22B are cross-sectional views showing stack and connection relationships between bump pads and bumps of FIG. 20.
Figure 21B:
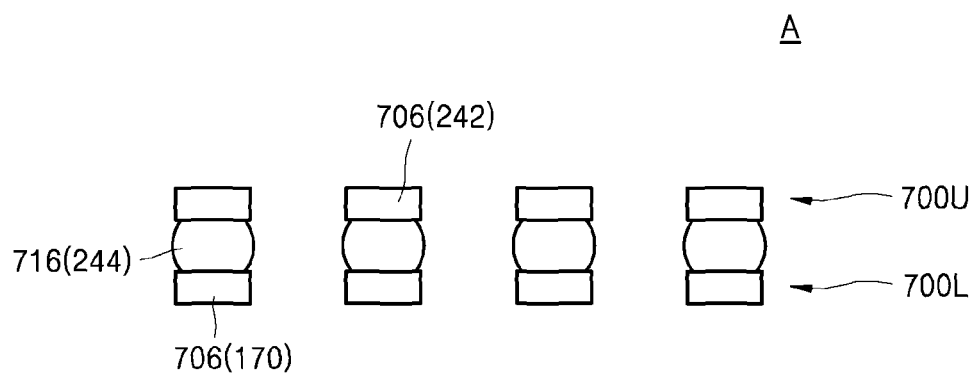

FIG. 21A is a cross-sectional view in which the lower chip 700L and the upper chip 700U are stacked but yet to be connected to each via the real connections portions 702 and 704 and A. FIG. 21B is a cross-sectional view in which the lower chip 700L and the upper chip 700U are stacked and connected to each other. As shown in FIGS. 21A to 22B, the real bump pads 706 (242 of FIG. 1) and the real bumps 716 (244 of FIG. 1) of the upper chip 700U may be electrically connected to the real bump pads 706 (170 of FIG. 1) of the lower chip 700L. As shown in FIG. 21B, the real bumps 716 (244 of FIG. 1) may be separate from and connected to each other.

Figure 22A:
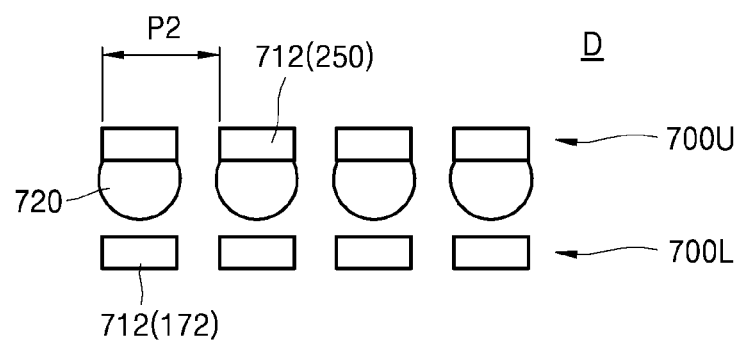
Figure 22B:
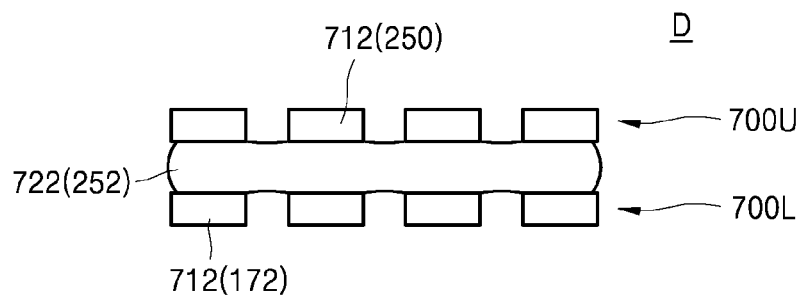

The lower chip 700L and the upper chip 700U may be stacked such that dummy connection portions 710a and 710b of the lower chip 700L and dummy connection portions 710a and 710b of the upper chip 700U may correspond to each other. FIG. 22A is a cross-sectional view in which the lower chip 700L and the upper chip 700U in the dummy connection portions 710a and 710b are not physically connected to each other. FIG. 22B is a cross-sectional view in which the lower chip 700L and the upper chip 700U are physically connected to each other in the dummy connection portions 710a and 710b. As shown in FIG. 22B, the dummy bump pads 712 (250 of FIG. 1) and the dummy bumps 720 of the upper chip 700U may be stacked on upper surfaces of the dummy bump pads 712 (172 of FIG. 1) of the lower chip 700L to form bridge dummy bumps 722 (252 of FIG. 1), which are formed by merging some of the dummy bumps 720 together.

The bridge dummy bumps 722 (252 of FIG. 1) may be connected to the dummy bump pads 712 (172 of FIG. 1). The bridge dummy bumps 722 (252 of FIG. 1) may be formed by designing a pitch P2 between the dummy bump pads 712 (250 of FIG. 1) to be smaller than a pitch P1 between the real bump pads 706 (242 of FIG. 1), For example, the pitch P2 between the dummy bump pads 712 may be half of the pitches P1 between the real bump pads 712 (250 of FIG. 1).

Following descriptions are a process in which the real bump pads 706 (242 of FIG. 1) and the real bumps 716 (244 of FIG. 1) of the upper chip 700U are electrically connected to the real bump pads 706 (170 of FIG. 1) of the lower chip 700L, and in which the dummy bump pads 712 (172 of FIG. 1) are connected to the bridge dummy bumps 722 (252 of FIG. 1).

For example, the real bumps 716 (244 of FIG. 1) of the upper chip 700U may be bonded to the real bump pads 706 (170 of FIG. 1) of the lower chip 700L through a thermocompression bonding process. Then, the dummy bumps 720 of the upper chip 700U may be bonded to the dummy bump pads 712 (172 of FIG. 1) of the lower chip 700L. According to some example embodiments, the dummy bumps 720 may be combined with the dummy bump pads 712, while some of the dummy bumps are merged together, thereby forming the bridge dummy bumps 722.

Further, by performing a reflow process, the real bumps 716 (244 of FIG. 1) of the upper chip 700U may be electrically connected to the real bump pads 706 (170 of FIG. 1) of the lower chip 700L, and the dummy bump pads 712 (172 of FIG. 1) of the lower chip 700L are physically integrated with and connected to the bridge dummy bumps 722 (252 of FIG. 1) of the upper chip 700U.

The reflow process may be performed at a temperature ranging from about 200° C. to about 300° C. After the lower chip 700L and the upper chip 700U are stacked, the bridge dummy bumps 722 may be formed by performing the thermo-compression bonding process and the reflow process.

FIGS. 23 to 31 are cross-sectional views of a method of manufacturing a chip-stacked semiconductor package, according to an example embodiment.

In FIGS. 23 to 31, reference numbers of components of a chip may be similar to or the same as components of chips of FIGS. 1 to 13, and thus the descriptions which have been provided will be omitted or briefly provided for convenience. The method of manufacturing the chip-stacked semiconductor package of FIGS. 23 to 31 relate to a method of manufacturing s chip-on-chip (COC) package in which a chip is stacked on another chip.

Figure 23:
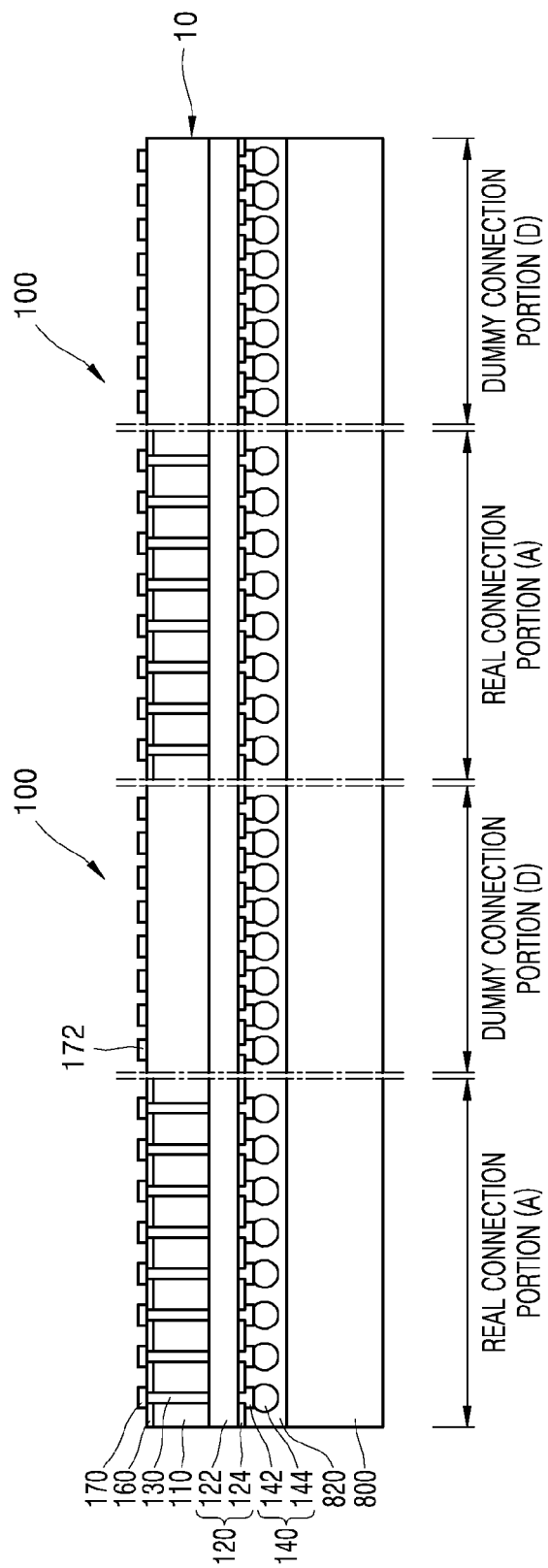
FIGS. 23 to 31 are cross-sectional views of a method of manufacturing a chip-stacked semiconductor package, according to an example embodiment.

Referring to FIG. 23, a base wafer 10 including multiple chips 100 which includes real connection portions A and dummy connection portions D may be prepared. The base wafer 10 may be bonded to a supporting carrier 800 via a bonding member 820.

The supporting carrier 800 may be formed of, for example, a silicon substrate, a germanium substrate, a silicon-germanium substrate, a gallium-arsenic (GaAs) substrate, a glass substrate, a plastic substrate, or a ceramic substrate. The bonding member 820 may be formed of, for example, a non-conductive film (NCF), an anisotropic conductive film (ACF), an instant adhesive, a thermosetting adhesive, a laser hardening adhesive, an ultrasound hardening adhesive, or a non-conductive paste (NCP). The base wafer 10 may be bonded to face first connection members 140 by the supporting carrier 800.

One of the multiple chips 100 that is formed on the base wafer 10 may include real connection portions A and dummy connection portions D. In the real connection portions A, first real through silicon vias 130 and first real bump pads 170 may be formed. First dummy bump pads 172 may be formed in the dummy connection portions D.

Figure 24:
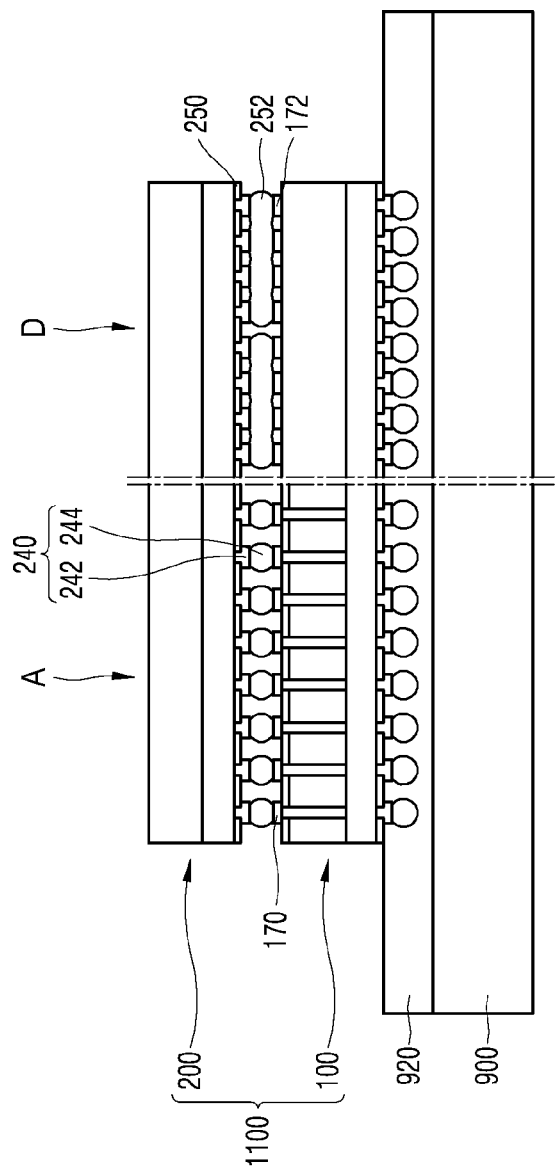

Referring to FIG. 24, the base wafer 10 may be sawed and be separated into respective chips. Each chip may correspond to the first chip 100 of the chip-stacked semiconductor package of FIG. 1. Hereinafter, the chips separated from the base wafer 10 may be referred to as "the first chip" or "the first chips" for convenience. After the first chips 100 are separated into individual first chips from the base wafer 10, the supporting carrier 800 and the bonding member 820 may be removed.

Each of the separated first chips 100 may be bonded to a supporting carrier 900 using a bonding member 920. The first chips 100 may be bonded to the supporting carrier 900 such that the first connection members 140 of the first chip 100 face the supporting carrier 900. The supporting carrier 900 may be formed of, for example, a silicon substrate, a germanium substrate, a silicon-germanium substrate, a GaAs substrate, a glass substrate, a plastic substrate, or a ceramic substrate. In the present example embodiment, the supporting carrier 900 may be formed of, for example, a silicon substrate or a glass substrate. The bonding member 920 may be formed of the same materials as the bonding member 820.

A chip stack structure 1100 may be formed by stacking a second chip 200 on an upper surface of the first chip 100. The second chip 200 may be acquired by separating any one of base wafers, and real through silicon vias may not be formed in the second chip 200. According to some example embodiments, real through silicon vias may be formed in the second chip 200. For example, the first chip 100 and the second chip 200 may be separated from the same base wafer.

In the chip stack structure 1100, first real bumps 244 forming second, which constitutes connection members 240 of the real connection portions A of the second chip 200, may be connected to real bump pads 170 of the first chip 100. First bridge dummy bumps 252 of the dummy connection portions D may be connected to dummy bump pads 172 of the first chip 100 by performing a thermo-compression bonding process and/or a reflow process.

That is, the first real bumps 244 may be stacked on and connected to the real bump pads 170 of the first chip 100 by performing the thermo-compression bonding process. Furthermore, the first bridge dummy bumps 252 of the second chip 200 may be stacked on and connected to the dummy bump pads 172 of the first chip 100. When the first bridge dummy bumps 252 are formed, slipping of the first chip and/or the second chip 200, while moving the chip stack structure to a subsequent reflow process, may be mitigated or prevented.

Then, by performing the reflow process, the real bump pads 170 of the first chip 100 may be electrically connected to the first real bumps 244 of the second chip 200, and the dummy bump pads 172 of the first chip 100 and the first bridge dummy bumps 252 of the second chip 200 may be physically integrated and/or connected. The reflow process may be performed at a temperature ranging from about 200 to about 300° C.

By performing the thermo-compression bonding process and the reflow process, the second chip 200 may be stacked on the first chip 100 and due to the first bridge dummy bumps 252, the occurrence of slips between the first and second chips 100 and 200 and/or chip warpage may be mitigated or prevented. Further, the real bump pads 170 of the first chip 100 and the real bumps 244 of the second chip 200 may be connected to each other more effectively.

Figure 25:
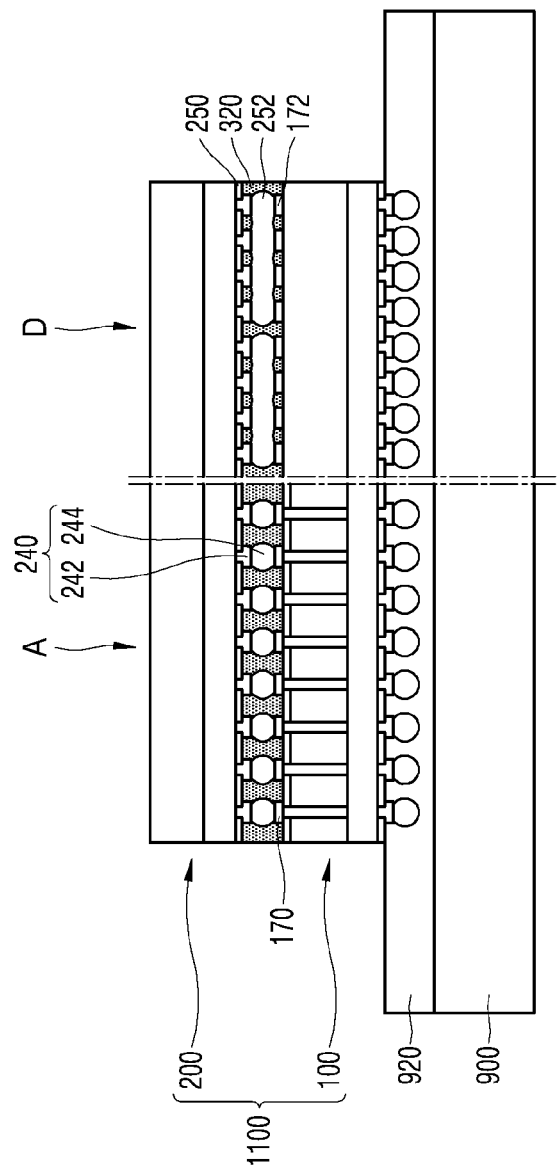

Referring to FIG. 25, an underfill 320, which fill a gap between the first chip 100 and the second chip 200 of the chip stack structure 1100, may be formed. The gap refers to an area or space between the first chip 100 and the second chip 200 at which the first chip 100 and the second chip 200 are connected to each other. The underfill 320 may only fill the gap between the first chip 100 and the second chip 200. For example, the underfill 320 may fill the gap between the first chip 100 and the second chip 200 and may cover sides of the first chip 100. Various shapes of the underfill 320 are already described, and thus, descriptions thereof will be omitted.

Figure 31:
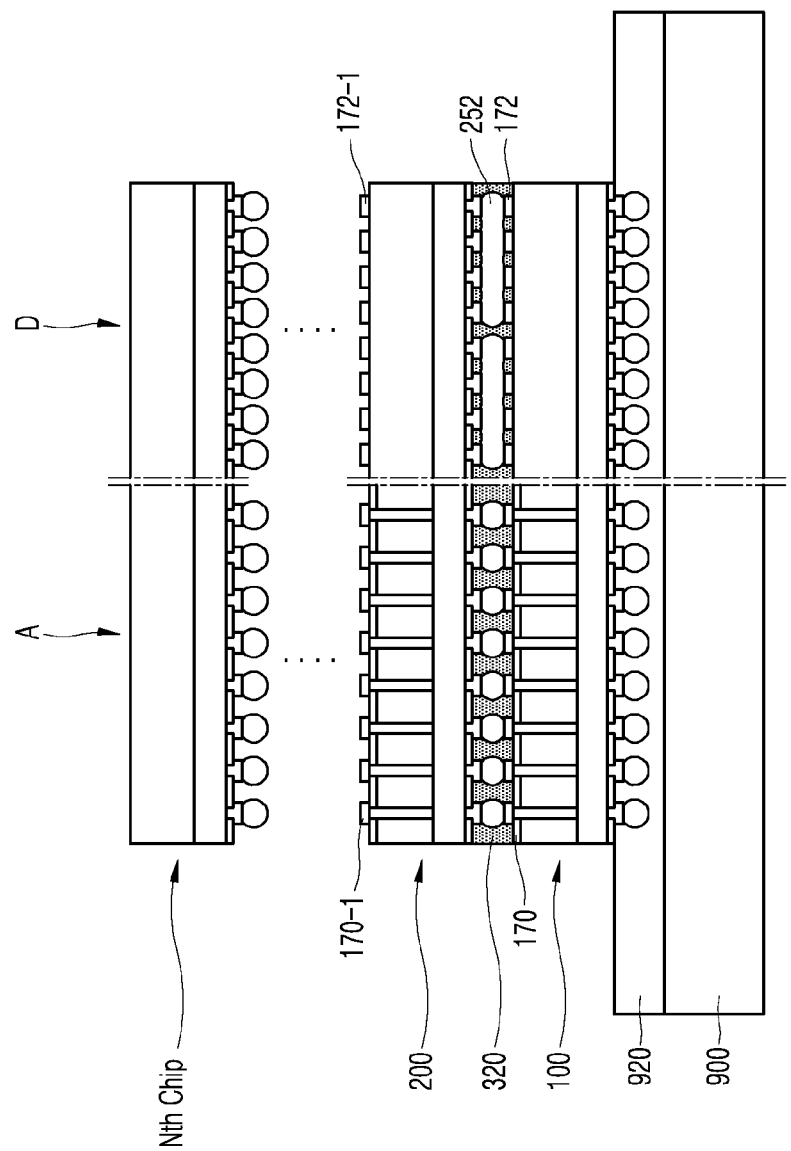

In FIG. 31, the number of chips stacked on the first chip 100 is N, for example, three. As shown in FIG. 31, real bump pads 170-1 and dummy bump pads 172-1 may be arranged in the second chip 200. A third chip may be stacked on the second chip 200 and may form a chip stack structure. Through silicon vias may not be formed in an uppermost chip (e.g., an $N^{th}$ chip).

Figure 26:
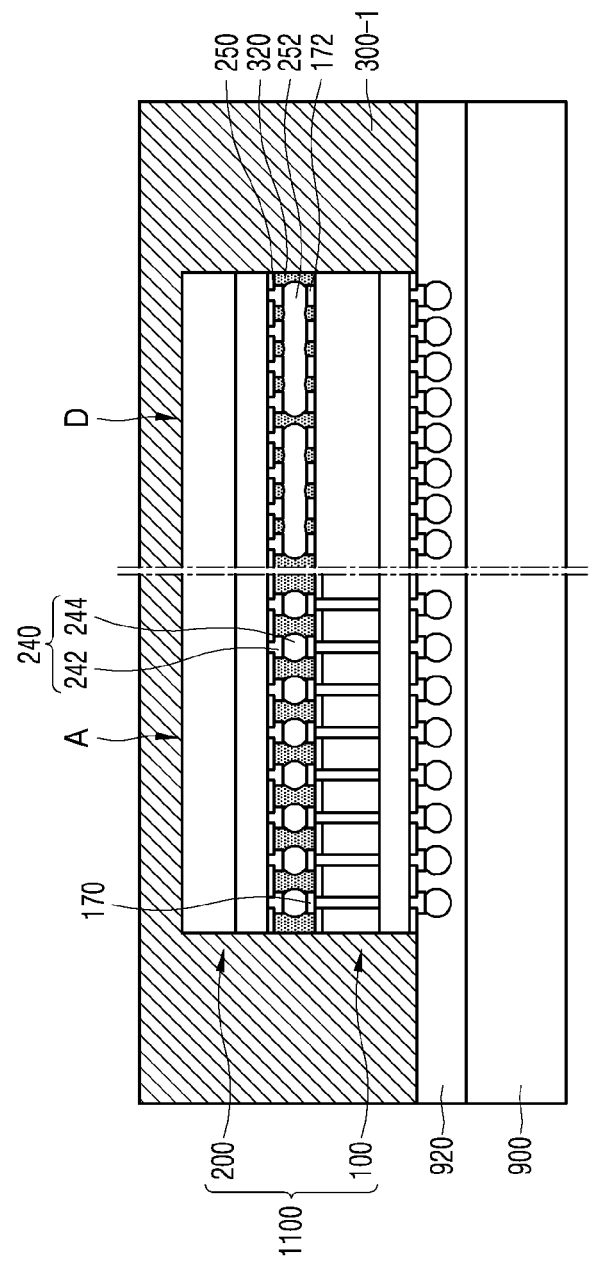

Referring to FIG. 26, a molding member 300-1 which seals the chip stack structure 1100 on the supporting carrier 900 may be formed. The molding member 300-1 may mold sides and upper surfaces of the second chip 200 and sides of the first chip 100.

Figure 27:
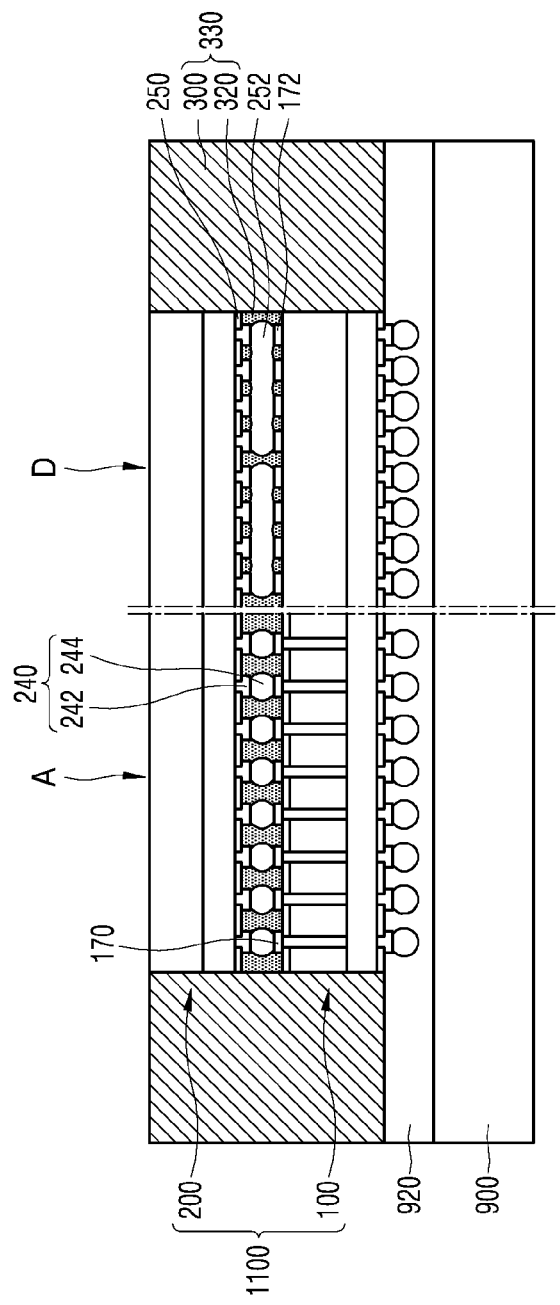

As shown in FIG. 27, an upper surface of the molding member 300-1 as shown in FIG. 27 may be grinded to expose the upper surface of the second chip 200. Accordingly, a molding member 300 exposing the upper surface of the second chip 200 and the underfill 320 may form the sealing member 330. When the second chip 200 is stacked on the first chip 100 in a flip chip manner and the through silicon vias are not formed in the second chip 200, the upper surface of the second chip 200 may be a second surface of a semiconductor substrate, on which an integrated circuit layer is not formed, thereby exposing silicon in the second surface of the semiconductor substrate to the outside.

The above grinding process may be performed to reduce the thickness of a final chip semiconductor package. However, example embodiments of the present inventive concepts are not limited thereto. In some cases, the grinding process may not be performed. According to some example embodiments, when a grinding process is performed, the grinding process may be performed such that the upper surface of the second chip 200 is not exposed to the outside.

Figure 28:
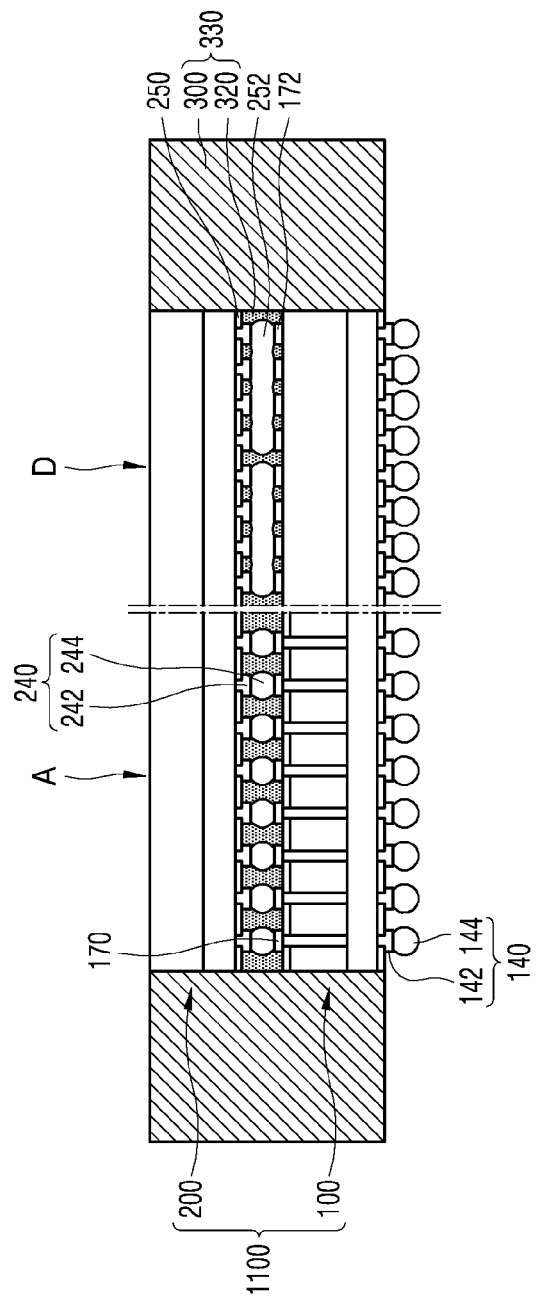

Referring to FIG. 28, the supporting carrier 900 and the bonding member 920 may be removed from the chip stack structure 1100 to separate the chip stack structure 1100. Thus, the first connection members 140 of the first chip 100 of the chip stack structure 1100 may be exposed to the outside. A lower surface of the sealing member 330 may be at a same level as the lower surface of the first chip 100. Accordingly, the first connection members 140 of the first chip 100 may protrude from the chip stack structure 1100 in a direction perpendicular to the lower surface of the first chip 100.

Figure 29:
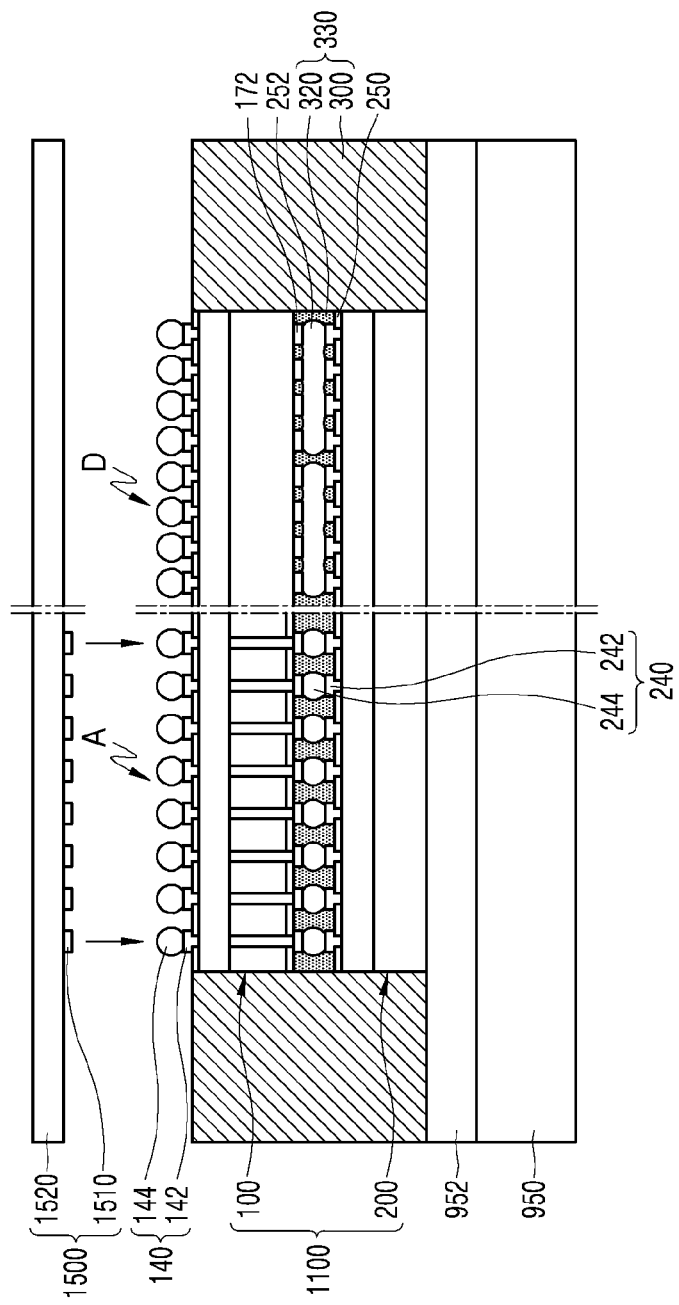

As shown in FIG. 29, a supporting carrier 950 may be bonded to a second surface of the chip stack structure 1100 using a bonding member 952. The first surface is a surface of the chip stack structure 1100 on which the first connection members 140 of the first chip 100 are exposed. The second surface is a surface of the chip stack structure 1100 that is opposite to the first surface. The supporting carrier 950 may be formed of, for example, a silicon substrate, a germanium substrate, a silicon-germanium substrate, a GaAs substrate, a glass substrate, a plastic substrate, or a ceramic substrate. The bonding member 952 may be formed of, for example, an NCF, an ACF, an instant adhesive, a thermosetting adhesive, a laser hardening adhesive, an ultrasound hardening adhesive, or an NCP. In the present example embodiment, the supporting carrier 950 may be formed of, for example, a glass substrate, and the bonding member 952 may be formed of, for example, an ultraviolet (UV) film.

By using the supporting carrier 950, an electrical die sorting (EDS) test may be conducted for each chip in the chip stack structure 1100. The EDS test may be conducted using, for example, a probe card 1500. The probe card 1500 may include a body portion 1520 and terminal pins 1510. The terminal pins 1510 may be, for example, pogo pins. The pogo pins may contact the first connection members 140 of the real connection portion A, and electrical signals may be applied to the first connection members 140. Thus, the EDS test may be conducted.

A determination as to whether the chip stack structure 1100 is defective may be made based on the EDS test. A defective chip stack structure or a defective chip-stacked semiconductor package may be disused. Accordingly, the chip-stacked semiconductor package according to some example embodiments may be a stack package in which chips passing the EDS test are stacked.

Figure 30:
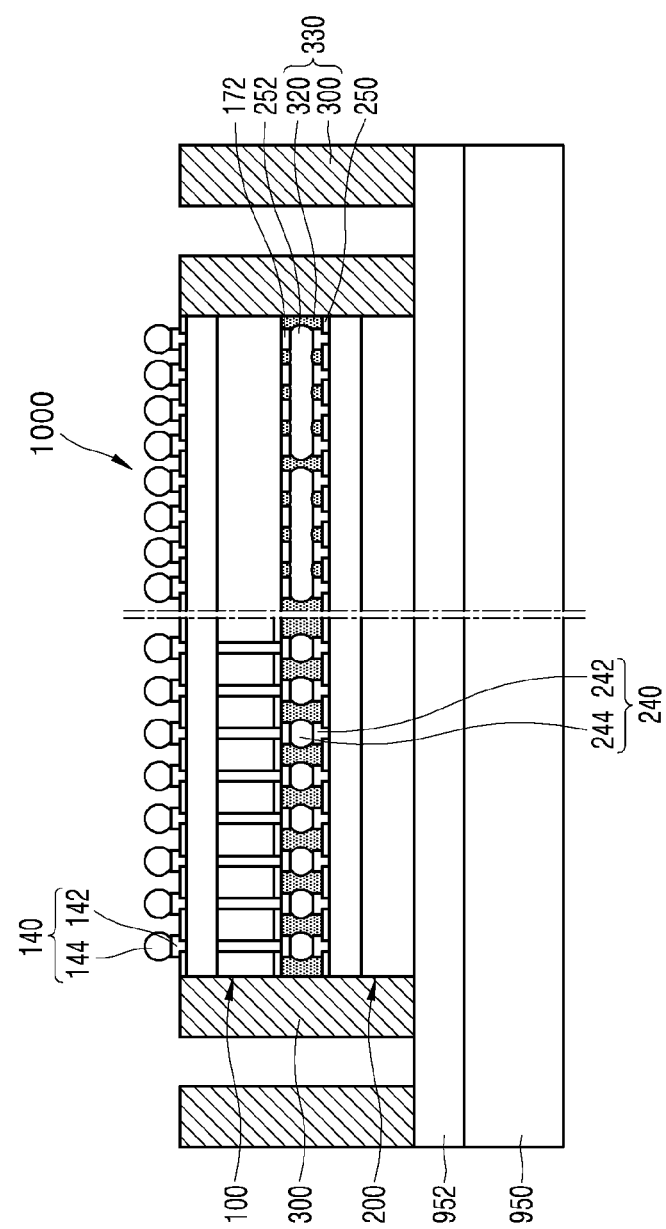

Referring to FIG. 30, after the EDS test is conducted, the sealing member 330 of the chip stack structure 1100 is sawed to separate individual chip-stacked semiconductor package 1000. Sawing may be performed only with respect to the sealing member 330. A portion of the bonding member 952 may be sawed or removed while sawing the sealing member 330. The chip-stacked semiconductor package 1000 is completed when the supporting carrier 950 and the bonding member 952 are removed.

FIGS. 32 to 42 are cross-sectional views of a method of manufacturing a chip-stacked semiconductor package, according to another example embodiment.

In FIGS. 32 to 42, the reference numerals of the components of the chips may be the same as or similar to the components of the chips of FIGS. 1 to 13. Thus, the descriptions which have been provided will be omitted or briefly provided for convenience. The method of manufacturing the chip-stacked semiconductor package of FIGS. 32 to 42 relate to a chip-on-wafer (COW) method in which chips are stacked on a wafer.

Figure 32:
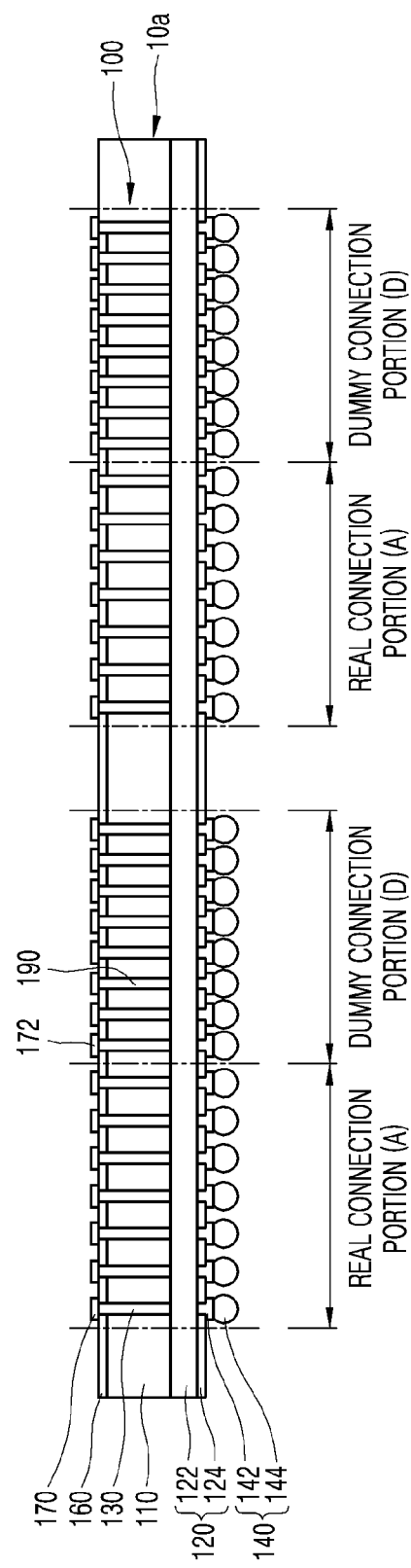
FIGS. 32 to 42 are cross-sectional views of a method of manufacturing a chip-stacked semiconductor package, according to another example embodiment.

Referring to FIG. 32, a base wafer 10a including multiple chips 100 may be prepared. In the multiple chips, real through silicon vias 130 of real connection portions A and dummy through silicon vias 190 of dummy connection portions D may be formed. The chips 100 including the real through silicon vias 130 and the dummy through silicon vias 190 may be simultaneously formed in a wafer level.

Figure 33:
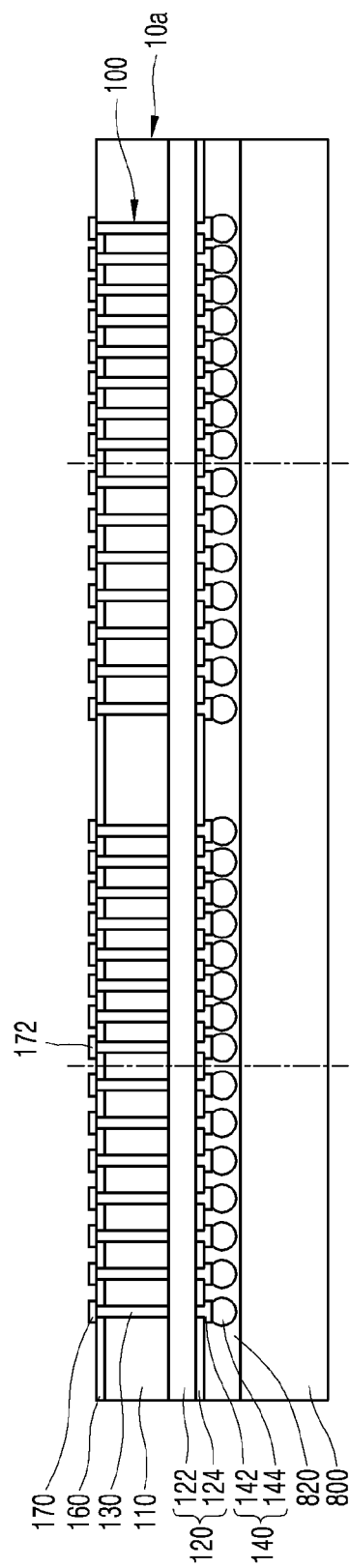

As shown in FIG. 33, the base wafer 10a may be bonded to the supporting carrier 800 using the bonding member 820. The base wafer 10a may be bonded to the supporting carrier 800 so that the first connection members 140 face the supporting carrier 800.

Figure 34:
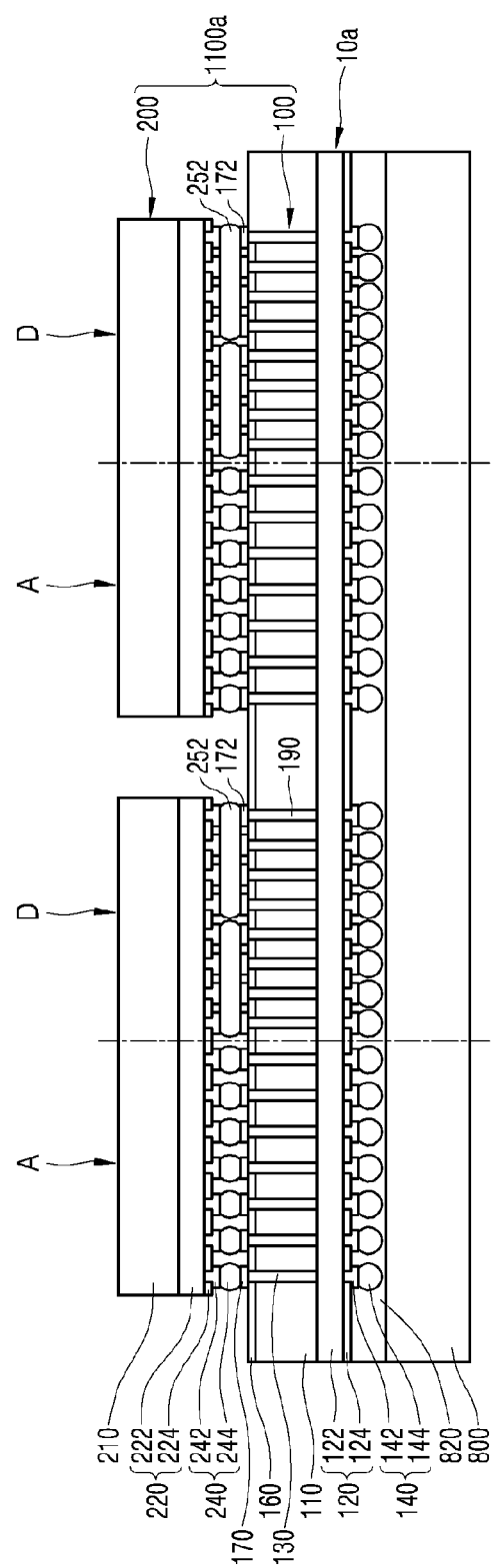
Figure 35:
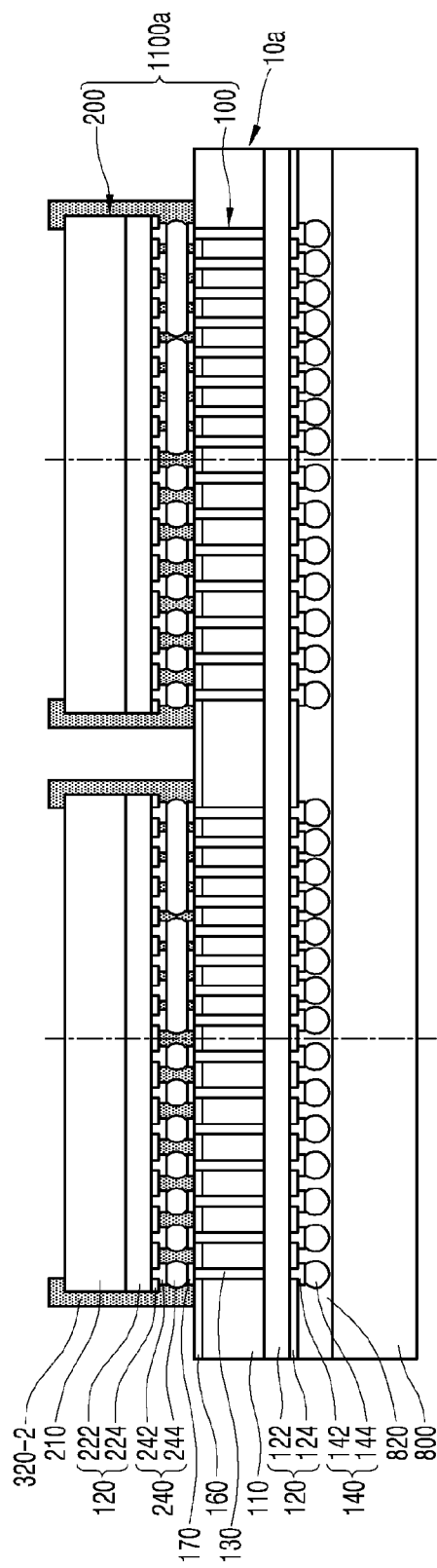

Referring to FIG. 34, the second chips 200 may be prepared. The second chips 200 may be acquired by cutting a base wafer such as the base wafer 10a of the FIG. 32. Through silicon vias may not be formed in the second chips 200. However, example embodiments of the present inventive concepts are not limited thereto. Through silicon vias may be formed in the second chips 200. Each second chip 200 may include a chip body 210, a lower insulating layer 220, and second connection members 240.

The second chips 200 may be respectively stacked on upper surfaces of the first chips 100 to form a chip stack structure 1100a. Accordingly, the chips 100 formed on the base wafer 10 may be referred to as first chips. In the chip stack structure 1100a, first real bumps 244 forming the second connection members 240 of real connection portions A of the second chip 200 may be connected to real bump pads 170 of the first chips 100, and first bridge dummy bumps 252 of the dummy connection portions D may be connected to dummy bump pads 172 of the first chips 100 by performing a thermo-compression bonding process and/or a reflow process. A connection method is already described above with reference to FIG. 24. Thus, descriptions thereof will be omitted.

Referring to FIGS. 35 to 42, an underfill 320-2, which fills a gap between the first chip 100 and the second chip 200 of the chip stack structure 1100a, may be formed. The gap may refer to an area or space at which the first chip 100 and the second chip 200 of the chip stack structure 1100a are connected. The underfill 320-2 may fill a gap between the first chip 100 and the second chip 200 and also may cover sides of the second chip 200. Various shapes of the underfill 320-2 are already described, and thus the descriptions thereof will be omitted.

Figure 42:
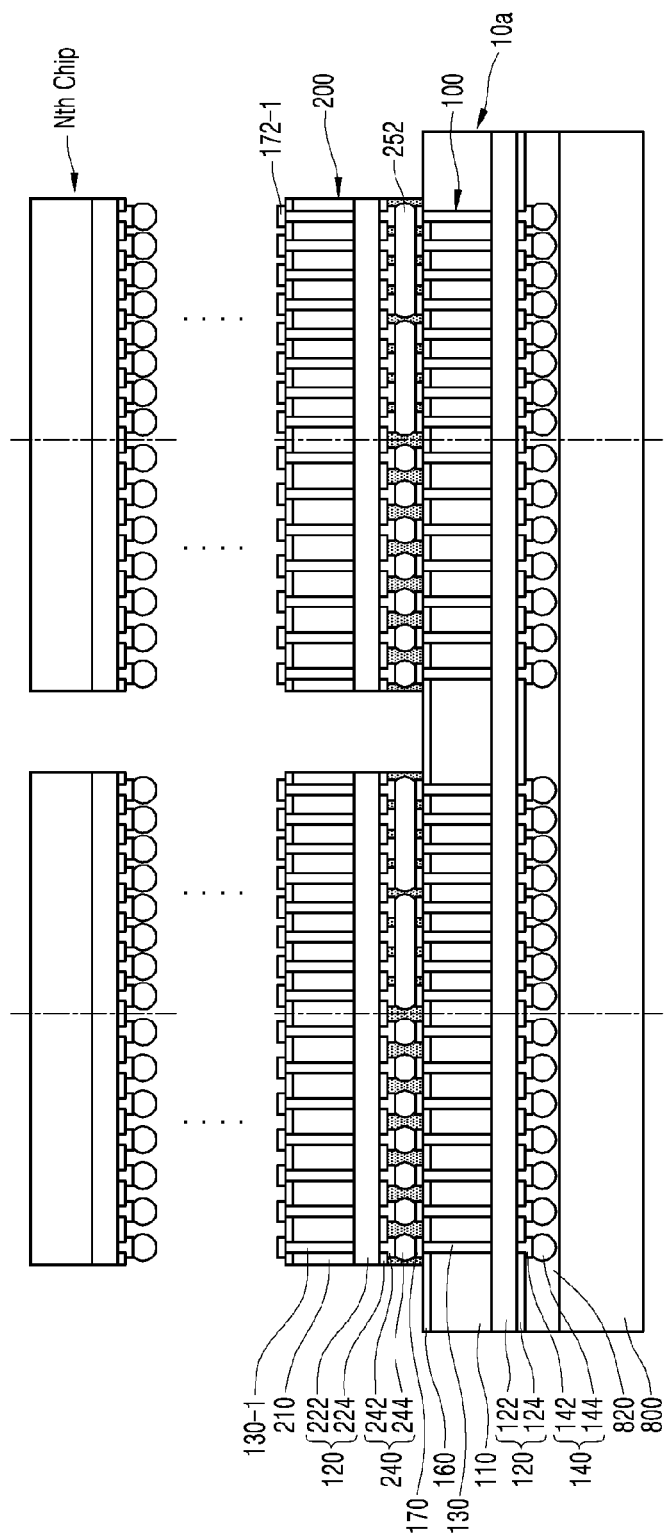

In FIG. 42, the number of chips stacked on the first chip 100 may be N, for example, three. As shown in FIG. 42, the real bump pads 170-1 and the dummy bump pads 172-1 may be arranged on the second chip 200. The third chip may be stacked on the second chip 200 and may form a chip stack structure. Through silicon vias may not be formed in an uppermost chip, for example, an $N^{th}$ chip.

Figure 36:
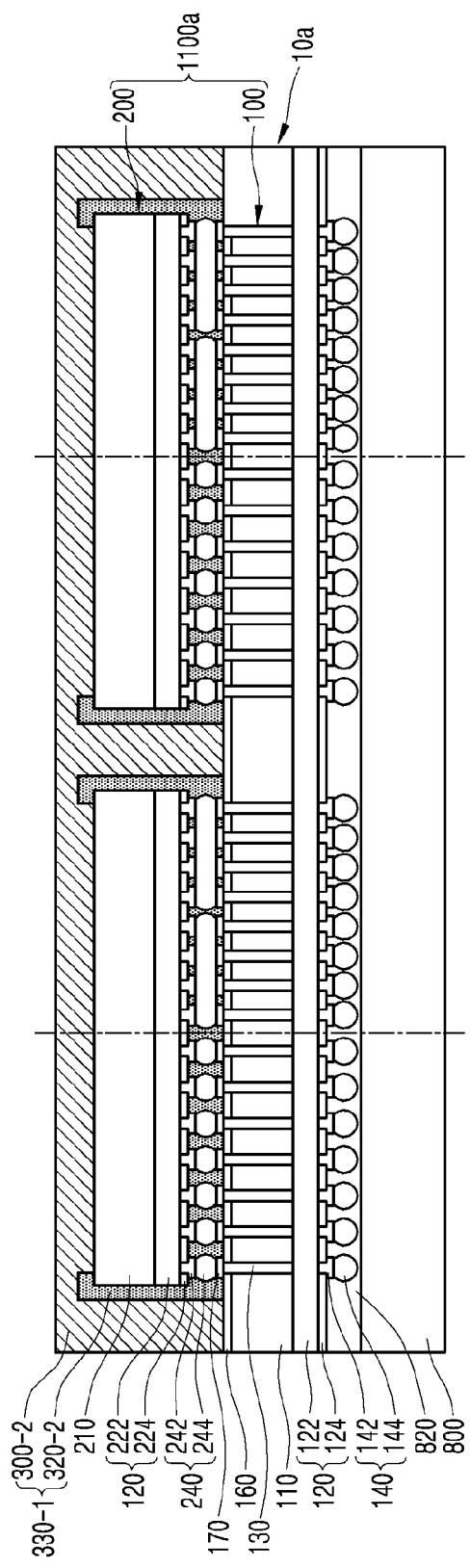

Referring to FIG. 36, a molding member 300-2 which molds chip stack structures 1100a bonded to the supporting carrier 800 may be formed. The molding member 300-2 may be formed of a polymer, for example, resin. For example, the molding member 300-2 may be formed of epoxy molding compound (EMC). Accordingly, the chip stack structures 1100a may include a sealing member 330-1, which includes the underfill 320-2 and the molding member 300-2. The sealing member 330-1 may seal sides of the first chip 100, and sides and upper surface of the second chip 200 of each chip stack structure 1100*a*. Due to the underfill 320-2, the molding member 300-2 may seal sides of the underfill 320-2.

Figure 37:
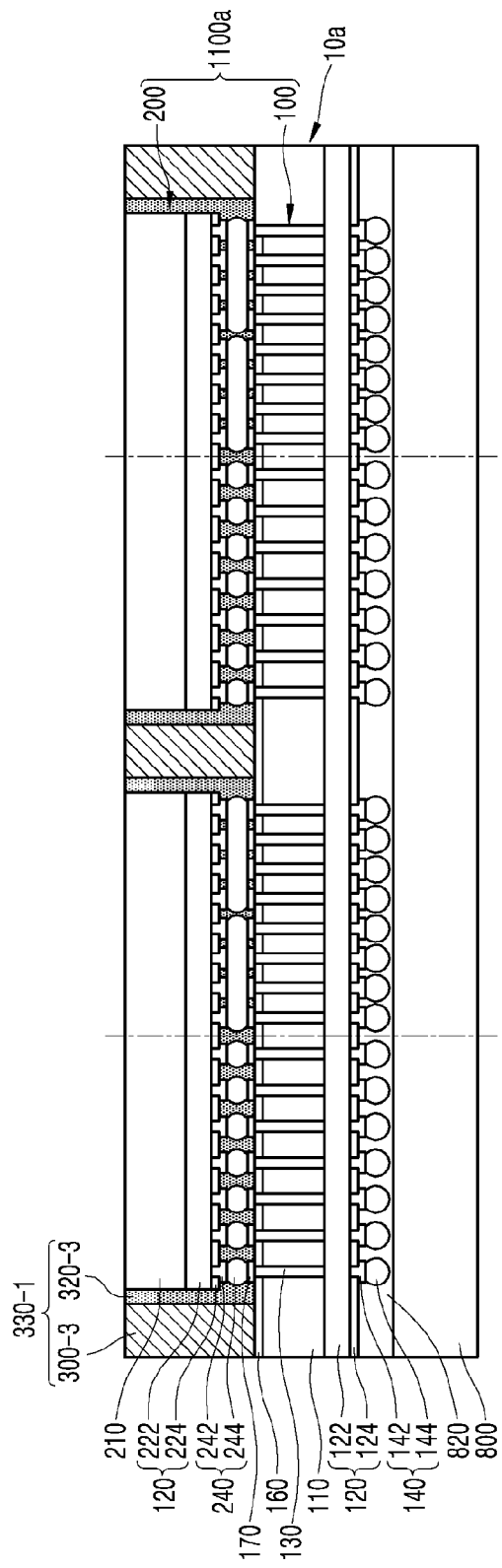

Referring to FIG. 37, an upper surface of the sealing member 330-1 may be grinded to expose the upper surface of the second chip of each chip stack structure 1100*a*. The upper surface of the sealing member 330-1 may be at a same level as the upper surface of the second chip 200. When the through silicon vias are not formed in the second chip 200 and the second chip is stacked on the first chip 100 in a flip chip manner, the upper surface of the second chip 200 may be a second surface of a semiconductor substrate (e.g., a silicon substrate) on which an integrated circuit layer is not formed. Accordingly, silicon of the second surface of the semiconductor substrate may be exposed to the outside.

When the upper surface of the sealing member 330-1 is grinded, that is, the upper surface of the second chip 200 may exposed. When a chip-stacked semiconductor package to be completed later is mounted and molded on a board substrate, the molding member may be well connected and bonded to the upper surface of the second chip 200.

Figure 38:
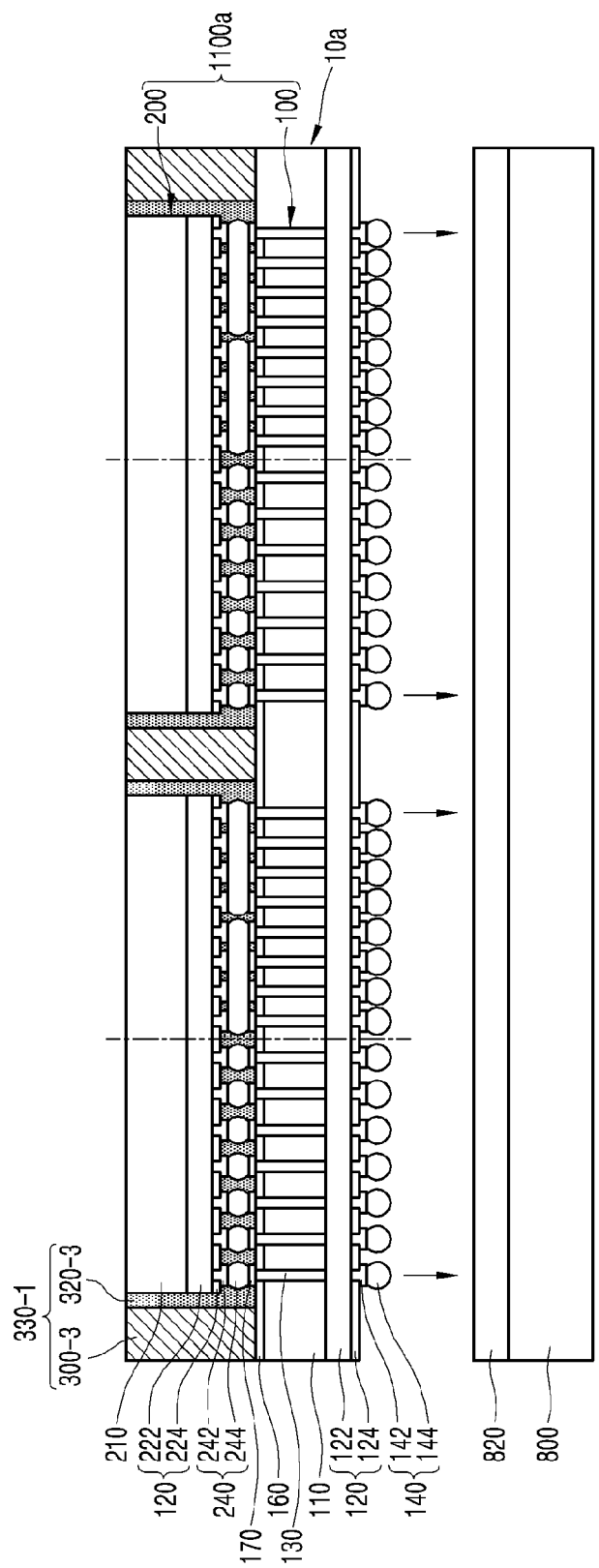

Referring to FIG. 38, the supporting carrier 800 may be separated from the base wafer 10*a*, and the bonding member 820 may be removed from the base wafer 10*a*. Thus, the first connection members 140 of the first chip 100 of each chip stack structure 1100*a* may be exposed to the outside.

Figure 39:
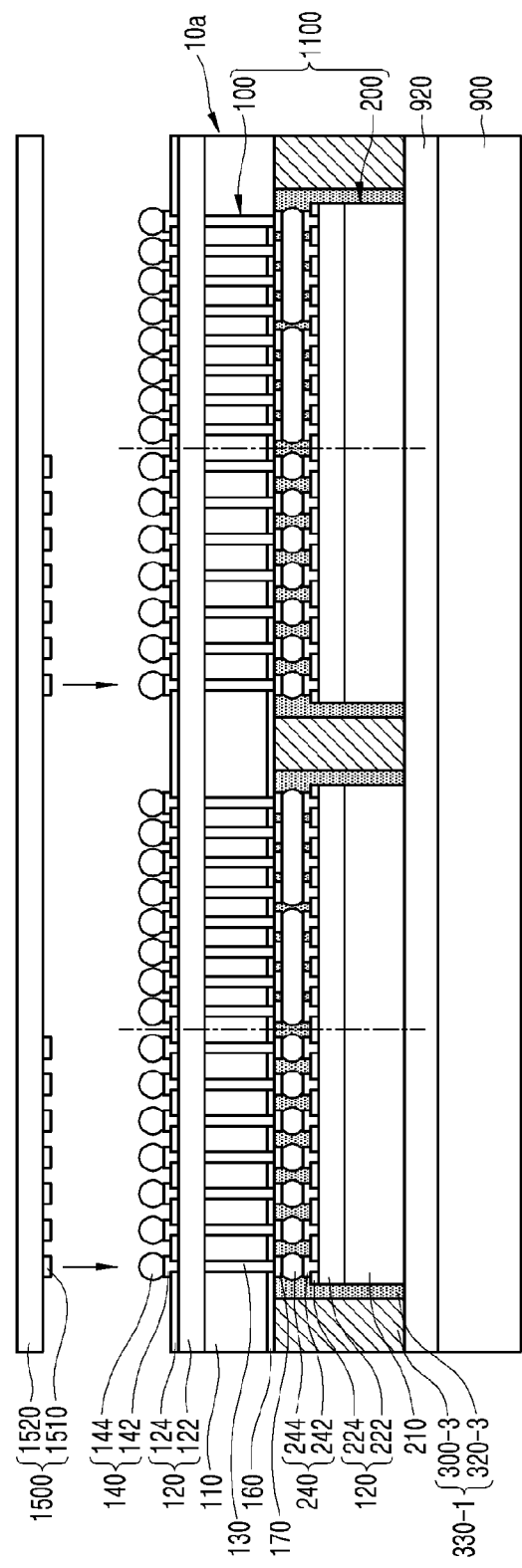

As shown in FIG. 39, after the base wafer 10*a* to which the chip stack structures 1100*a* are formed is flipped, the supporting carrier 900 may be bonded to the base wafer 10*a*. The supporting carrier 900 may be bonded, using the bonding member 920, to a second surface of the second chip 200 which faces a first surface on which the first connection members 140 of the first chip 100 are exposed. The supporting carrier 900 may be formed of, for example, a silicon substrate, a germanium substrate, a silicon-germanium substrate, a GaAs substrate, a glass substrate, a plastic substrate, or a ceramic substrate, and the bonding member 952 may be formed of, for example, an NCF, an ACF, a UV film, an instant adhesive, a thermosetting adhesive, a laser hardening adhesive, an ultrasound hardening adhesive, or an NCP. In the present example embodiment, the supporting carrier 900 may be formed of a glass substrate, and the bonding member 920 may be formed of a UV film.

By using the supporting carrier 900, an EDS test may be conducted for each chip stack structure 1100*a*. The EDS test may be conducted using, for example, the probe card 1500. The probe card 1500 may include the body portion 1520 and the terminal pins 1510. The terminal pins 1510 may be, for example, pogo pins. The pogo pins may contact the corresponding first connection members 140, and electrical signals may be applied to the first connection members 140. Thus, the EDS test may be conducted.

A determination as to whether the chip stack structures 1100*a* are defective may be made based on the outcome of the EDS test. Among the chip stack structures 1100*a*, a defective one may be disused. Thus, the chip-stacked semiconductor package according to the present example embodiment may be a stack package in which chips passing the EDS test are stacked.

Figure 40:
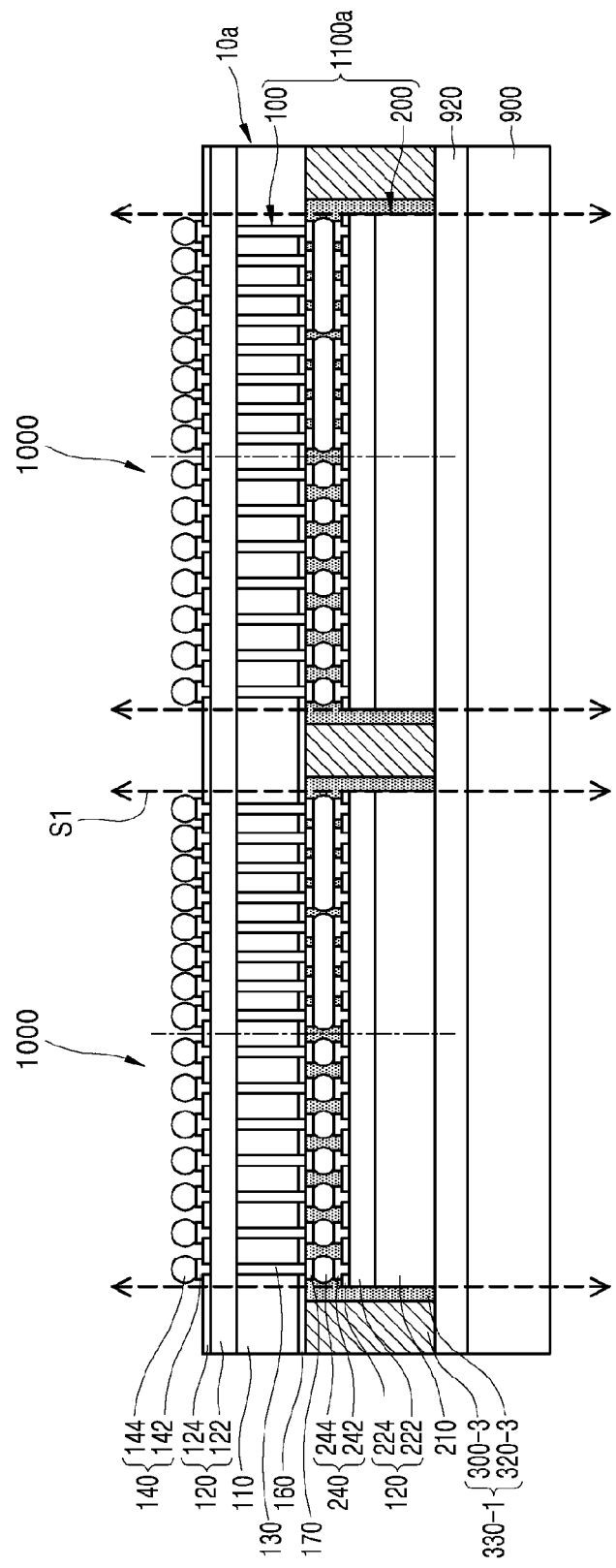
Figure 41:
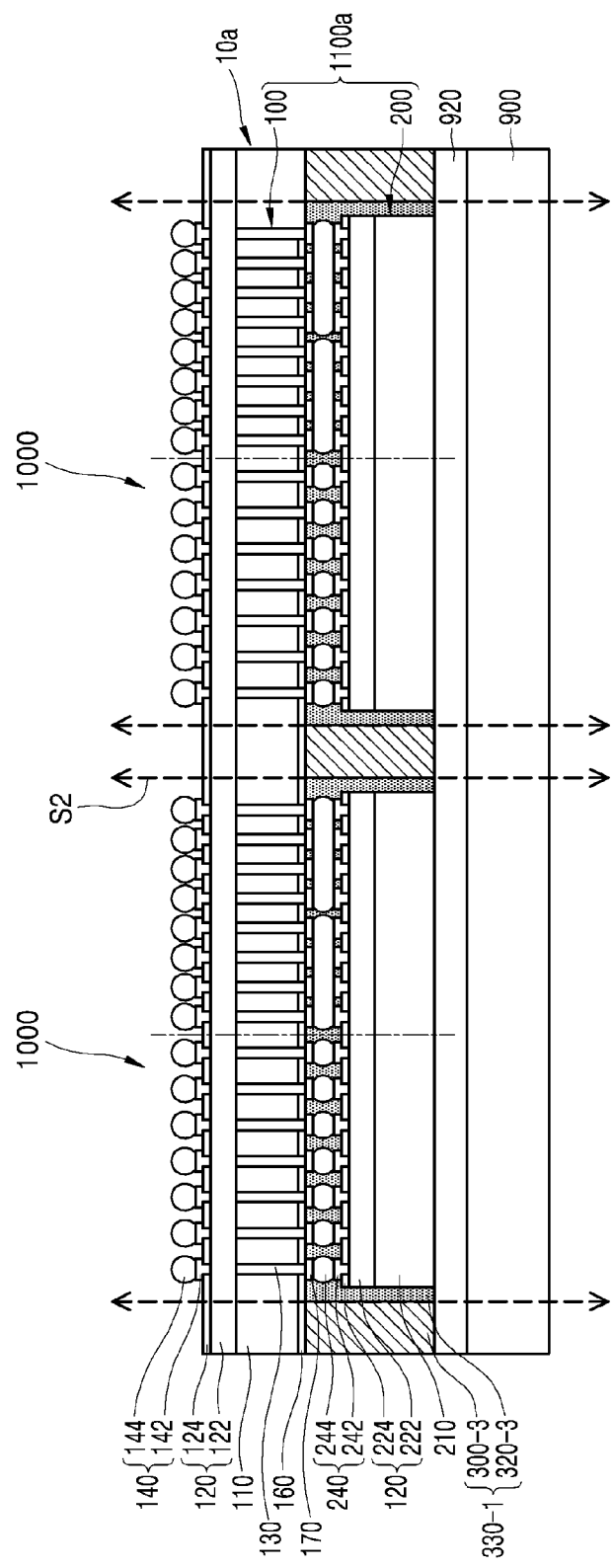

Referring to FIGS. 40 and 41, after the EDS test is conducted, the base wafer 10*a* and the sealing member 330-1 may be sawed and separated into chip-stacked semiconductor packages 1000. A portion of the bonding member 920 may be removed while sawing the base wafer 10*a* and the sealing member 330-1.

In FIG. 40, the base wafer 10*a* and the sealing member 330-1 may be sawed with respect to the sides of the second chip 200 (or alternatively, along a line 51). In FIG. 41, the base wafer 10*a* and the sealing member 330-1 may be sawed with respect to sides of the underfill 320-3 disposed on the sides of the second chip 200, (e.g., along a line S2). Accordingly, the sealing member 330-1 may be or may not be formed on the sides of the second chip 200, which is included in the chip stack structures 1100*a*.

Each chip-stacked semiconductor package 1000 may be completed when the supporting carrier 900 and the bonding member 920 are removed. The supporting carrier 900 and the bonding member 920 may be sequentially or simultaneously removed.

FIGS. 43 to 46 are cross-sectional views of chip-stacked semiconductor packages 6000 to 6000*c* according to some example embodiments.

Figure 43:
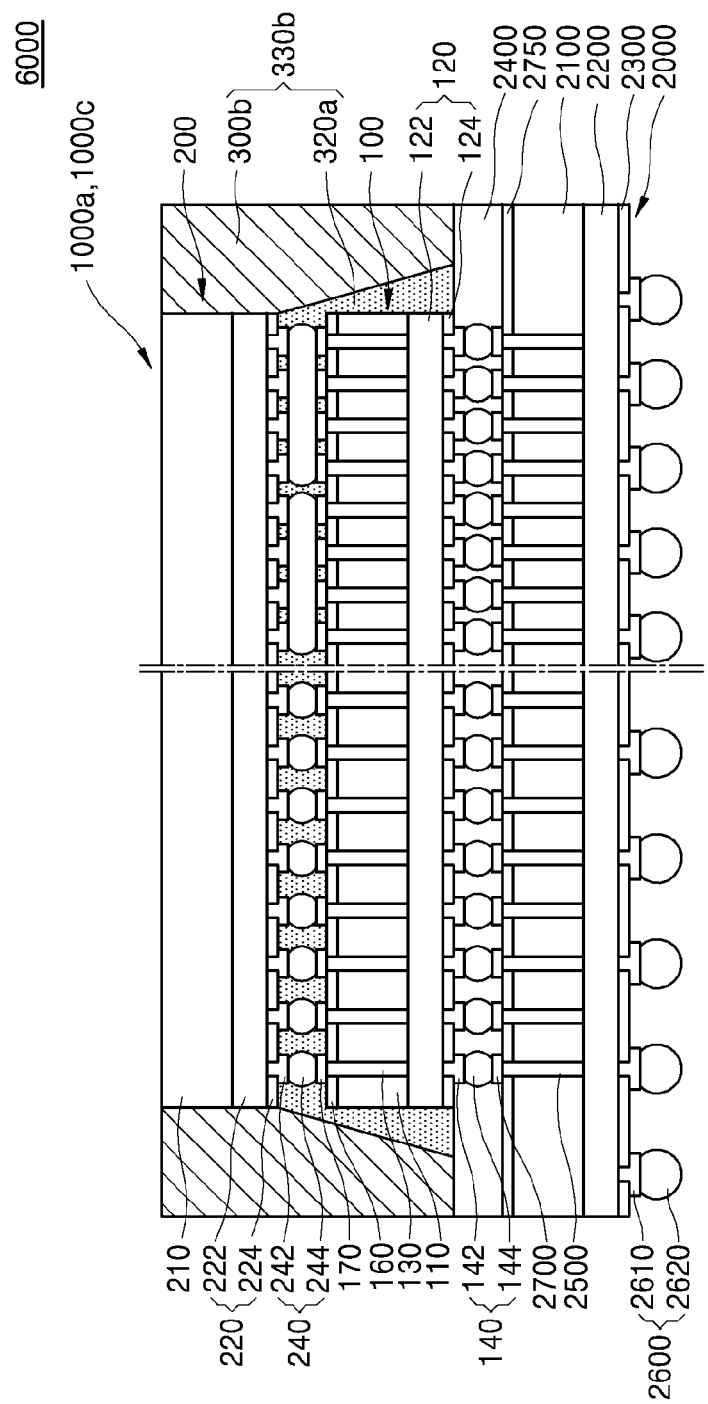
FIGS. 43 to 46 are cross-sectional views of chip-stacked semiconductor packages according to some example embodiments.

Referring to FIG. 43, the chip-stacked semiconductor package 6000 may include a main chip 2000 and upper semiconductor packages 1000*a* and 1000*c*. The upper semiconductor packages 1000*a* and 1000*c* may be the same as the chip-stacked semiconductor packages 1000 to 1000*c* of FIGS. 1 to 4. Accordingly, descriptions regarding features of each of the upper semiconductor packages 1000*a* and 1000*c* will be omitted or briefly provided.

A size of the main chip 2000 may be larger than sizes of the first and second chips 100 and 200 included in the upper semiconductor packages 1000*a* and 1000*c*. For example, a size of a horizontal cross-section of the main chip 2000 may be the same as a size of an entire horizontal cross-section of the upper semiconductor packages 1000*a* and 1000*c*, (e.g., a size of a horizontal cross-section including the sealing member 330*b*).

The upper semiconductor packages 1000*a* and 1000*c* may be mounted on the main chip 2000 by using a bonding member 2400. Thus, the molding member 300 and a lower surface of the underfill 320*a* of the upper semiconductor packages 1000*a* and 1000*c* may be bonded to an outer region of the main chip 2000 using the bonding member 2400.

Like a memory chip, the main chip 2000 may include a body 2100, a lower insulating layer 2200, a passivation layer 2300, through silicon vias 2500, third connection members 2600, a protective layer 2750, and upper pads 2700. An integrated circuit layer, a multilayer wire pattern formed in the lower insulating layer 2200, and the passivation layer 2300 may differ according to types of main chips. The main chip 2000 may be a logic chip, for example, a central processing unit (CPU), a controller, or an application specific integrated circuit (ASIC).

The number of the through silicon vias 2500 and that of the upper pads 2700 corresponding to the through silicon vias 2500 may be correspond to the number of first connection members 140 of the upper semiconductor packages 1000*a* and 1000*c* stacked on the main chip 2000. For example, the number of the through silicon vias 2500 may be larger than that of the first connection members 140.

The third connection members 2600 formed on a lower surface of the main chip 2000 may include bump pads 2610 and bumps 2620, and the number of the third connection members 2600 may be smaller than the number of the through silicon vias 2500. Accordingly, in the case of the through silicon vias 2500 which do not have corresponding third connection members 2600, two or more through silicon vias 2500 may be electrically combined into one through silicon via 2500 and the combined through silicon via 2500 may be connected to a single third connection member 2600.

Densely arranging the third connection members 2600 may be difficult due to standardization of wires formed in a board substrate (not shown), on which the main chip 2000 is mounted, or due to physical properties of the board substrate (for example, plastics). Thus, sizes of the third connection members 2600 formed on the main chip 2000 may be larger than those of the first connection members 140 of the upper semiconductor packages 1000*a* and 1000*c*. Therefore, some of the through silicon vias 2500 may not correspond to the third connection members 2600.

Figure 44:
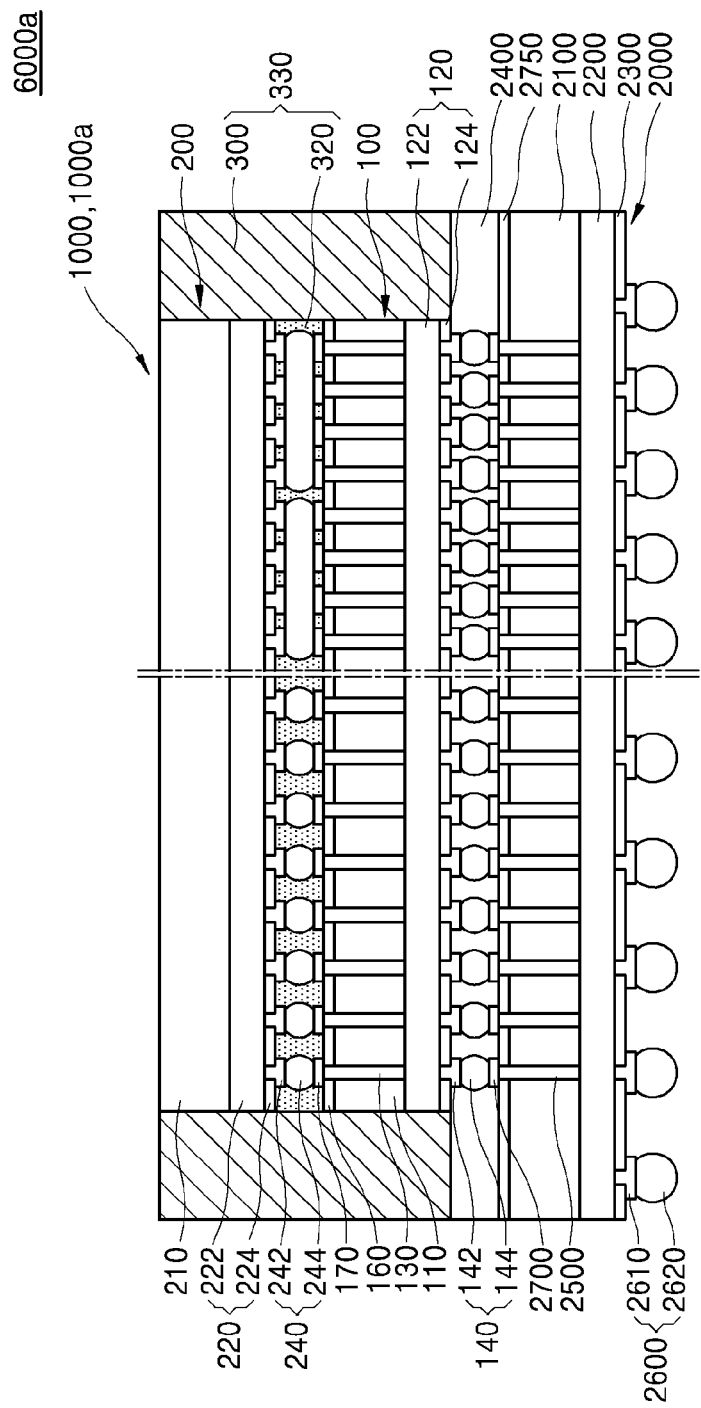

A chip-stacked semiconductor package 6000*a* of FIG. 44 may have a structure substantially the same as or similar to the chip-stacked semiconductor package 6000 of FIG. 43 except for the upper semiconductor packages 1000*a* and 1000*c* and the sealing member 330. Thus, the descriptions which have been already provided with reference to FIG. 43 will be omitted or briefly provided for convenience.

Referring to FIG. 44, in the chip-stacked semiconductor package 6000*a*, upper semiconductor packages 1000 and 1000*a* may be the same as the chip-stacked semiconductor packages 1000 and 1000*a* of FIGS. 1 and 2. Thus, the underfill 320 may be formed in a portion at which the first and second chips 100 and 200 are connected. The molding member 300 may be formed on the sides of each of the first and second chips 100 and 200, thereby forming the sealing member 330.

Figure 45:
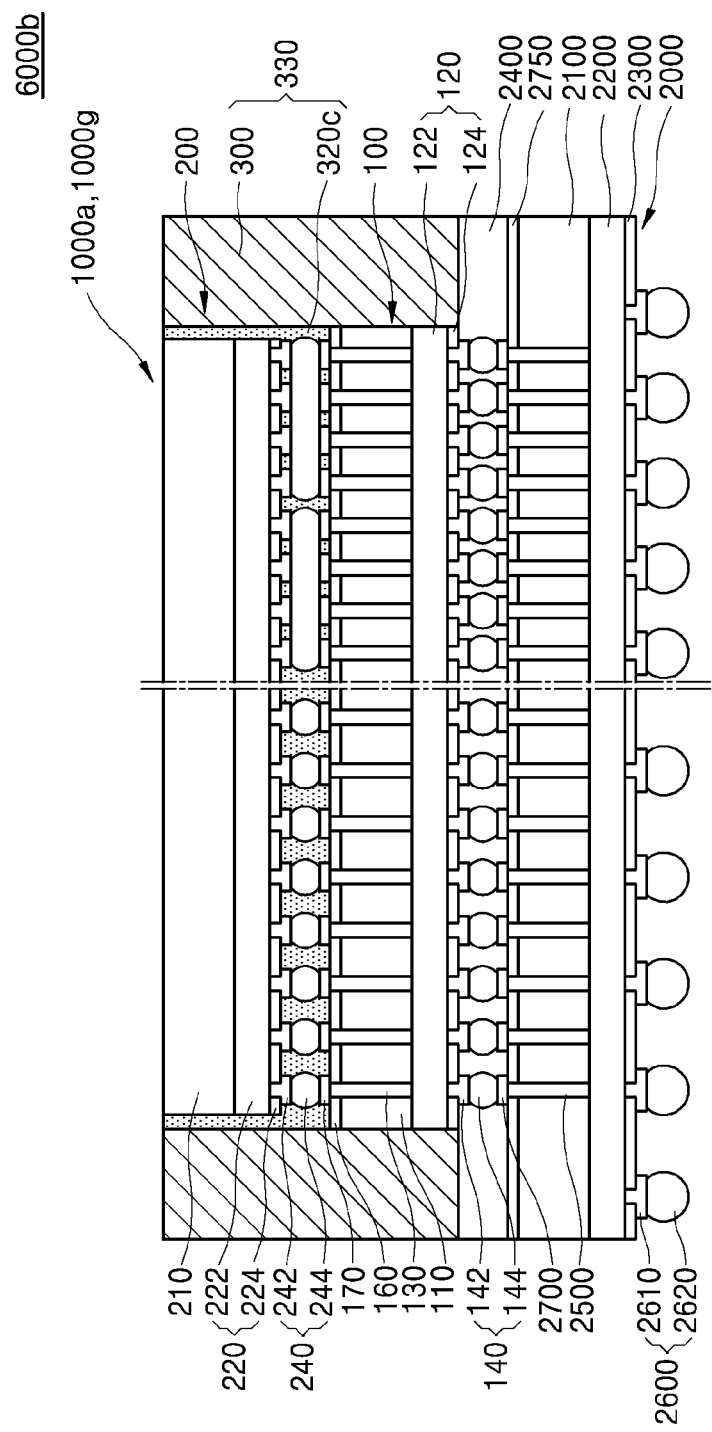

A chip-stacked semiconductor package 6000*b* of FIG. 45 may have a structure substantially the same as or similar to the chip-stacked semiconductor packages 6000 and 6000*a* of FIGS. 43 and 44 except for upper semiconductor packages 1000*a* and 1000*g* and the sealing member 330. Thus, the descriptions which have been already provided with reference to FIGS. 43 and 44 will be omitted or briefly provided for convenience.

Referring to FIG. 45, in the chip-stacked semiconductor package 6000*b*, the upper semiconductor packages 1000*a* and 1000*g* may be the same as the chip-stacked semiconductor packages 1000*a* and 1000*g* of FIGS. 2 and 8. Thus, the underfill 320*c* may be formed in a portion in which the first and second chips 100 and 200 are connected and at the sides of the second chip 200, and the molding member 300 may be formed on the sides of each of the underfill 320*c* and the first chip 100, thereby forming the sealing member 330.

Figure 46:
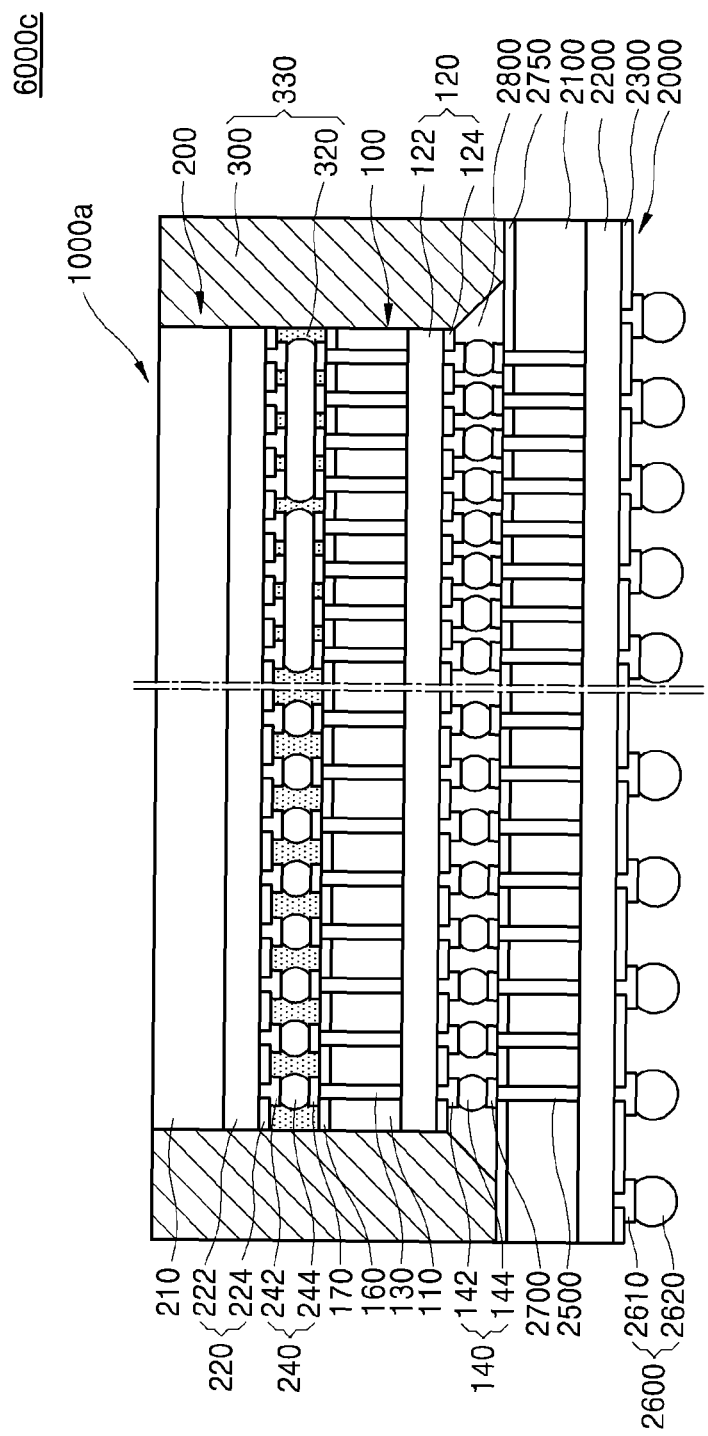

A chip-stacked semiconductor package 6000*c* of FIG. 46 may have a similar structure to the chip-stacked semiconductor packages 6000 of FIG. 43 except for a portion in which an upper semiconductor package 1000*a* is connected to the main chip 2000. Thus, the descriptions which have been already provided with reference to FIG. 43 will be omitted or briefly provided for convenience.

Referring to FIG. 46, in the chip-stacked semiconductor package 6000*c*, an underfill 2800 may fill a gap between an upper semiconductor package 1000*a* andthe main chip 2000. The gap may refer to an area or space at which the upper semiconductor package 1000*a* is connected to the main chip 2000. When the underfill 2800 is used, the upper semiconductor package 1000*a* may be mounted on the main chip 2000 by performing a thermo-compression bonding method, for example, by stacking the first connection members 140 of the first chip 100 on the upper pads 2700 of the main chip 2000 through the thermo-compression bonding method.

Figure 47:
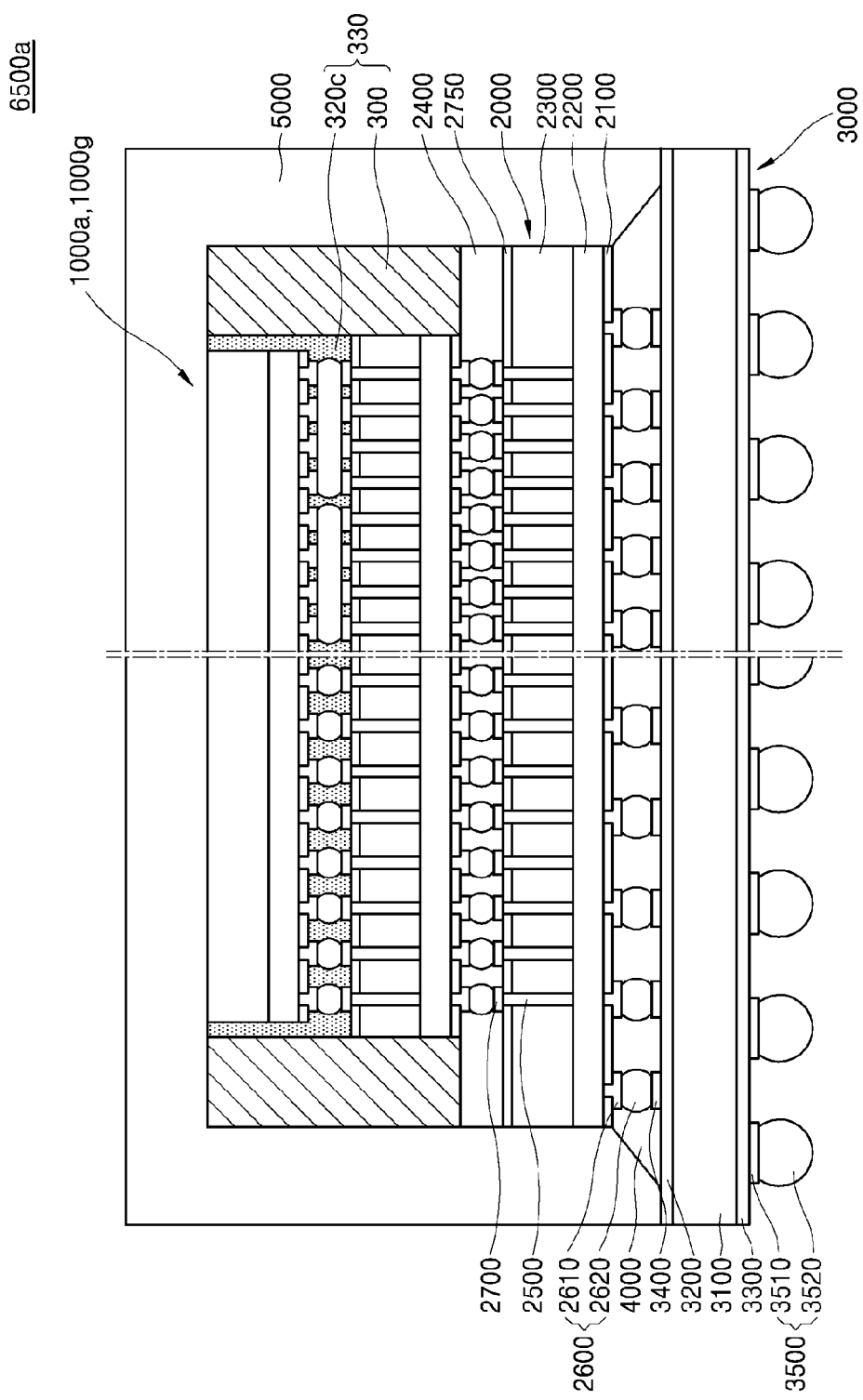
FIGS. 47 to 49 are cross-sectional views of chip-stacked semiconductor packages according to some example embodiments.
Figure 48:
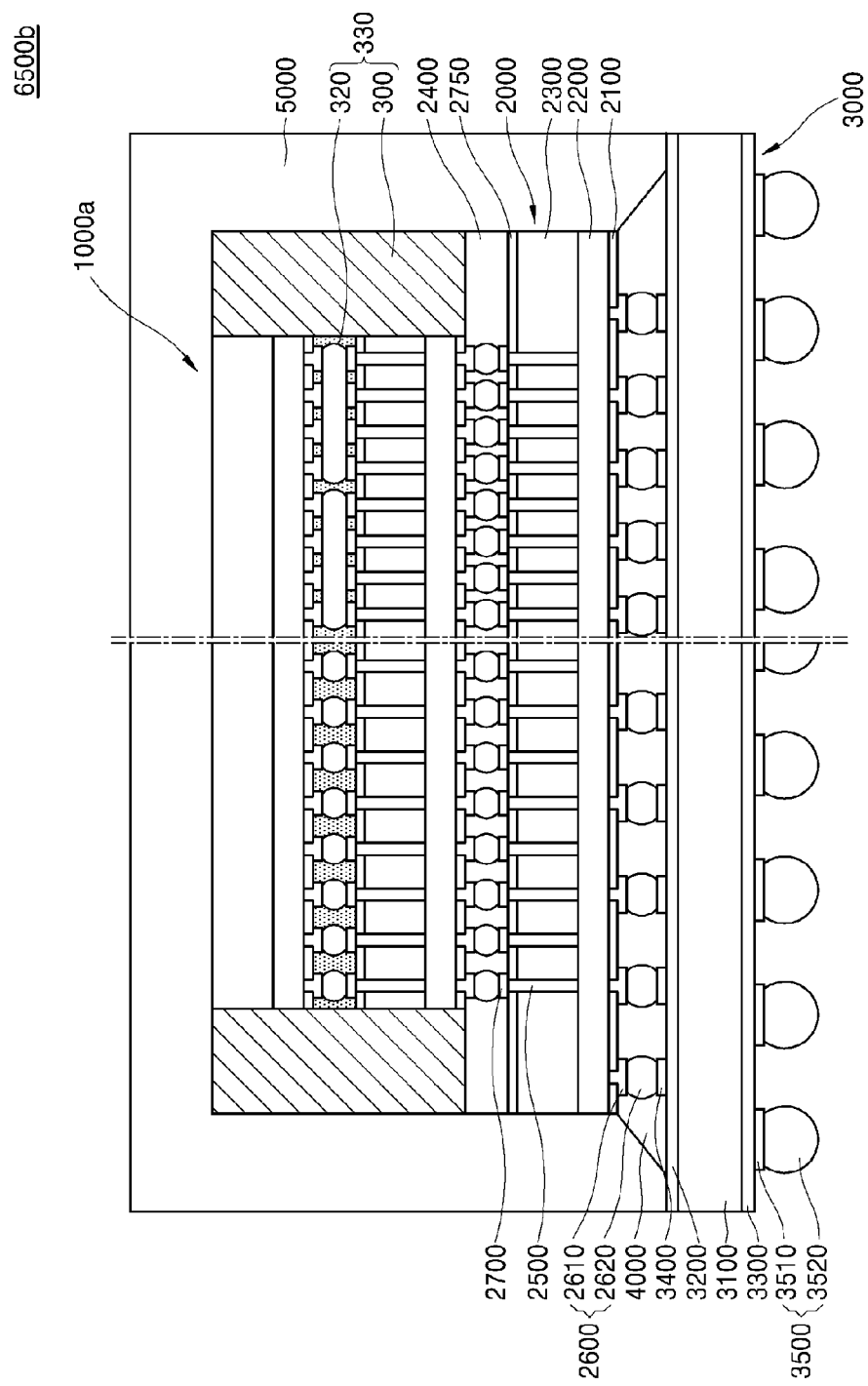
Figure 49:
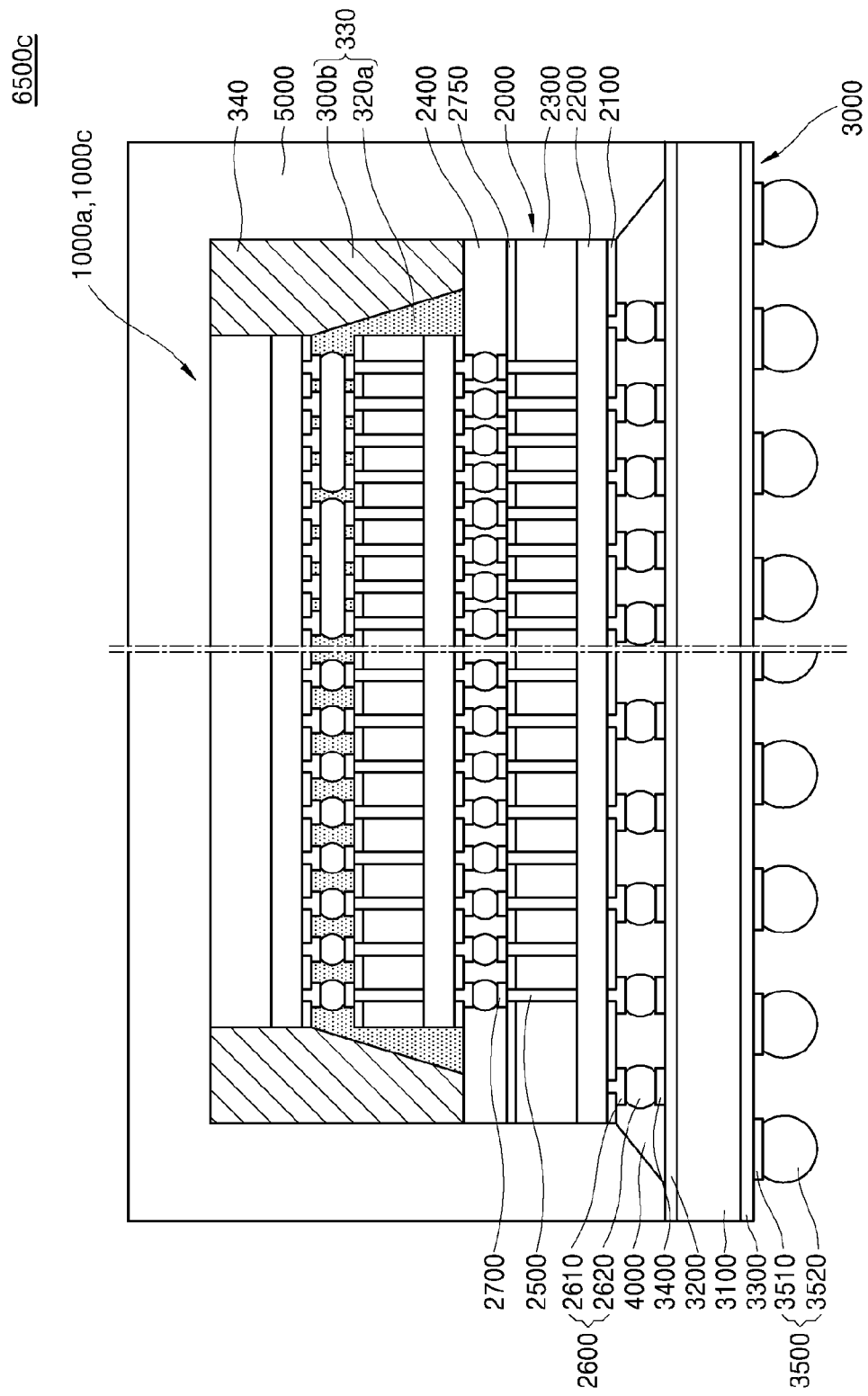

FIGS. 47 to 49 are cross-sectional views of chip-stacked semiconductor packages 6500*a* to 6500*c* according to some example embodiments.

For example, referring to FIG. 47, the chip-stacked semiconductor package 6500*a* of FIG. 47 may include a board substrate 3000, a main chip 2000, upper semiconductor packages 1000*a* and 1000*g*, an underfill 4000, and a second sealing member 5000. The upper semiconductor packages 1000*a* and 1000*g* and the main chip 2000 may be the same as the above upper semiconductor packages 1000*a* and 1000*g* and main chip 2000 described with reference to FIG. 45, respectively. Therefore, detailed descriptions regarding components of the upper semiconductor packages 1000*a* and 1000*g* and main chip 2000 will be omitted. The upper semiconductor packages 1000*a* and 1000*g* and main chip 2000 may be mounted on the board substrate 3000 by using the third connection members 2600.

The board substrate 3000 may include an upper protective layer 3200, a lower protective layer 3300, upper pads 3400, and fourth connection members 3500. A plurality of wire patterns may be formed in a body 3100. The upper protective layer 3200 and the lower protective layer 3300 may protect the body 3100 and may be, for example, formed of solder resist. Because the board substrate 3000 is standardized, there is a limit on decreasing a size of the board substrate 3000.

The second sealing member 5000 may seal sides and upper surfaces of the upper semiconductor packages 1000*a* and 1000*g* and the main chip 2000 and may be bonded to an outer region of the board substrate 3000. The underfill 4000 may fill a gap between the main chip 2000 and the board substrate 3000. The gap may refer to an area or space at which the main chip 2000 and the board substrate 3000 are connected. In the present example embodiment, the underfill 4000 may be formed in the area in which the main chip 2000 is connected to the board substrate 3000. When a second sealing member 5000 is formed by an MUF process, however, the underfill 4000 may not be formed.

The chip-stacked semiconductor packages 6500*b* and 6500*c* of FIGS. 48 and 49 may have structures substantially the same as or similar to the chip-stacked semiconductor package 6000*a* of FIG. 47 except for an upper semiconductor package 1000*a*. Thus, the descriptions which have already provided with reference to FIG. 47 will be omitted or briefly provided for convenience.

In the chip-stacked semiconductor package 6500*b* of FIG. 48, the upper semiconductor package 1000*a* may be the chip-stacked semiconductor package 1000*a* of FIG. 2. Accordingly, the sealing member 330 may be formed by the underfill 320 formed between the chips and the molding member 300 formed on the sides of the chips.

In the chip-stacked semiconductor package 6500*c* of FIG. 49, the upper semiconductor package 1000*a* may be the upper semiconductor packages 1000*a* and 1000*c* of FIGS. 2 and 4. Accordingly, the sealing member 330 may be formed by the underfill 320*a*, which is formed between the chips and the sides of the first chip 100, and the molding member 300*b* which is formed on the sides of the chips.

Figure 50:
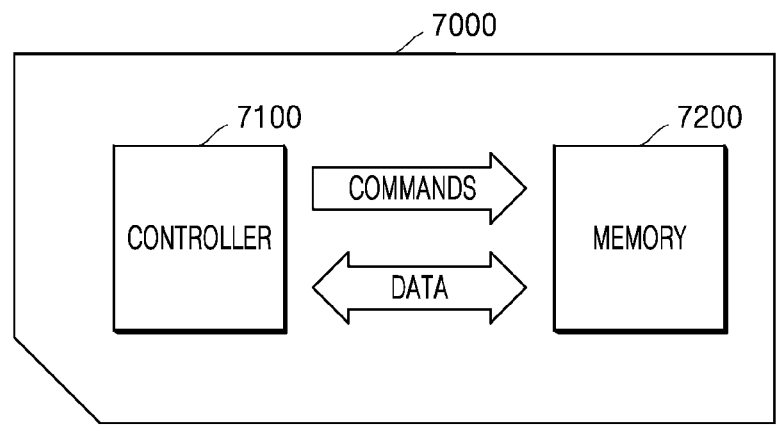
FIG. 50 is a schematic block diagram of a memory card including a chip-stacked semiconductor package, according to an example embodiment.

FIG. 50 is a schematic block diagram of a memory card 7000 including a chip-stacked semiconductor package, according to an example embodiment.

For example, in the memory card 7000, a controller 7100 and a memory 7200 may be arranged to exchange electrical signals with each other. For example, when the controller 7100 sends commands, the memory 7200 may transmit data. The controller 7100 and/or the memory 7200 may include one of the chip-stacked semiconductor packages according to the one or more example embodiments of the inventive concepts. The memory 7200 may include a memory array (not shown) or a memory array back (not shown).

The memory card 7000 may be used in a memory device including various types of cards, for example, a memory stick card, a smart media card (SM), a secure digital (SD), a mini secure digital card (mini SD), or a multimedia card (MMC).

Figure 51:
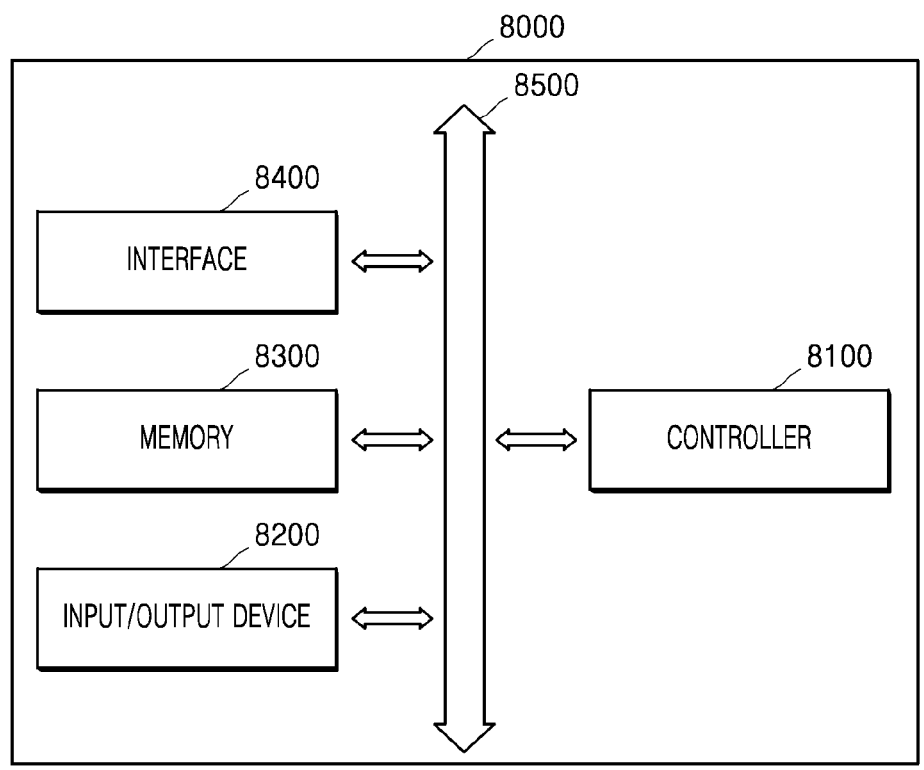
FIG. 51 is a schematic block diagram of an electronic system including a chip-stacked semiconductor package, according to an example embodiment.

FIG. 51 is a schematic block diagram of an electronic system 8000 including a chip-stacked semiconductor package, according to an example embodiment.

For example, the electronic system 8000 may include a controller 8100, an input/output device 8200, a memory 8300, and an interface 8400. The electronic system 8000 may be a mobile system or a system which transmit or receive information. The mobile system may be, for example, a personal digital assistant (PDA), a portable computer, a web tablet, a wireless phone, a mobile phone, a digital music player, or a memory card.

The controller 8100 may execute programs and/or may control the electronic system 8000. The controller 8100 may be, for example, a microprocessor, a digital signal processor, a microcontroller, or the like. The input/output device 8200 may be used to input or output data of the electronic system 8000.

The electronic system 8000 may be connected to an external device, for example, a personal computer (PC) or a network and may exchange data with the external device by using the input/output device 8200. The input/output device 8200 may be, for example, a keypad, a keyboard, or a display. The memory 8300 may store codes for operations of the controller 8100 and/or data, and/or may store data processed by the controller 8100. The controller 8100 and the memory 8300 may include one of the chip-stacked semiconductor packages according to the one or more example embodiments of the inventive concepts. The interface 8400 may be a data transmission path between the electronic system 8000 and an external device. The controller 8100, the input/output device 8200, the memory 8300, and the interface 8400 may communicate with each other via a bus 8500.

The electronic system 8000 may be used in, for example, a mobile phone, an MP3 player, a navigation device, a portable multimedia player (PMP), a solid state disk (SSD), or household appliances.

Figure 52:
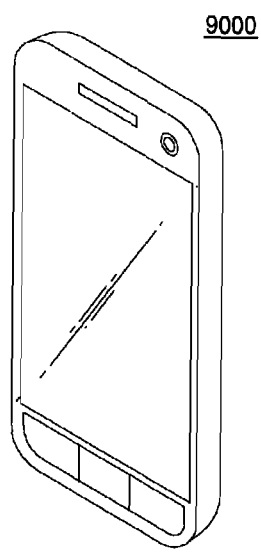
FIG. 52 is a perspective view of an electronic system including a chip-stacked semiconductor package according to an example embodiment.

FIG. 52 is a perspective view of the electronic system 8000 including a chip-stacked semiconductor package according to an example embodiment.

In particular, FIG. 52 shows a case in which the electronic system 8000 is applied to a mobile phone 9000. Further, the electronic system 8000 may be used in, for example, a portable laptop, an MP3 player, a navigation device, an SSD, vehicles, or household appliances.

While the inventive concepts have been particularly shown and described with reference to some example embodiments, it will be understood that various changes in form and details may be made therein without departing from the spirit and scope of the following claims.

What is claimed is:

1. A chip-stacked semiconductor package comprising:
a first chip including a plurality of first real bump pads and a plurality of first dummy bump pads;
a second chip on the first chip, the second chip including a plurality of real bumps and a plurality of bridge dummy bumps, the plurality of real bumps electrically connected to the plurality of first real bump pads, the plurality of bridge dummy bumps connected to the plurality of first dummy bump pads; and
a sealing member sealing the first chip and the second chip.

2. The chip-stacked semiconductor package of claim 1, wherein the first chip further includes a first chip body, the plurality of first real bump pads are on an upper surface of the first chip body, and
a plurality of first real through silicon vias are in the first chip body, and are electrically connected to the plurality of first real bump pads.

3. The chip-stacked semiconductor package of claim 2, wherein the plurality of first dummy bump pads are on the upper surface of the first chip body, and
a plurality of dummy through silicon vias are in the first chip body and are electrically connected to the plurality of first dummy bump pads.

4. The chip-stacked semiconductor package of claim 2, wherein a plurality of connection members are on a lower surface of the first chip body, the plurality of connection members are electrically connected to the plurality of first real bump pads and the plurality of first real through silicon vias.

5. The chip-stacked semiconductor package of claim 1, wherein the second chip further includes a second chip body and a plurality of second real bump pads on a lower surface of the second chip body, and
the plurality of second real bump pads are electrically connected to the plurality of real bumps.

6. The chip-stacked semiconductor package of claim 5, wherein the second chip further includes a plurality of second dummy bump pads on the lower surface thereof, the plurality of second dummy bump pads are connected to a plurality of bridge dummy bumps.

7. The chip-stacked semiconductor package of claim 5, wherein the second chip body further includes a plurality of second real through silicon vias, and the plurality of second real through silicon vias are electrically connected to the plurality of second real bump pads.

8. The chip-stacked semiconductor package of claim 6, wherein the second chip body further includes a plurality of dummy through silicon vias, and the plurality of dummy through silicon vias are connected to the plurality of second dummy bump pads.

9. The chip-stacked semiconductor package of claim 6, wherein a pitch between the plurality of first dummy bump pads and a pitch between the plurality of second dummy bump pads are smaller than a pitch between the plurality of first real bump pads and a pitch between the plurality of second real bump pads, respectively.

10. The chip-stacked semiconductor package of claim 1, wherein the plurality of bridge dummy bumps are separate from each other and the plurality of bridge dummy bumps are connected to the plurality of first dummy bump pads.

11. The chip-stacked semiconductor package of claim 1, wherein the sealing member includes an underfill, and the underfill is at least one of between the first chip and the second chip and on sides of the second chip.

12. The chip-stacked semiconductor package of claim 1, wherein the sealing member comprises a molding member, and the molding member is one of (1) between the first chip and the second chip and on sides of the first and second chips and (2) on the sides of the first and second chips and an upper surface of the second chip.

13. The chip-stacked semiconductor package of claim 1, wherein the sealing member comprises:
an underfill between the first chip and the second chip and on sides of the first chip; and
a molding member covering one of (1) the underfill and sides of the first and second chips and (2) sides of the first and second chips and an upper surface of the second chip.

* * * * *